(12) United States Patent
Cui et al.

(10) Patent No.: US 11,355,437 B2
(45) Date of Patent: Jun. 7, 2022

(54) THREE-DIMENSIONAL MEMORY DEVICE INCLUDING BUMP-CONTAINING BIT LINES AND METHODS FOR MANUFACTURING THE SAME

(71) Applicant: SANDISK TECHNOLOGIES LLC, Addison, TX (US)

(72) Inventors: Zhixin Cui, Nagoya (JP); Yukihiro Sakotsubo, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 129 days.

(21) Appl. No.: 16/984,700

(22) Filed: Aug. 4, 2020

(65) Prior Publication Data
US 2022/0045005 A1 Feb. 10, 2022

(51) Int. Cl.
*H01L 27/11* (2006.01)
*H01L 23/535* (2006.01)
(Continued)

(52) U.S. Cl.
CPC ...... *H01L 23/535* (2013.01); *H01L 21/76805* (2013.01); *H01L 21/76877* (2013.01);
(Continued)

(58) Field of Classification Search
CPC ............ H01L 23/535; H01L 21/76805; H01L 21/76877; H01L 21/76895; H01L 23/5226; H01L 24/08; H01L 24/80; H01L 25/0657; H01L 25/18; H01L 25/50; H01L 27/11556; H01L 27/11582; H01L 2224/08145; H01L 2224/80895; H01L 2224/80896; H01L 2924/1431; H01L 2924/14511
(Continued)

(56) References Cited

U.S. PATENT DOCUMENTS 5,915,167 A 6/1999 Leedy
10,115,681 B1 10/2018 Ariyoshi
(Continued)

OTHER PUBLICATIONS

Ohmi, H. et al., "Significant Improvement of Copper Dry Etching Property of a High-Pressure Hydrogen-Based Plasma by Nitrogen Gas Addition," ACS Omega2019, 4, 4360-4366.
(Continued)

*Primary Examiner* — Long K Tran
(74) *Attorney, Agent, or Firm* — The Marbury Law Group PLLC

(57) ABSTRACT

A semiconductor die can include an alternating stack of insulating layers and electrically conductive layers located on a substrate, memory stack structures extending through the alternating stack, drain regions located at a first end of a respective one of the vertical semiconductor channels of a memory stack structure, and bit lines extending over the drain regions and electrically connected to a respective subset of the drain regions. At least of a subset of the bit lines includes bump-containing bit lines. Each of the bump-containing bit lines includes a line portion and a bump portion that protrudes upward from a top surface of the line portion by a bump height. Bit line contact via structures overlie the bit lines and contact a bump portion of a respective one of the bump-containing bit lines.

7 Claims, 38 Drawing Sheets

(51) Int. Cl.
| | |
|---|---|
| H01L 27/11582 | (2017.01) |
| H01L 23/522 | (2006.01) |
| H01L 21/768 | (2006.01) |
| H01L 25/065 | (2006.01) |
| H01L 25/18 | (2006.01) |
| H01L 23/00 | (2006.01) |
| H01L 25/00 | (2006.01) |
| H01L 27/11556 | (2017.01) |

(52) U.S. Cl.
CPC .... *H01L 21/76895* (2013.01); *H01L 23/5226* (2013.01); *H01L 24/08* (2013.01); *H01L 24/80* (2013.01); *H01L 25/0657* (2013.01); *H01L 25/18* (2013.01); *H01L 25/50* (2013.01); *H01L 27/11556* (2013.01); *H01L 27/11582* (2013.01); *H01L 2224/08145* (2013.01); *H01L 2224/80895* (2013.01); *H01L 2224/80896* (2013.01); *H01L 2924/1431* (2013.01); *H01L 2924/14511* (2013.01)

(58) Field of Classification Search
USPC .......................................... 438/201; 257/314
See application file for complete search history.

(56) References Cited

U.S. PATENT DOCUMENTS

| | | | |
|---|---|---|---|
| 10,283,493 | B1 | 5/2019 | Nishida |
| 10,354,980 | B1 | 7/2019 | Mushiga et al. |
| 10,354,987 | B1 | 7/2019 | Mushiga et al. |
| 10,381,322 | B1 | 8/2019 | Azuma et al. |
| 10,381,362 | B1 | 8/2019 | Cui et al. |
| 10,510,738 | B2 | 12/2019 | Kim et al. |
| 10,629,616 | B1 | 4/2020 | Kai et al. |
| 10,665,580 | B1 | 5/2020 | Hosoda et al. |
| 10,665,581 | B1 | 5/2020 | Zhou et al. |
| 10,700,028 | B2 | 6/2020 | Nishida |
| 2018/0097009 | A1* | 4/2018 | Zhang ............... H01L 27/11519 |
| 2018/0233513 | A1* | 8/2018 | Zhang ................... G11C 16/08 |
| 2019/0221557 | A1 | 7/2019 | Kim et al. |
| 2019/0252361 | A1 | 8/2019 | Nishida |
| 2020/0066745 | A1 | 2/2020 | Yu et al. |

OTHER PUBLICATIONS

Pan, W.S et al., "Selective reactive ion etching of tungsten films in CHF3 and other fluorinated gases," Journal of Vacuum Science & Technology B: Microelectronics Processing and Phenomena 6, 1073 (1988); https://doi.org/10.1116/1.584300 (Abstract).
U.S. Appl. No. 16/231,752, filed Dec. 24, 2018, SanDisk Technologies LLC.
U.S. Appl. No. 16/248,923, filed Jan. 16, 2019, SanDisk Technologies LLC.
U.S. Appl. No. 16/249,423, filed Jan. 16, 2019, SanDisk Technologies LLC.
U.S. Appl. No. 16/269,301, filed Feb. 6, 2019, SanDisk Technologies LLC.
U.S. Appl. No. 16/275,668, filed Feb. 14, 2019, SanDisk Technologies LLC.
U.S. Appl. No. 16/278,372, filed Feb. 18, 2019, SanDisk Technologies LLC.
U.S. Appl. No. 16/288,656, filed Feb. 19, 2019, SanDisk Technologies LLC.
U.S. Appl. No. 16/290,277, filed Mar. 1, 2019, SanDisk Technologies LLC.
U.S. Appl. No. 16/291,457, filed Mar. 4, 2019, SanDisk Technologies LLC.
U.S. Appl. No. 16/291,504, filed Mar. 4, 2019, SanDisk Technologies LLC.
U.S. Appl. No. 16/291,577, filed Mar. 4, 2019, SanDisk Technologies LLC.
U.S. Appl. No. 16/295,292, filed Mar. 7, 2019, SanDisk Technologies LLC.
U.S. Appl. No. 16/372,908, filed Apr. 2, 2019, SanDisk Technologies LLC.
U.S. Appl. No. 16/385,010, filed Apr. 16, 2019, SanDisk Technologies LLC.
U.S. Appl. No. 16/391,632, filed Apr. 23, 2019, SanDisk Technologies LLC.
U.S. Appl. No. 16/409,593, filed May 10, 2019, SanDisk Technologies LLC.
U.S. Appl. No. 16/417,913, filed May 21, 2019, SanDisk Technologies LLC.
U.S. Appl. No. 16/440,183, filed Jun. 13, 2019, SanDisk Technologies LLC.
U.S. Appl. No. 16/521,849, filed Jul. 25, 2019, SanDisk Technologies LLC.
U.S. Appl. No. 16/523,029, filed Jul. 26, 2019, SanDisk Technologies LLC.
U.S. Appl. No. 16/552,089, filed Aug. 27, 2019, SanDisk Technologies LLC.
U.S. Appl. No. 16/589,404, filed Oct. 1, 2019, SanDisk Technologies LLC.
U.S. Appl. No. 16/660,177, filed Oct. 22, 2019, SanDisk Technologies LLC.
U.S. Appl. No. 16/666,522, filed Oct. 29, 2019, SanDisk Technologies LLC.
U.S. Appl. No. 16/671,025, filed Oct. 31, 2019, SanDisk Technologies LLC.
U.S. Appl. No. 16/682,848, filed Nov. 13, 2019, SanDisk Technologies LLC.
U.S. Appl. No. 16/694,340, filed Nov. 25, 2019, SanDisk Technologies LLC.
U.S. Appl. No. 16/694,400, filed Nov. 25, 2019, SanDisk Technologies LLC.
U.S. Appl. No. 16/694,438, filed Nov. 25, 2019, SanDisk Technologies LLC.
U.S. Appl. No. 16/728,327, filed Dec. 27, 2019, SanDisk Technologies LLC.
U.S. Appl. No. 16/742,213, filed Jan. 14, 2020, SanDisk Technologies LLC.
U.S. Appl. No. 16/747,943, filed Jan. 21, 2020, SanDisk Technologies LLC.
U.S. Appl. No. 16/774,372, filed Jan. 28, 2020, SanDisk Technologies LLC.
U.S. Appl. No. 16/774,446, filed Jan. 28, 2020, SanDisk Technologies LLC.
U.S. Appl. No. 16/806,087, filed Mar. 2, 2020, SanDisk Technologies LLC.
U.S. Appl. No. 16/825,304, filed Mar. 20, 2020, SanDisk Technologies LLC.
U.S. Appl. No. 16/825,397, filed Mar. 20, 2020, SanDisk Technologies LLC.
U.S. Appl. No. 16/829,591, filed Mar. 25, 2020, SanDisk Technologies LLC.
U.S. Appl. No. 16/829,667, filed Mar. 25, 2020, SanDisk Technologies LLC.
U.S. Appl. No. 16/879,146, filed May 20, 2020, SanDisk Technologies LLC.
U.S. Appl. No. 16/886,221, filed May 28, 2020, SanDisk Technologies LLC.
U.S. Appl. No. 16/888,055, filed May 29, 2020, SanDisk Technologies LLC.
U.S. Appl. No. 16/891,843, filed Jun. 3, 2020, SanDisk Technologies LLC.
U.S. Appl. No. 16/912,196, filed Jun. 25, 2020, SanDisk Technologies LLC.
U.S. Appl. No. 16/912,279, filed Jun. 25, 2020, SanDisk Technologies LLC.
U.S. Appl. No. 16/917,526, filed Jun. 30, 2020, SanDisk Technologies LLC.

(56) References Cited

OTHER PUBLICATIONS

U.S. Appl. No. 16/917,597, filed Jun. 30, 2020, SanDisk Technologies LLC.

* cited by examiner

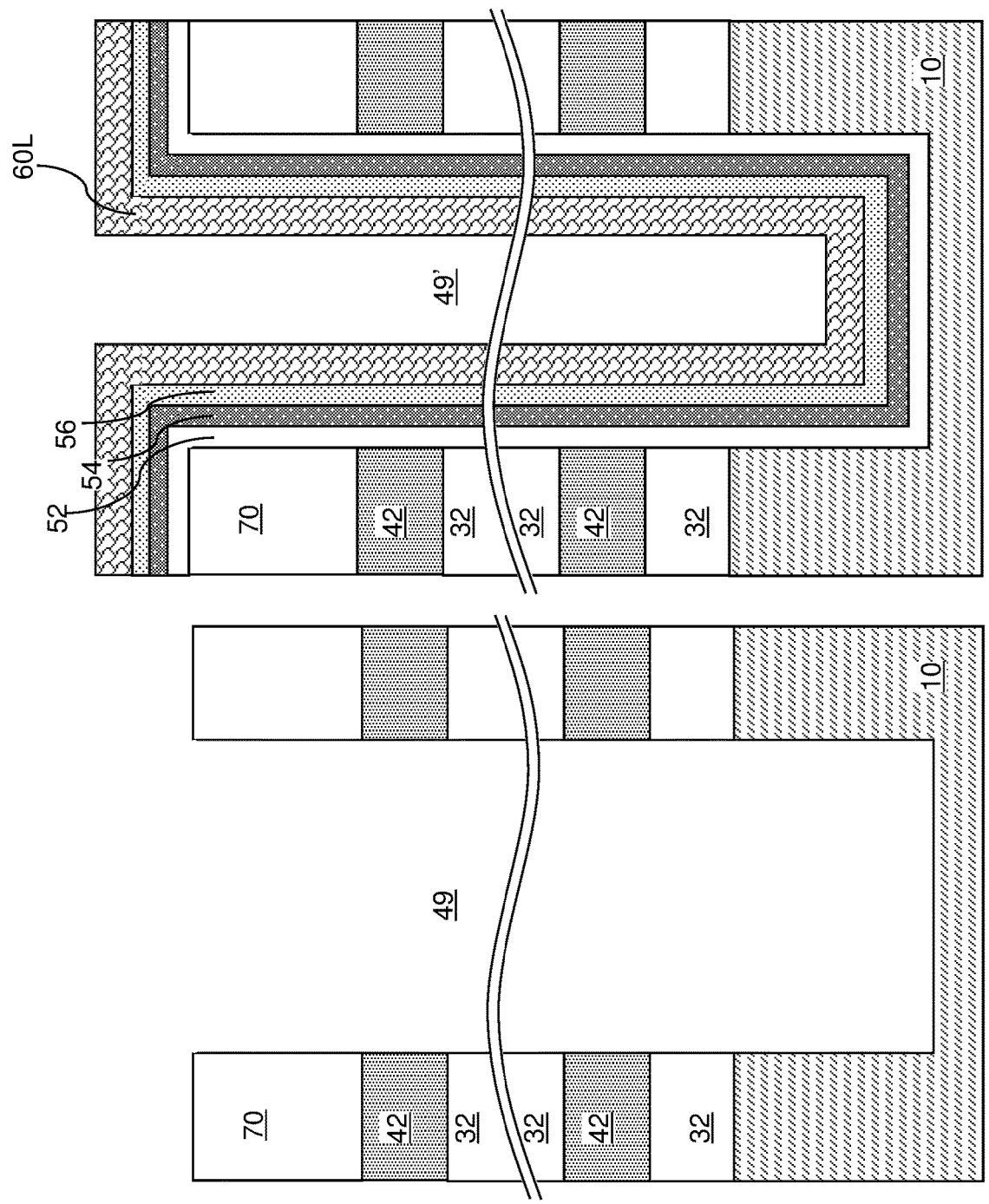

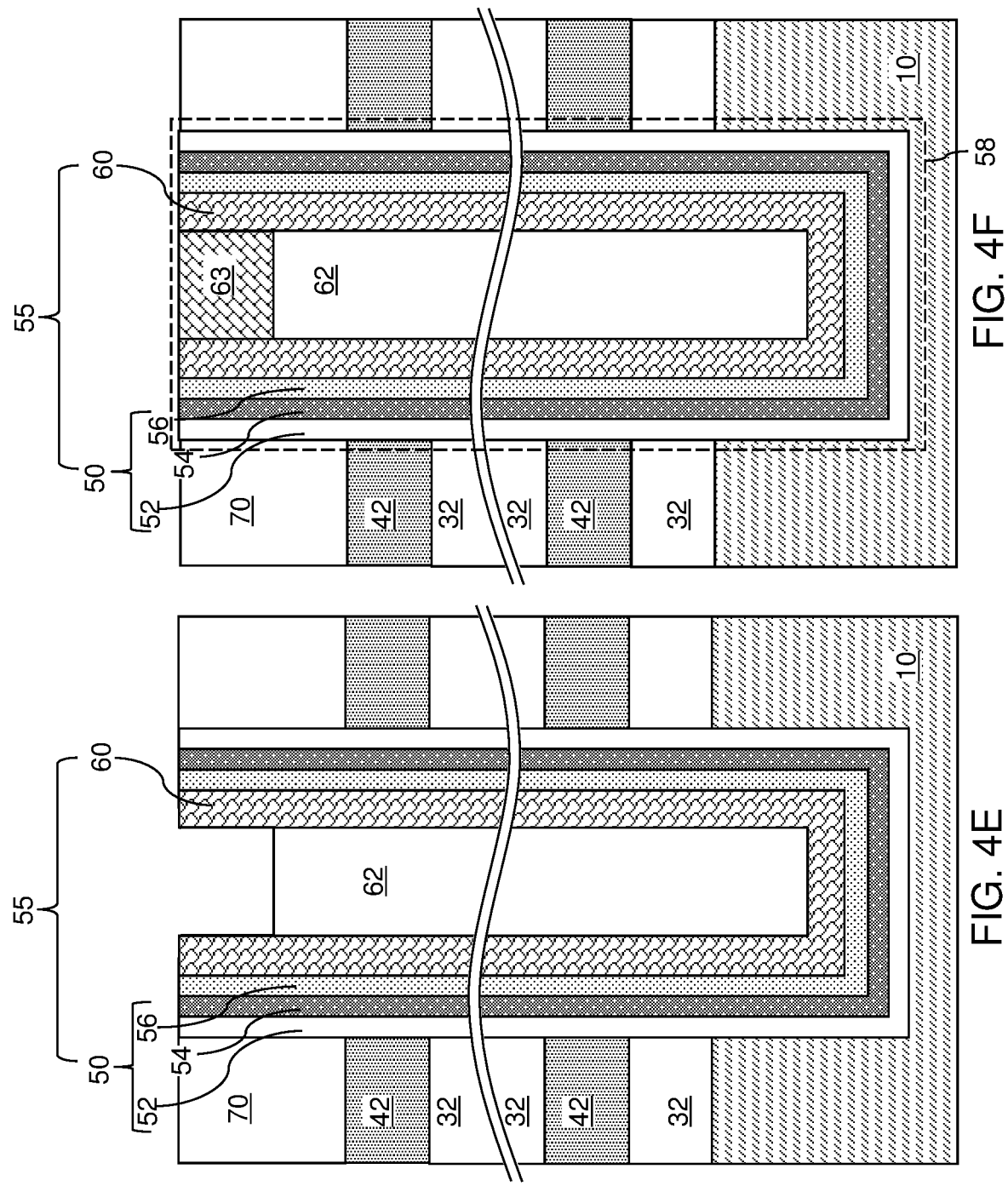

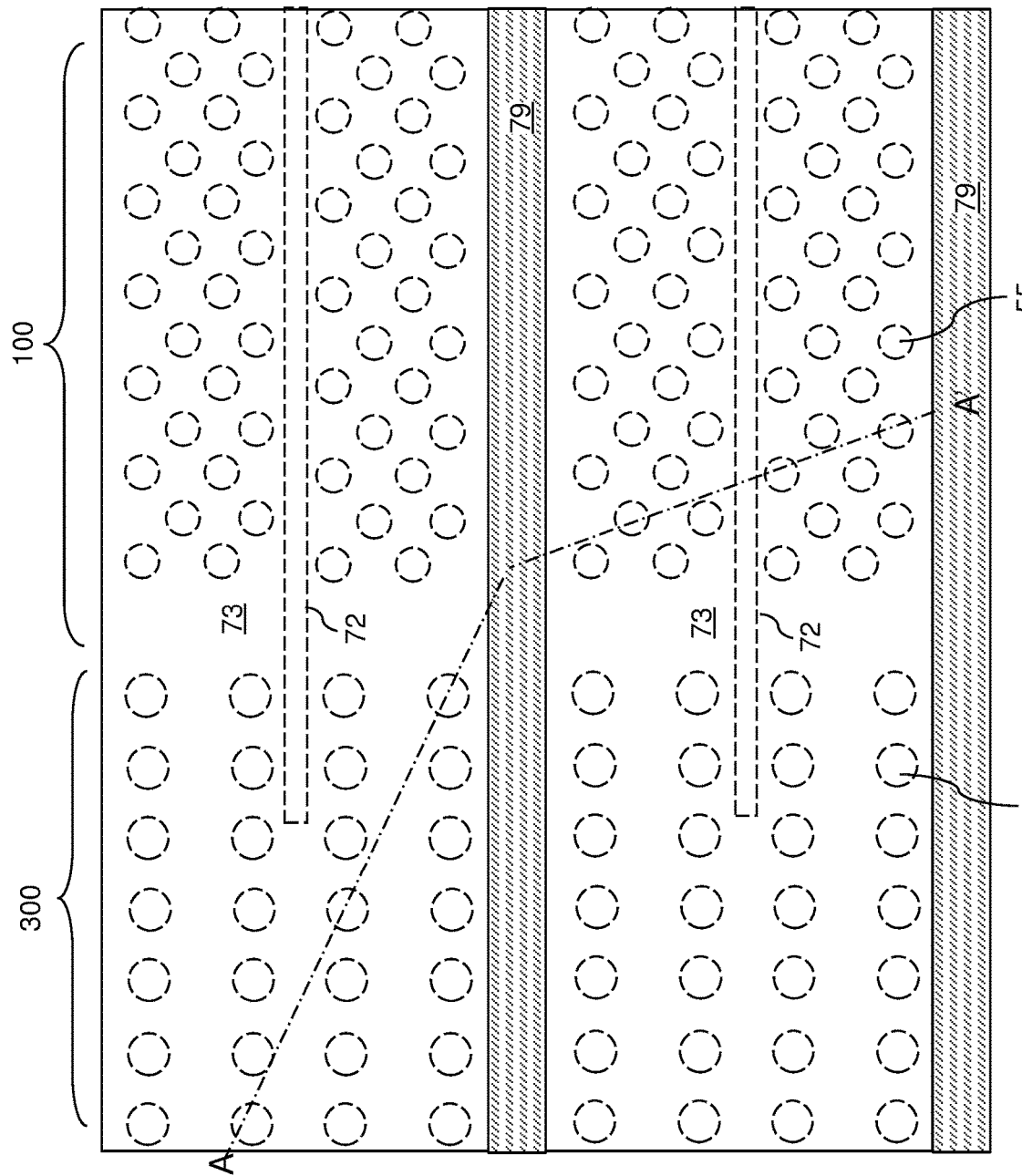

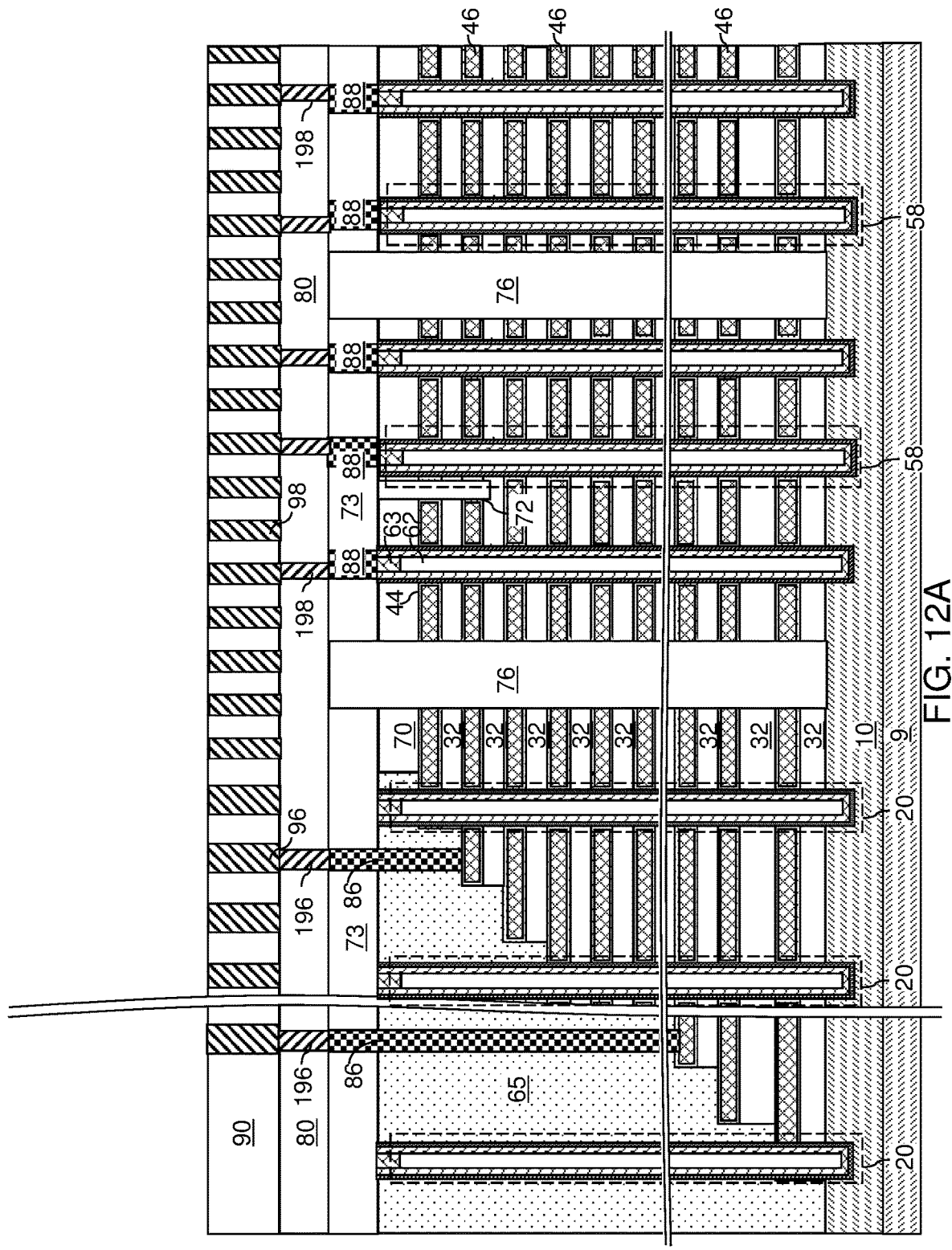

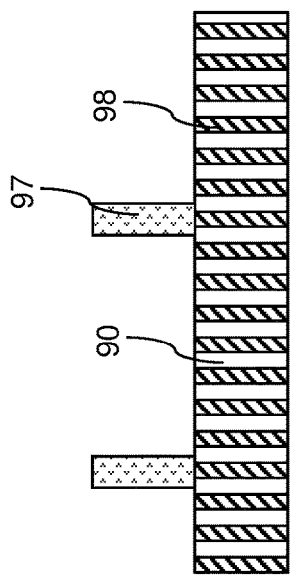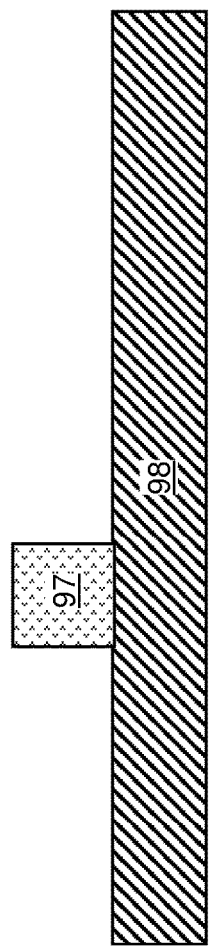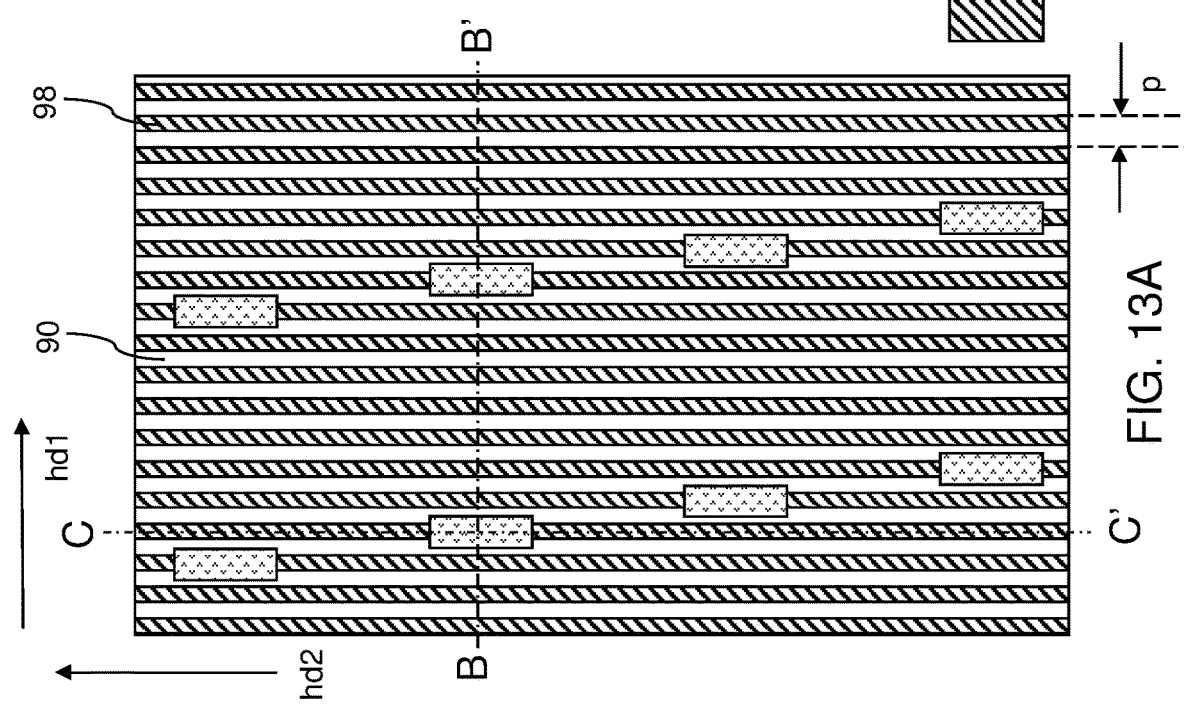

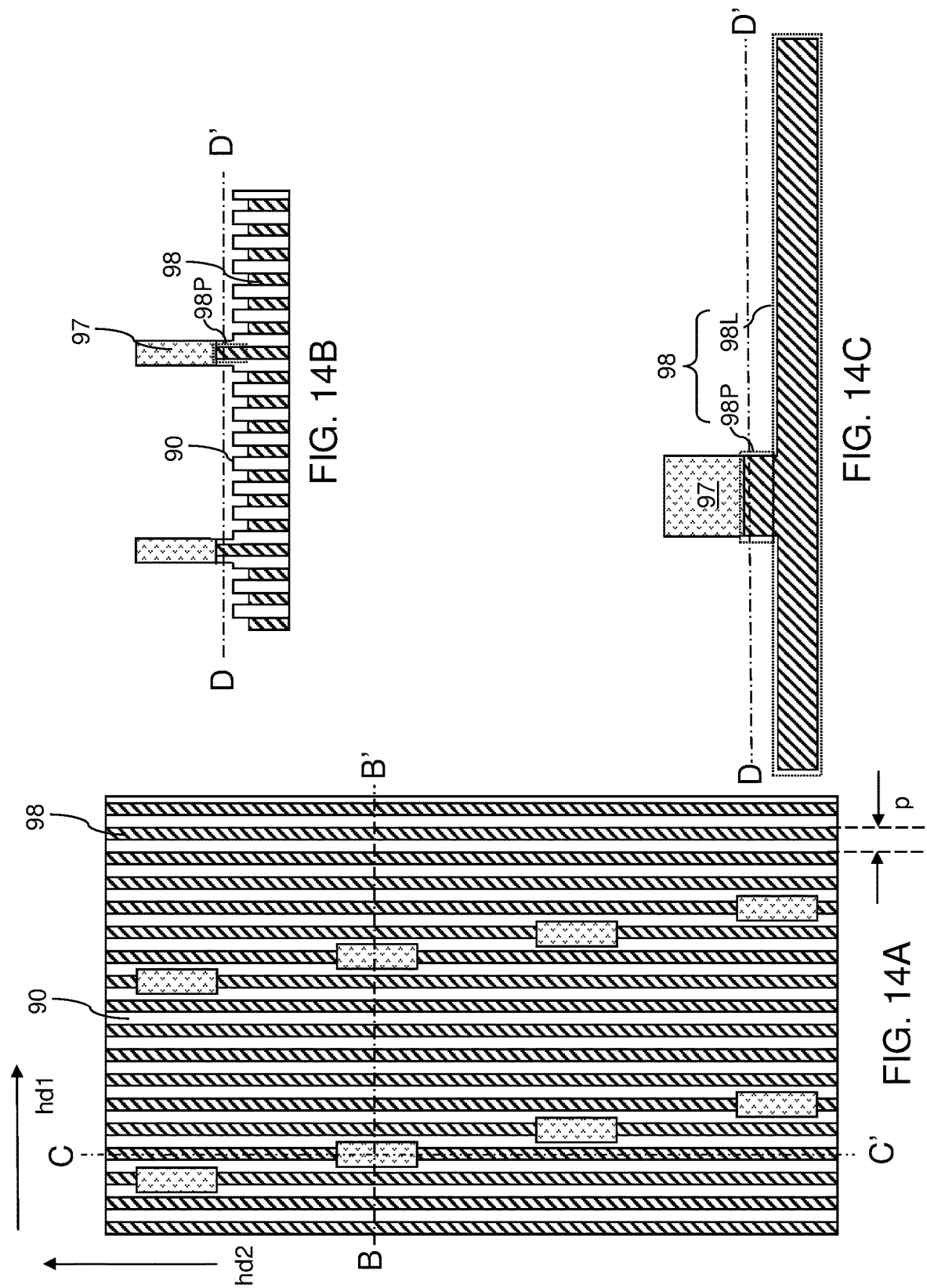

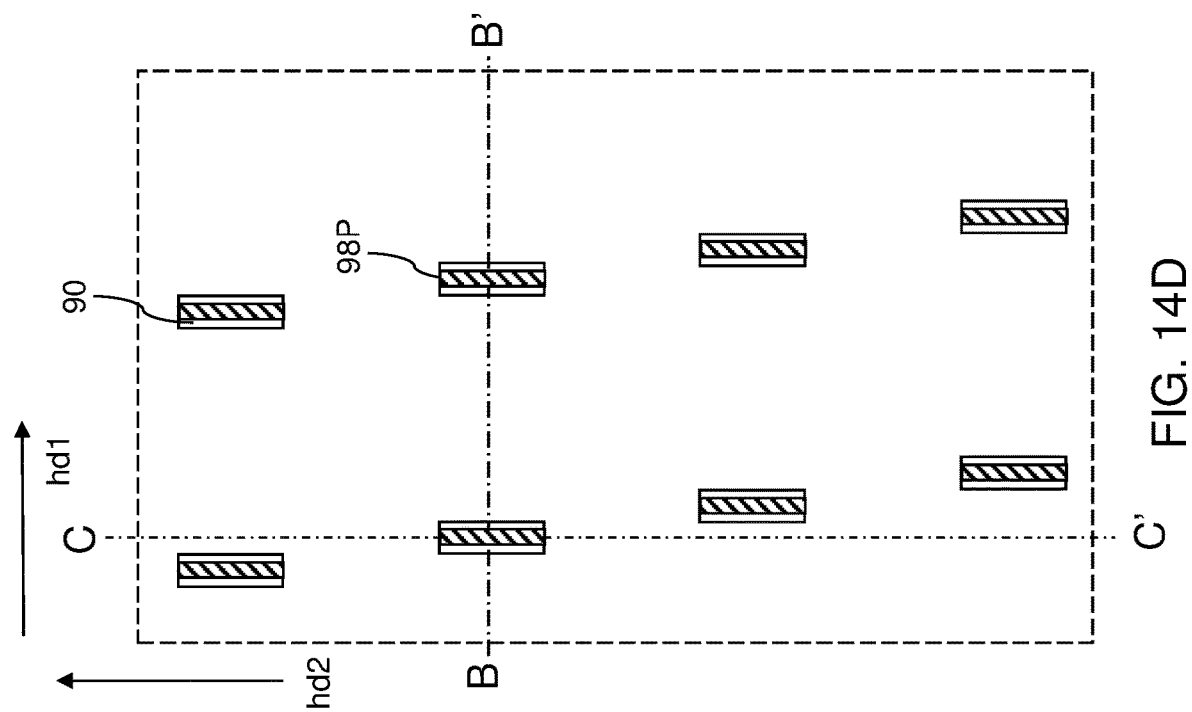

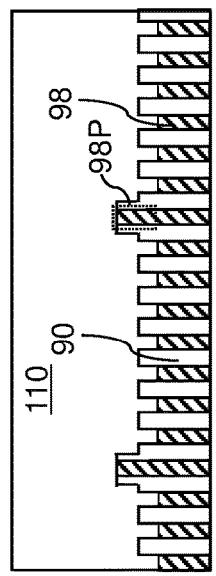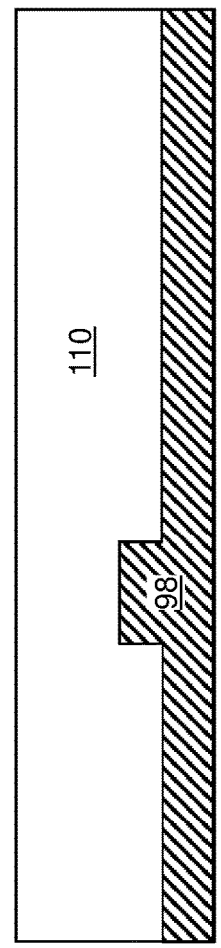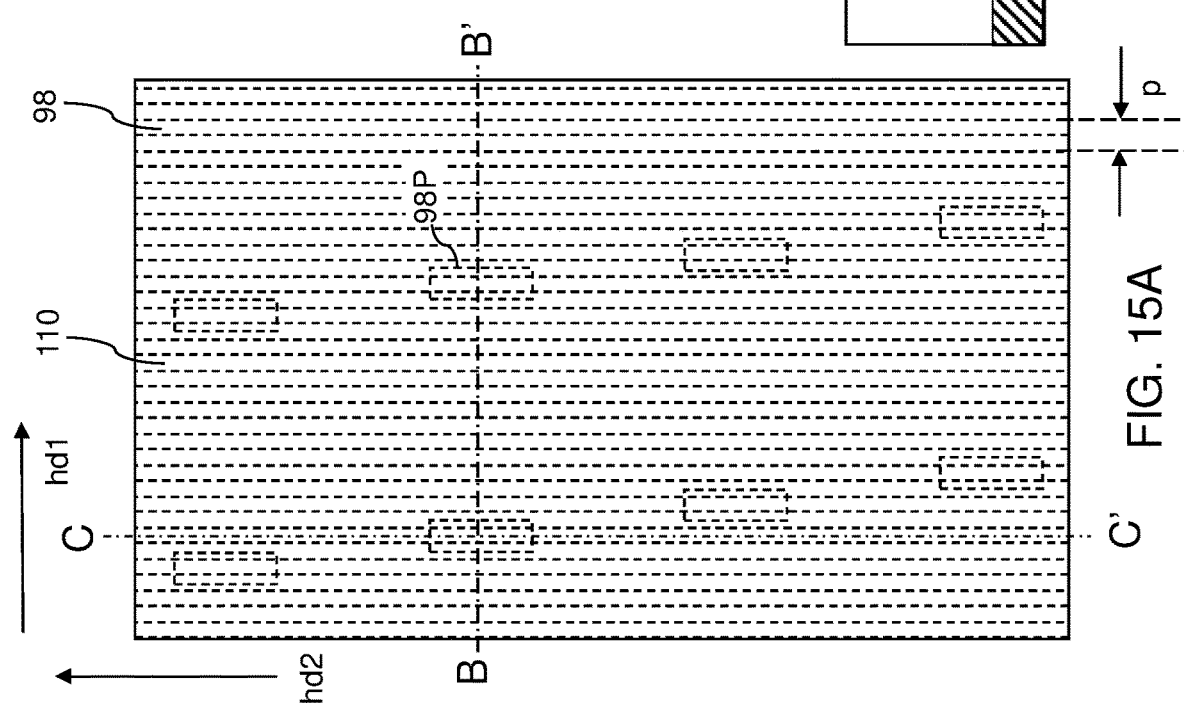

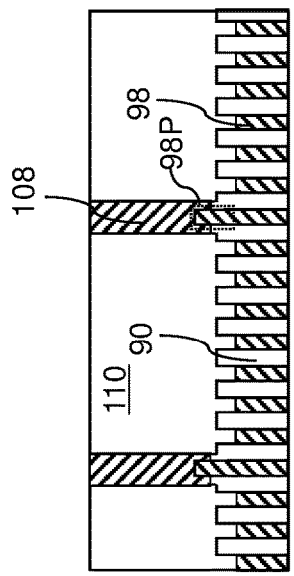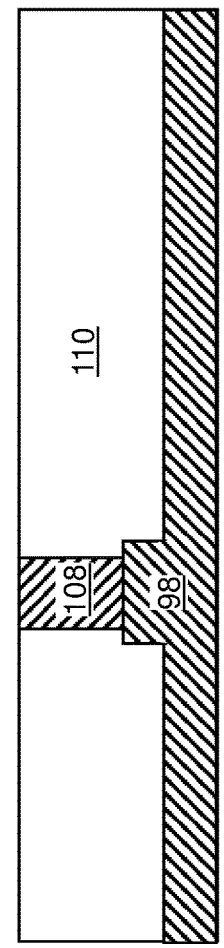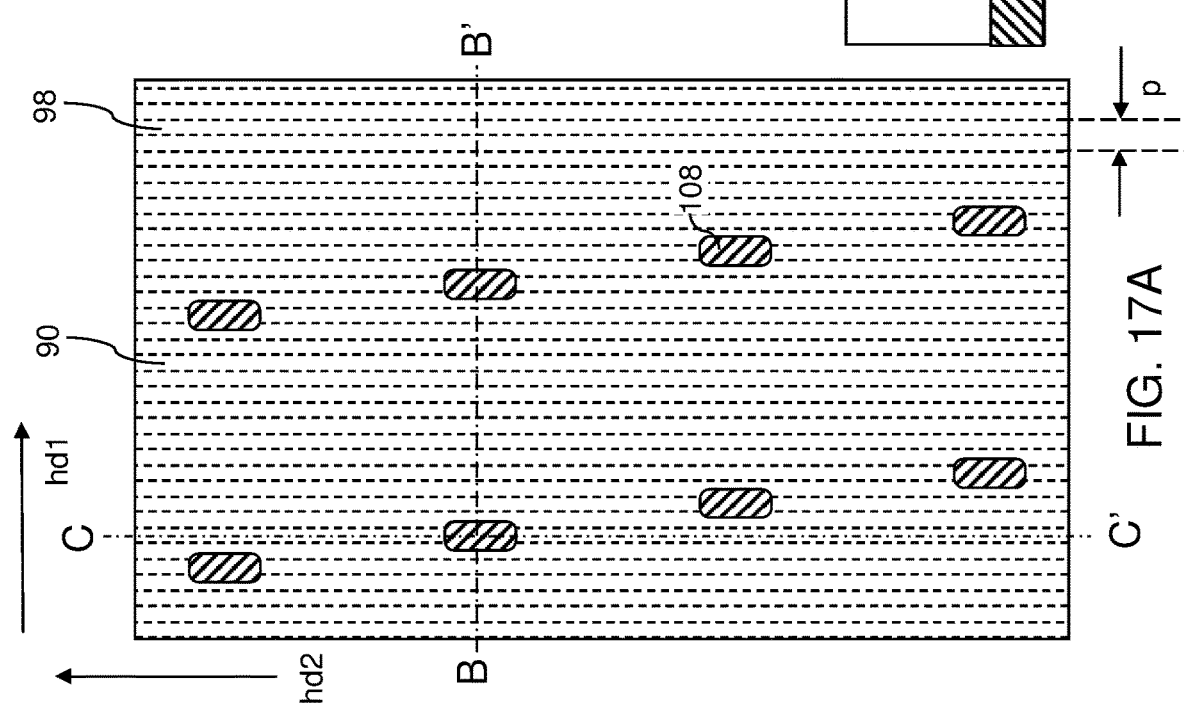
FIG. 17B
FIG. 17C
FIG. 17A

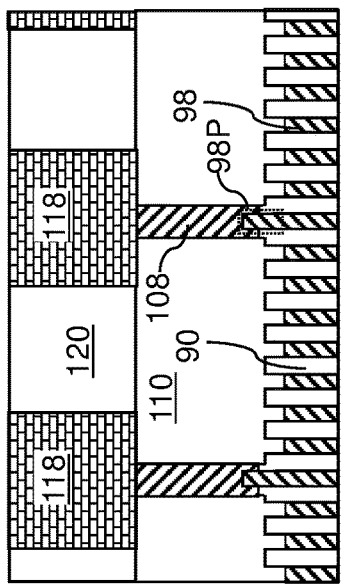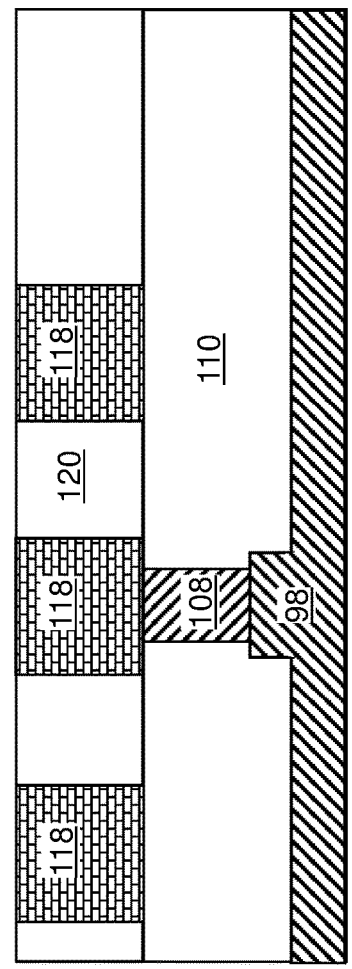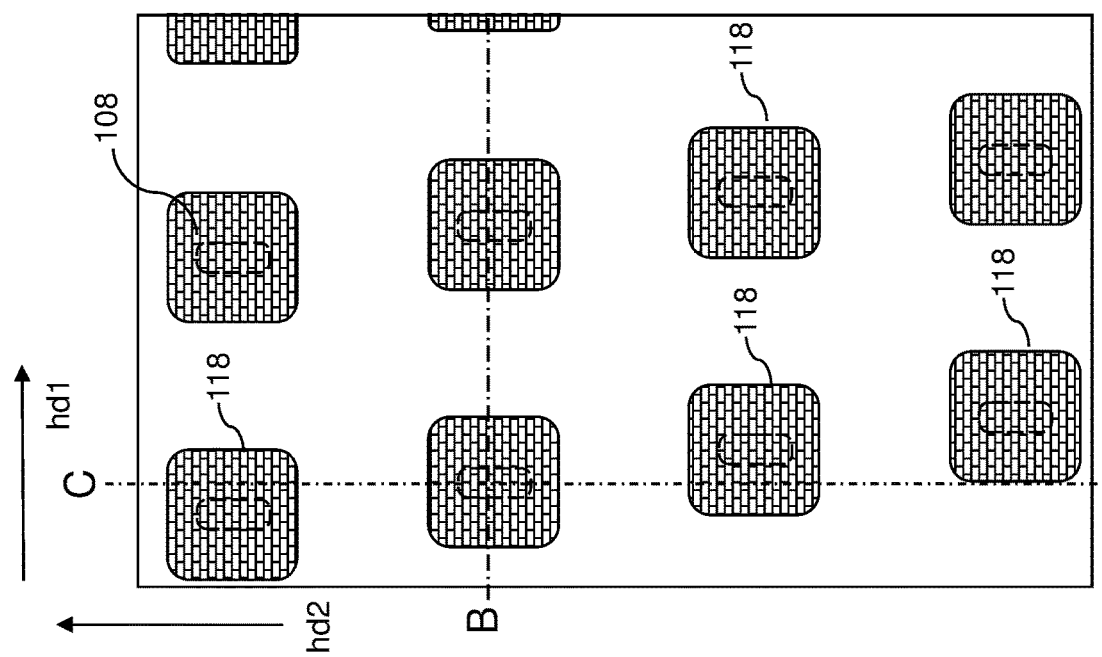
FIG. 18B
FIG. 18C
FIG. 18A

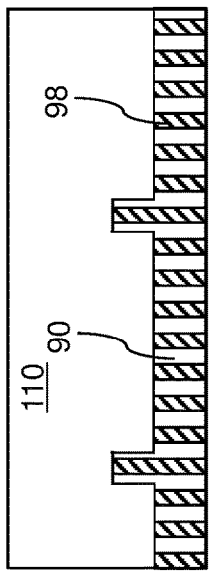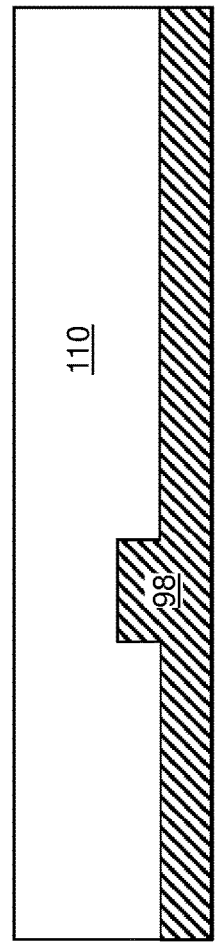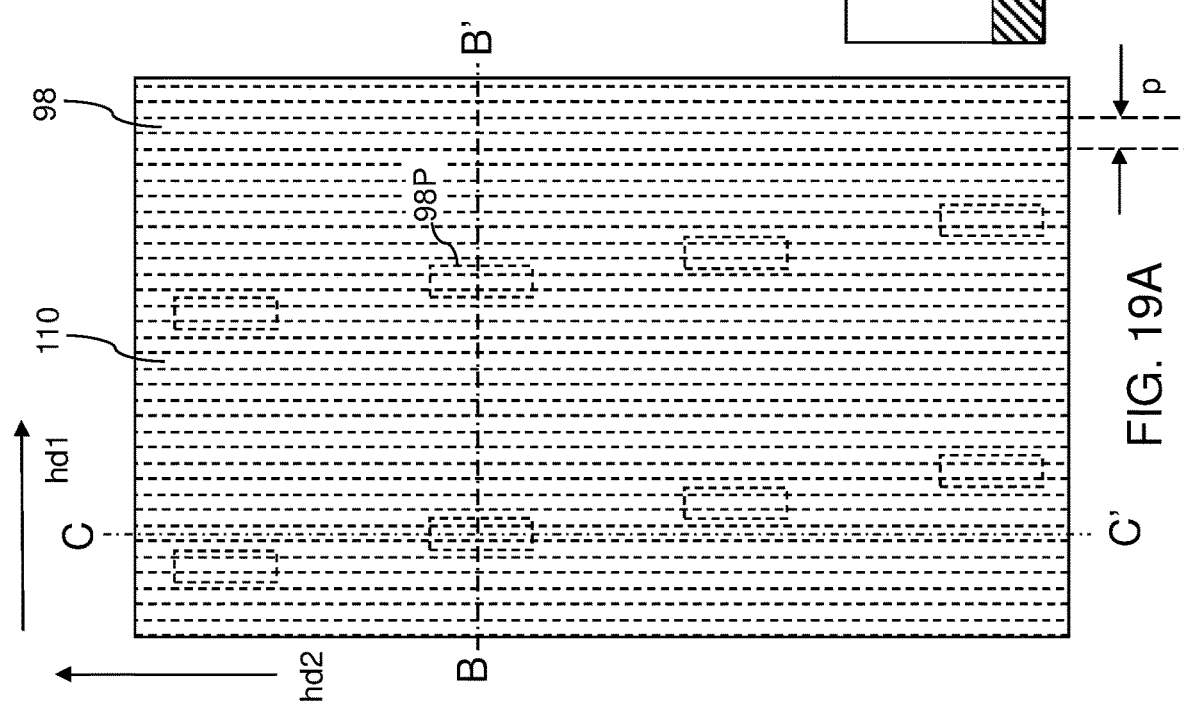

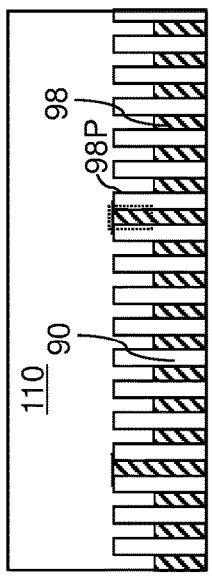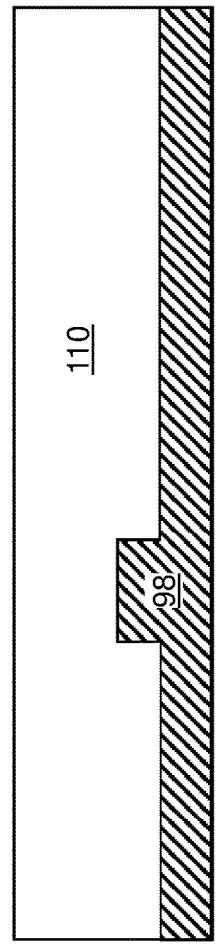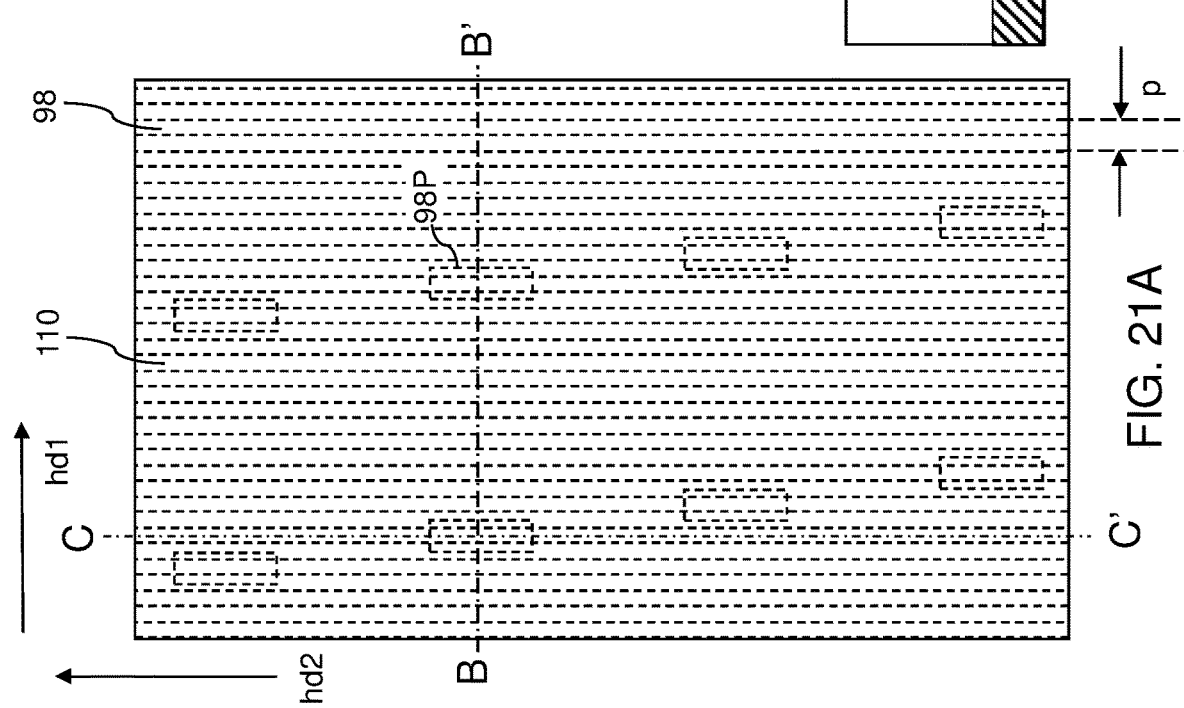

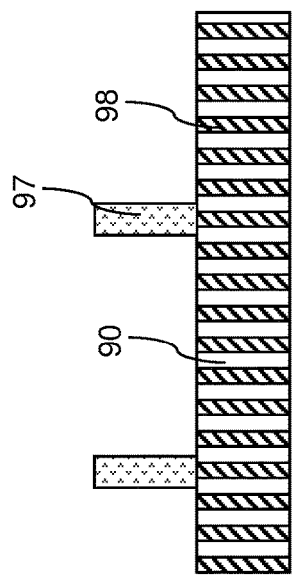
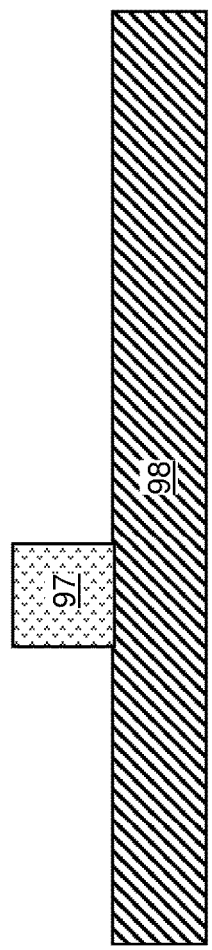# 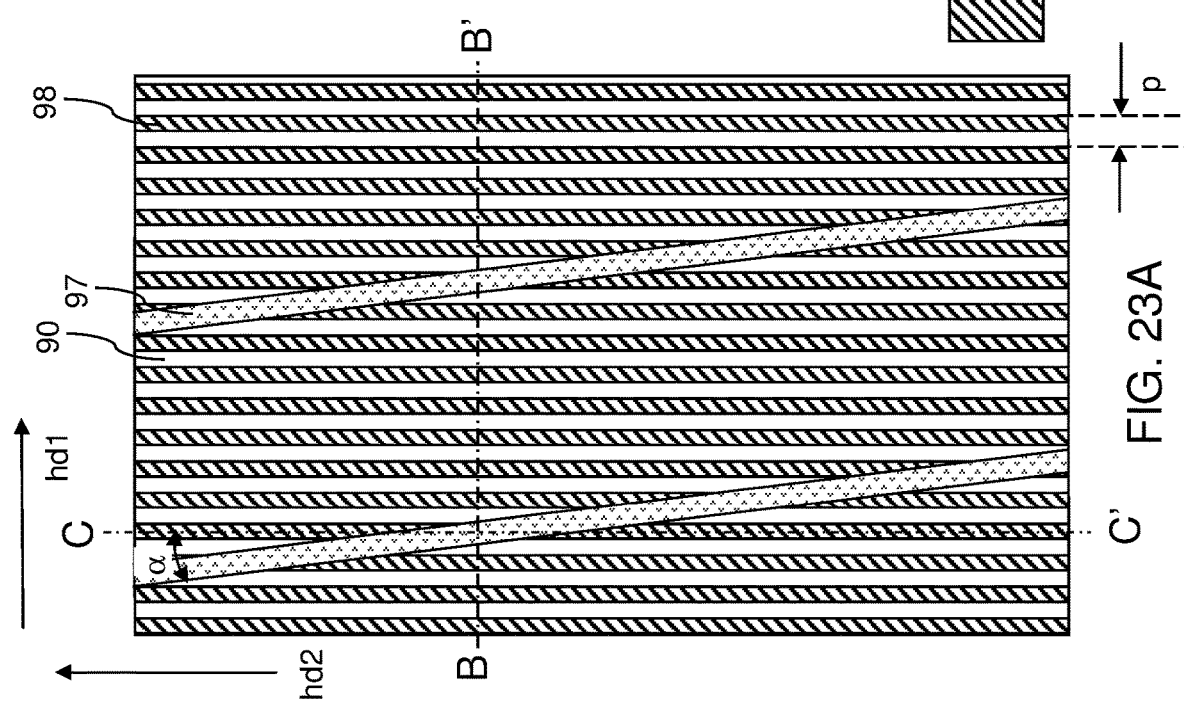
FIG. 23B
FIG. 23C
FIG. 23A

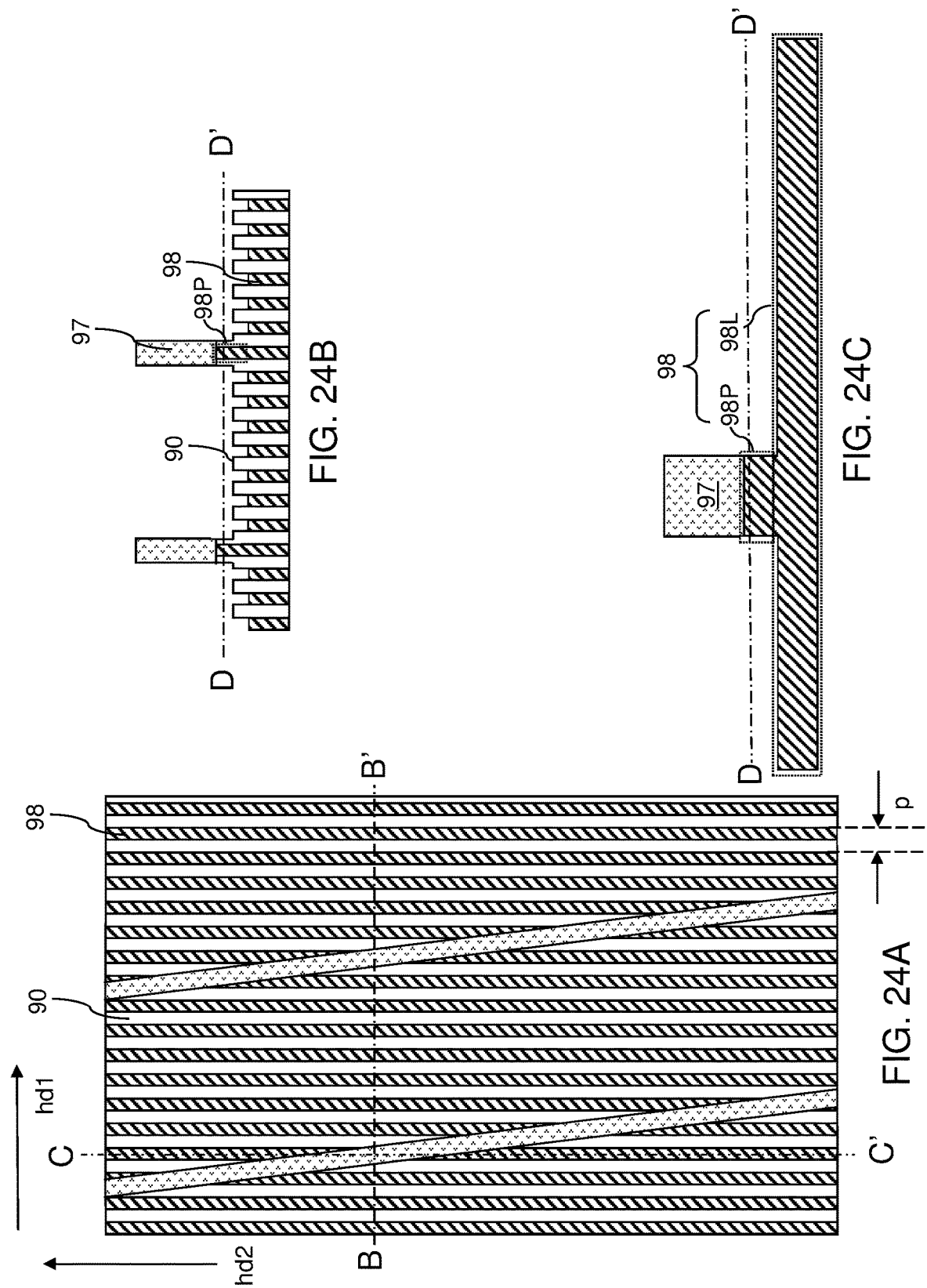

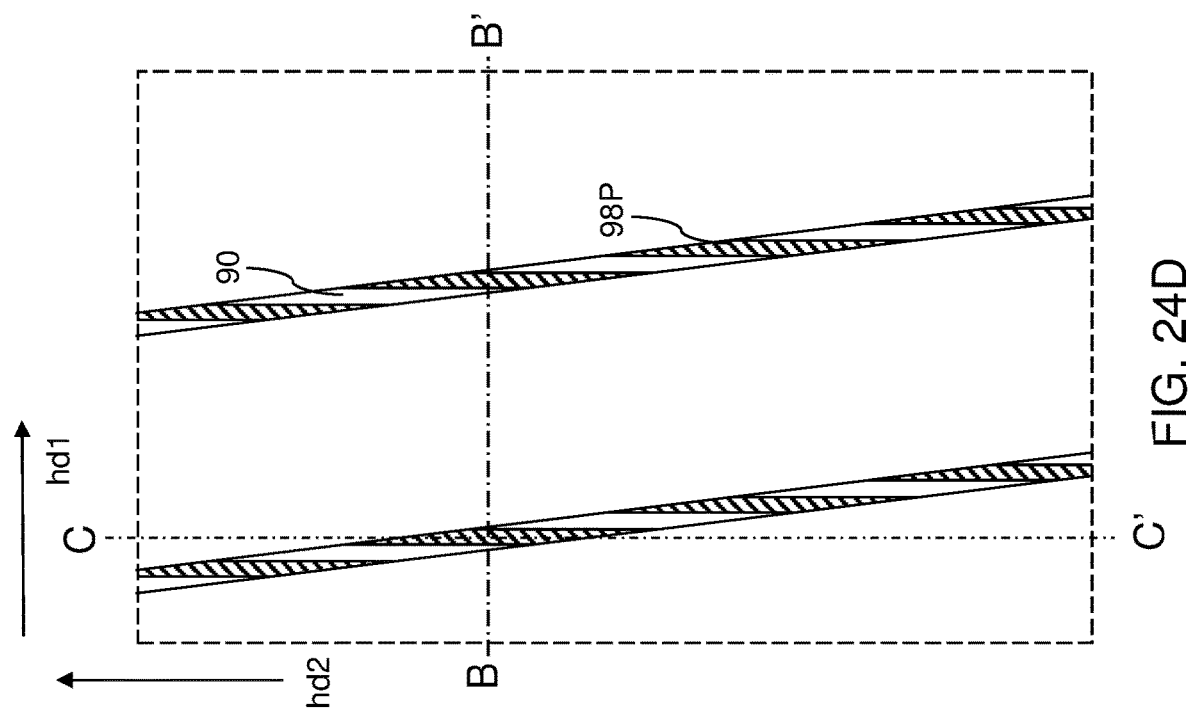

US 11,355,437 B2

THREE-DIMENSIONAL MEMORY DEVICE INCLUDING BUMP-CONTAINING BIT LINES AND METHODS FOR MANUFACTURING THE SAME

FIELD

The present disclosure relates generally to the field of semiconductor devices, and particularly to a three-dimensional memory device including bump-containing bit lines and methods for manufacturing the same.

BACKGROUND

Support circuitry for performing write, read, and erase operations of the memory cells of a three-dimensional memory device may be provided by complementary metal oxide semiconductor (CMOS) devices formed on a same substrate as the three-dimensional memory device.

SUMMARY

According to an aspect of the present disclosure, a semiconductor structure comprising a first semiconductor die is provided. The first semiconductor die comprises: an alternating stack of insulating layers and electrically conductive layers located on a first substrate; memory stack structures extending through the alternating stack, wherein each of the memory stack structures comprises a respective vertical semiconductor channel and a respective memory film; drain regions located at a first end of a respective one of the vertical semiconductor channels; bit lines extending over the drain regions and electrically connected to a respective subset of the drain regions by a respective set of at least one conductive via structure, wherein at least of a subset of the bit lines comprises bump-containing bit lines, and each of the bump-containing bit lines comprises a line portion and a bump portion that protrudes upward from a top surface of the line portion by a bump height; and bit line contact via structures overlying the bit lines and contacting a bump portion of a respective one of the bump-containing bit lines.

According to another aspect of the present disclosure, a method of forming a semiconductor structure that comprises a first semiconductor die is provided. The method comprises: forming a three-dimensional memory array including memory stack structures vertically extending through an alternating stack of insulating layers and electrically conductive layers over a first substrate, wherein each of the memory stack structures comprises a respective vertical semiconductor channel and a respective memory film, and a drain region is disposed on a top end of each of the vertical semiconductor channels; forming conductive via structures embedded within at least one connection-level dielectric layer over the drain regions; forming bit lines on physically exposed top surfaces of the conductive via structures; masking a first area of each of the bit lines with a respective patterned mask material portion without covering a second area of each of the bit lines; vertically recessing portions of the bit lines that are not masked by the patterned mask material portions by performing an anisotropic etch process, wherein the bit lines are converted into bump-containing bit lines, and each of the bump-containing bit lines comprises a line portion having a uniform height between a planar bottom surface and a planar top surface and a bump portion that protrudes upward from a horizontal plane including the planar top surface of the line portion by a bump height; and forming bit line contact via structures on a bump portion of a respective one of the bump-containing bit lines.

BRIEF DESCRIPTION OF THE DRAWINGS

FIGS. 4A-4F are sequential schematic vertical cross-sectional views of a memory opening within the exemplary structure during formation of a memory stack structure, an optional dielectric core, and a drain region therein according to an embodiment of the present disclosure.

FIG. 9B is a partial see-through top-down view of the exemplary structure of FIG. 9A. The vertical plane A-A' is the plane of the schematic vertical cross-sectional view of FIG. 9A.

FIG. 12A is a schematic vertical cross-sectional view of the exemplary structure after formation of connection-via-level metal interconnect structures and bit-line-level metal interconnect structures according to an embodiment of the present disclosure.

FIG. 13A is a top-down view of an array region of the exemplary structure after formation of patterned mask material portions according to an embodiment of the present disclosure.

FIG. 13B is a vertical cross-sectional view of the exemplary structure along the vertical plane B-B' of FIG. 13A.

FIG. 13C is a vertical cross-sectional view of the exemplary structure along the vertical plane C-C' of FIG. 13A.

FIG. 14A is a top-down view of an array region of the exemplary structure after vertically recessing unmasked portions of the bit lines according to an embodiment of the present disclosure.

FIG. 14B is a vertical cross-sectional view of the exemplary structure along the vertical plane B-B' of FIG. 14A.

FIG. 14C is a vertical cross-sectional view of the exemplary structure along the vertical plane C-C' of FIG. 14A.

FIG. 14D is a horizontal cross-sectional view of the exemplary structure along the horizontal plane D-D' of FIGS. 14B and 14C.

FIG. 15A is a partial see-through top-down view of an array region of the exemplary structure after formation of a via-level dielectric layer according to an embodiment of the present disclosure.

FIG. 15B is a vertical cross-sectional view of the exemplary structure along the vertical plane B-B' of FIG. 15A.

FIG. 15C is a vertical cross-sectional view of the exemplary structure along the vertical plane C-C' of FIG. 15A.

FIG. 17A is a top-down view of an array region of the exemplary structure after formation of bit line contact via structures in the via cavities according to an embodiment of the present disclosure.

FIG. 17B is a vertical cross-sectional view of the exemplary structure along the vertical plane B-B' of FIG. 17A.

FIG. 17C is a vertical cross-sectional view of the exemplary structure along the vertical plane C-C' of FIG. 17A.

FIG. 18A is a top-down view of an array region of the exemplary structure after formation of a first pad-level dielectric layer and first bonding pads according to an embodiment of the present disclosure.

FIG. 18B is a vertical cross-sectional view of the exemplary structure along the vertical plane B-B' of FIG. 18A.

FIG. 18C is a vertical cross-sectional view of the exemplary structure along the vertical plane C-C' of FIG. 18A.

FIG. 19A is a partial see-through top-down view of an array region of the exemplary structure in a first alternative configuration after formation of a via-level dielectric layer according to an embodiment of the present disclosure.

FIG. 19B is a vertical cross-sectional view of the exemplary structure along the vertical plane B-B' of FIG. 19A.

FIG. 19C is a vertical cross-sectional view of the exemplary structure along the vertical plane C-C' of FIG. 19A.

FIG. 21A is a partial see-through top-down view of an array region of the exemplary structure in a second alternative configuration after formation of a via-level dielectric layer according to an embodiment of the present disclosure.

FIG. 21B is a vertical cross-sectional view of the exemplary structure along the vertical plane B-B' of FIG. 21A.

FIG. 21C is a vertical cross-sectional view of the exemplary structure along the vertical plane C-C' of FIG. 21A.

FIG. 23A is a top-down view of an array region of the exemplary structure in a third alternative configuration after formation of patterned mask material portions according to an embodiment of the present disclosure.

FIG. 23B is a vertical cross-sectional view of the exemplary structure along the vertical plane B-B' of FIG. 23A.

FIG. 23C is a vertical cross-sectional view of the exemplary structure along the vertical plane C-C' of FIG. 23A.

FIG. 24A is a top-down view of an array region of the exemplary structure in the third alternative configuration after vertically recessing unmasked portions of the bit lines according to an embodiment of the present disclosure.

FIG. 24B is a vertical cross-sectional view of the exemplary structure along the vertical plane B-B' of FIG. 24A.

FIG. 24C is a vertical cross-sectional view of the exemplary structure along the vertical plane C-C' of FIG. 24A.

FIG. 24D is a horizontal cross-sectional view of the exemplary structure along the horizontal plane D-D' of FIGS. 24B and 24C.

DETAILED DESCRIPTION

Figure 1:
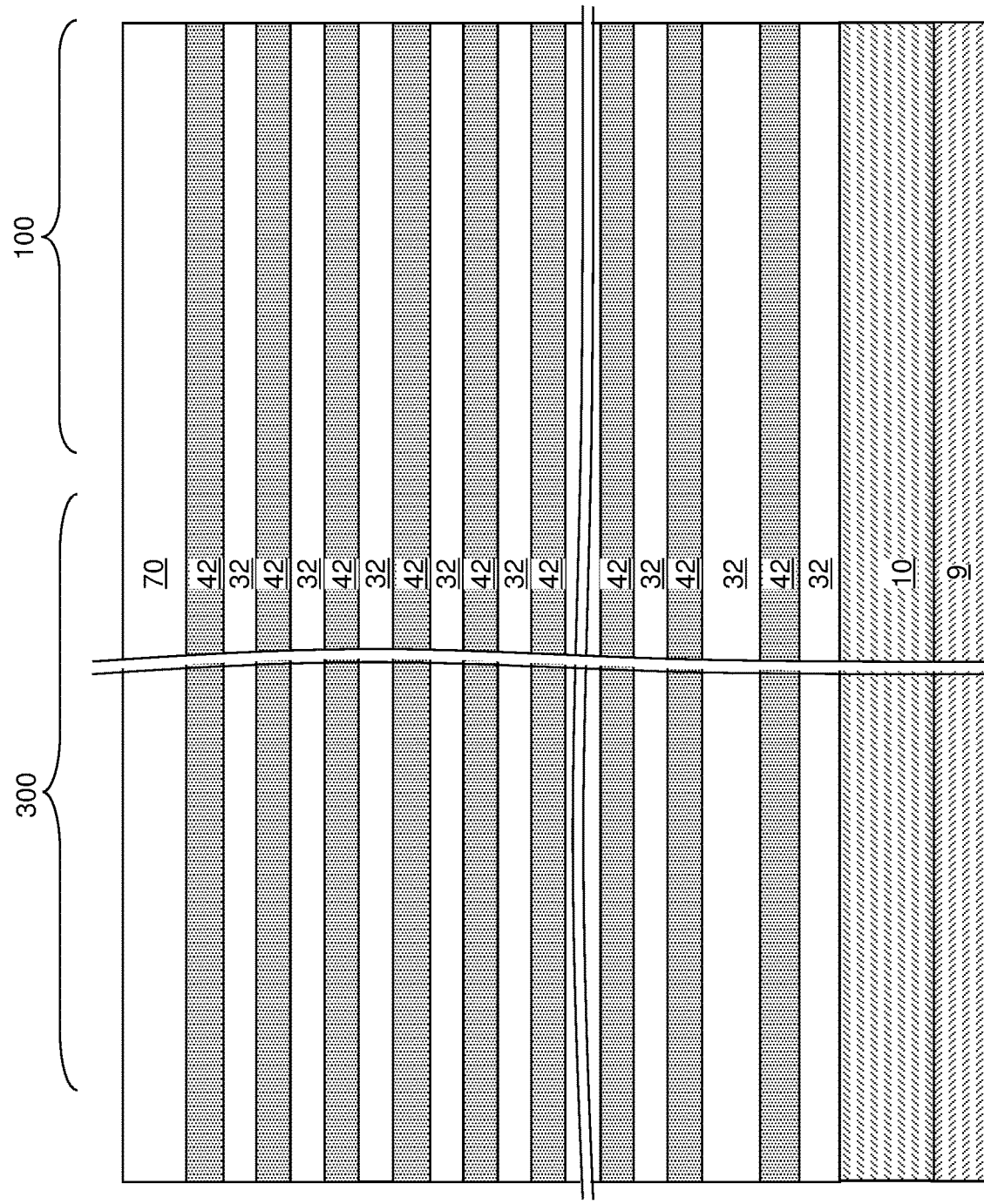
FIG. 1 is a schematic vertical cross-sectional view of an exemplary structure for forming a first semiconductor die after formation of an alternating stack of insulating layers and sacrificial material layers on a first substrate according to an embodiment of the present disclosure.

As discussed above, the embodiments of the present disclosure are directed to a three-dimensional memory device including bump-containing bit lines and methods for manufacturing the same, the various aspects of which are described below. The embodiments of the present disclosure can be used to form various structures including a multilevel memory structure, non-limiting examples of which include semiconductor devices such as three-dimensional monolithic memory array devices comprising a plurality of NAND memory strings. The embodiments of the present disclosure can be used to form a bonded assembly of multiple semiconductor dies including a memory die and a logic die.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-stack" element refers to an element that vertically extends through a memory level.

As used herein, a "semiconducting material" refers to a material having electrical conductivity in the range from $1.0 \times 10^{-5}$ S/m to $1.0 \times 10^5$ S/m. As used herein, a "semiconductor material" refers to a material having electrical conductivity in the range from $1.0 \times 10^{-5}$ S/m to 1.0 S/m in the absence of electrical dopants therein, and is capable of producing a doped material having electrical conductivity in a range from 1.0 S/m to $1.0 \times 10^7$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to provide electrical conductivity greater than $1.0 \times 10^5$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^7$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. Three-dimensional memory devices according to various embodiments of the present disclosure include a monolithic three-dimensional NAND string memory device, and can be fabricated using the various embodiments described herein.

Generally, a semiconductor package (or a "package") refers to a unit semiconductor device that can be attached to a circuit board through a set of pins or solder balls. A semiconductor package may include a semiconductor chip (or a "chip") or a plurality of semiconductor chips that are bonded thereamongst, for example, by flip-chip bonding or another chip-to-chip bonding. A package or a chip may include a single semiconductor die (or a "die") or a plurality of semiconductor dies. A die is the smallest unit that can independently execute external commands or report status. Typically, a package or a chip with multiple dies is capable of simultaneously executing as many external commands as the total number of dies therein. Each die includes one or more planes. Identical concurrent operations can be executed in each plane within a same die, although there may be some restrictions. In case a die is a memory die, i.e., a die including memory elements, concurrent read operations, concurrent write operations, or concurrent erase operations can be performed in each plane within a same memory die. Each plane contains a number of memory blocks (or "blocks"), which are the smallest unit that can be erased by in a single erase operation. Each memory block contains a number of pages, which are the smallest units that can be selected for programming.

Referring to FIG. 1, an exemplary structure according to an embodiment of the present disclosure is illustrated, which can be employed to provide a first semiconductor die including a three-dimensional memory device. The three-dimensional memory device may include a three-dimensional NAND array or a three-dimensional NOR array. While the present disclosure is described employing an embodiment in which a three-dimensional NAND array is fabricated, embodiments are expressly contemplated herein in which the three-dimensional memory device includes any type of three-dimensional memory cells accessed by bit lines that are parallel among one another.

The exemplary structure includes a first substrate (9, 10) containing a substrate material layer 9. The substrate material layer 9 may include a semiconductor material, an insulating material, or a conductive material. A semiconductor material layer 10 may be provided as an upper portion of the substrate material layer 9, or may be provided by deposition or growth of a semiconductor material on a top surface of the substrate material layer 9. In one embodiment, the combination of the substrate material layer 9 and the semiconductor material layer 10 may be provided as a commercially available single crystalline semiconductor wafer. In this case, a surface portion of the commercially available single crystalline semiconductor wafer constitutes the semiconductor material layer 10, and a bulk portion of the commercially available single crystalline semiconductor wafer constitutes the substrate material layer 9. Alternatively, the first substrate (9, 10) may include a semiconductor-on-insulator (SOI) substrate, and a combination of a buried oxide layer and a handle substrate may constitute the substrate material layer 9.

A stack of an alternating plurality of first material layers (which can be insulating layers 32) and second material layers (which can be sacrificial material layer 42) is formed over the top surface of the semiconductor material layer 10. As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

The thicknesses of the insulating layers 32 and the sacrificial material layers 42 can be in a range from 20 nm to 50 nm, although lesser and greater thicknesses can be used for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be used. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

While the present disclosure is described using an embodiment in which the spacer material layers are sacrificial material layers 42 that are subsequently replaced with electrically conductive layers, in other embodiments the sacrificial material layers are formed as electrically conductive layers. In such embodiments, steps for replacing the spacer material layers with electrically conductive layers can be omitted.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be used for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

The exemplary structure can include at least one memory array region 100 in which a three-dimensional array of memory elements is to be subsequently formed, and at least one staircase region 300 in which stepped surfaces of the alternating stack (32, 42) are to be subsequently formed.

Figure 2:
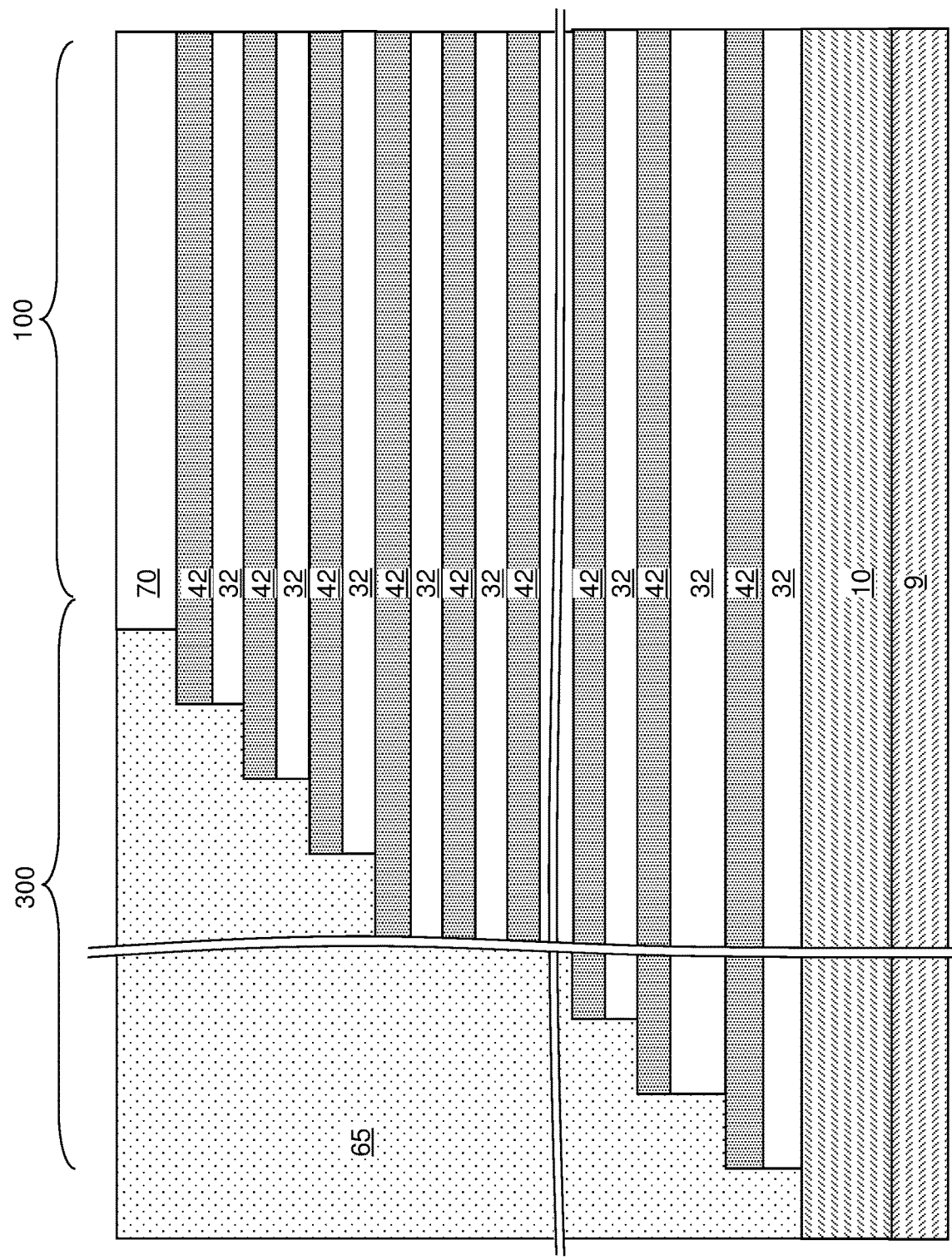
FIG. 2 is a schematic vertical cross-sectional view of the exemplary structure after formation of stepped surfaces and a stepped dielectric material portion according to an embodiment of the present disclosure.

Referring to FIG. 2, stepped surfaces are formed in the staircase region 300, which is herein referred to as a terrace region. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the alternating stack (32, 42) are removed through formation of the stepped surfaces. A "stepped cavity" refers to a cavity having stepped surfaces.

The terrace region is formed in the staircase region 300. The stepped cavity can have various stepped surfaces such that the horizontal cross-sectional shape of the stepped cavity changes in steps as a function of the vertical distance from the top surface of the semiconductor material layer 10. In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer 42 other than a topmost sacrificial material layer 42 within the alternating stack (32, 42) laterally extends farther than any overlying sacrificial material layer 42 within the alternating stack (32, 42) in the terrace region. The terrace region includes stepped surfaces of the alternating stack (32, 42) that continuously extend from a bottommost layer within the alternating stack (32, 42) to a topmost layer within the alternating stack (32, 42).

A stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the stepped dielectric material portion 65. As used herein, a "stepped" element refers to an element that has stepped surfaces and a horizontal cross-sectional area that increases monotonically as a function of a vertical distance from a top surface of a substrate on which the element is present. If silicon oxide is used for the stepped dielectric material portion 65, the silicon oxide of the stepped dielectric material portion 65 may, or may not, be doped with dopants such as B, P, and/or F. In one embodiment, the stepped dielectric material portion 65 has a stepwise-increasing lateral extent that increases with a vertical distance from the first substrate (9, 10).

Optionally, drain select level isolation structures 72 can be formed through the insulating cap layer 70 and a subset of the sacrificial material layers 42 located at drain select levels. The drain select level isolation structures 72 can be formed, for example, by forming drain select level isolation trenches and filling the drain select level isolation trenches with a dielectric material such as silicon oxide. Excess portions of the dielectric material can be removed from above the top surface of the insulating cap layer 70.

Figure 3A:
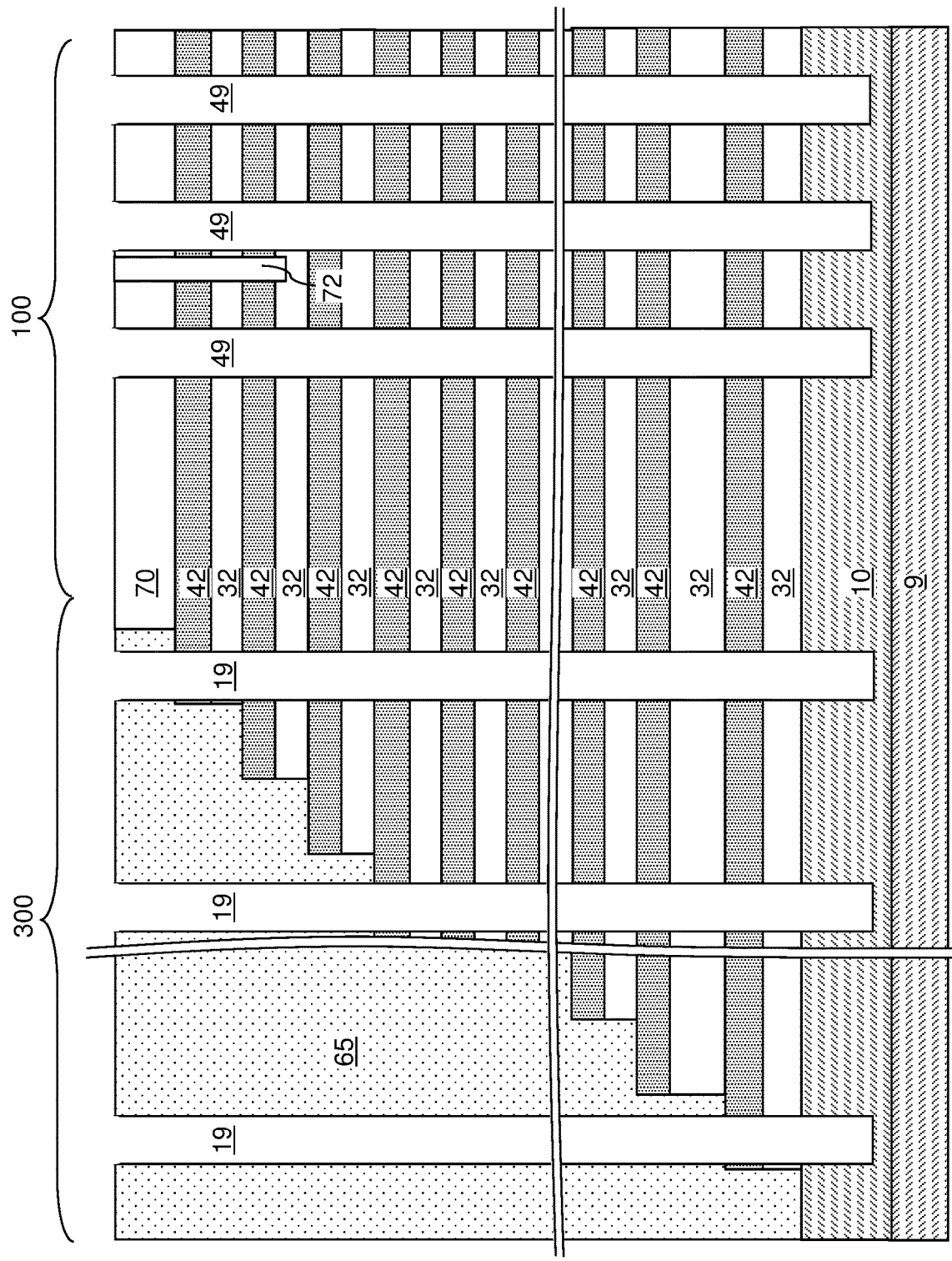
FIG. 3A is a schematic vertical cross-sectional view of the exemplary structure after formation of memory openings and support openings according to an embodiment of the present disclosure.
Figure 3B:
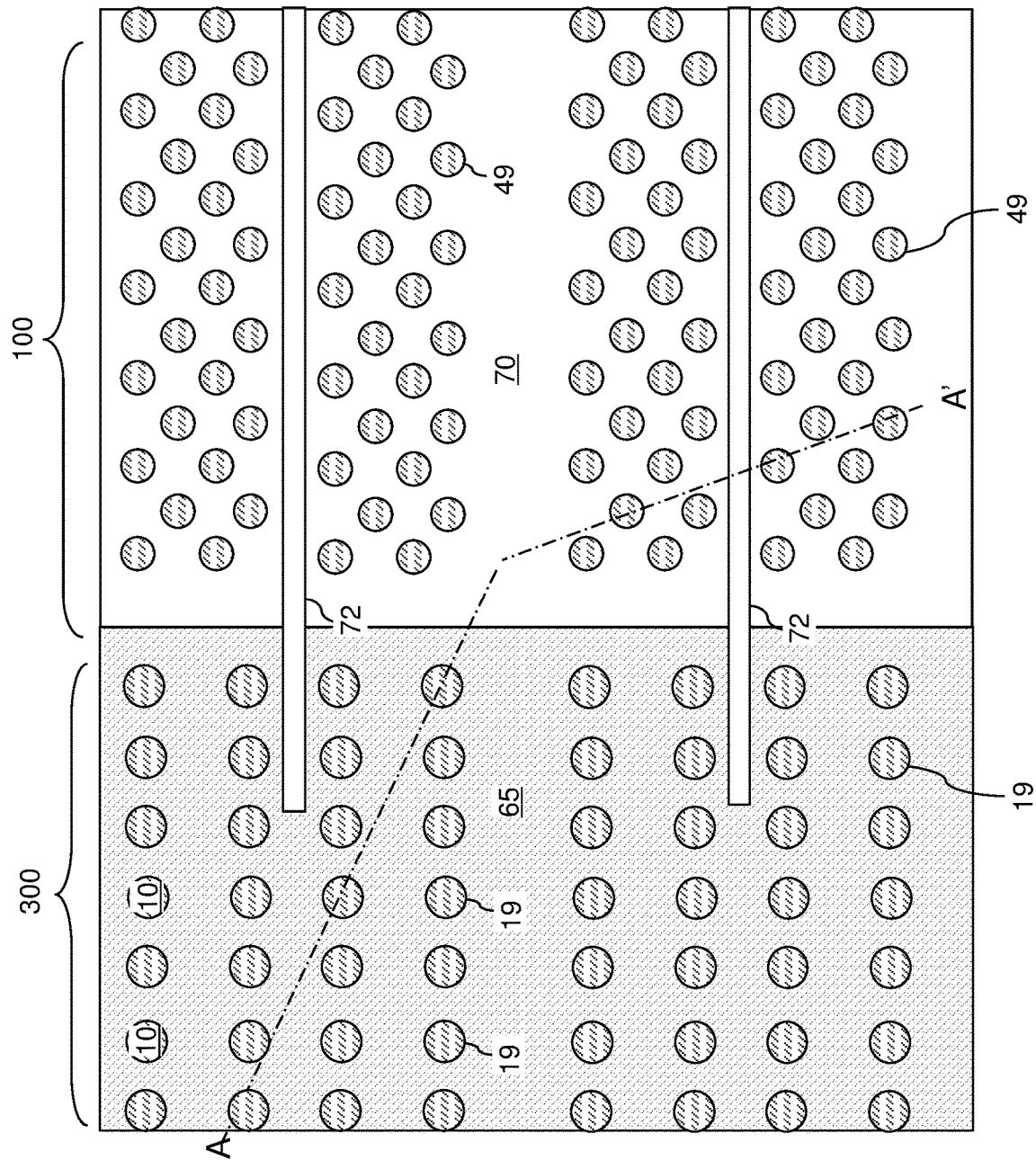
FIG. 3B is a top-down view of the exemplary structure of FIG. 3A. The vertical plane A-A' is the plane of the cross-section for FIG. 3A.

Referring to FIGS. 3A and 3B, a lithographic material stack (not shown) including at least a photoresist layer can be formed over the insulating cap layer 70 and the stepped dielectric material portion 65, and can be lithographically patterned to form openings therein. The openings include a first set of openings formed over the memory array region 100 and a second set of openings formed over the staircase region 300. The pattern in the lithographic material stack can be transferred through the insulating cap layer 70 or the stepped dielectric material portion 65, and through the alternating stack (32, 42) by at least one anisotropic etch that uses the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the insulating cap layer 70 and the entirety of the alternating stack (32, 42) in the memory array region 100. The support openings 19 are formed through the stepped dielectric material portion 65 and the portion of the alternating stack (32, 42) that underlie the stepped surfaces in the staircase region 300.

The memory openings 49 extend through the entirety of the alternating stack (32, 42). The support openings 19 extend through a subset of layers within the alternating stack (32, 42). The chemistry of the anisotropic etch process used to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can extend from the top surface of the alternating stack (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth can be, for example, in a range from 1 nm to 50 nm, although lesser and greater recess depths can also be used. The overetch is optional, and may be omitted. If the overetch is not performed, the bottom surfaces of the memory openings 49 and the support openings 19 can be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the staircase region 300.

FIGS. 4A-4F illustrate structural changes in a memory opening 49, which is one of the memory openings 49 in the exemplary structure of FIGS. 3A and 3B. The same structural change occurs simultaneously in each of the other memory openings 49 and in each support opening 19.

Referring to FIG. 4A, a memory opening 49 in the exemplary device structure of FIGS. 3A and 3B is illustrated. The memory opening 49 extends through the insulating cap layer 70, the alternating stack (32, 42), and optionally into an upper portion of the semiconductor material layer 10. At this processing step, each support opening 19 can extend through the stepped dielectric material portion 65, a subset of layers in the alternating stack (32, 42), and optionally through the upper portion of the semiconductor material layer 10. The recess depth of the bottom surface of each memory opening with respect to the top surface of the semiconductor material layer 10 can be in a range from 0 nm to 30 nm, although greater recess depths can also be used. Optionally, the sacrificial material layers 42 can be laterally recessed partially to form lateral recesses (not shown), for example, by an isotropic etch.

Referring to FIG. 5B, a stack of layers including a blocking dielectric layer 52, a charge storage layer 54, a tunneling dielectric layer 56, and an optional semiconductor channel layer 60L can be sequentially deposited in the memory openings 49.

The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. Alternatively or additionally, the blocking dielectric layer 52 can include a dielectric semiconductor compound such as silicon oxide, silicon oxynitride, silicon nitride, or a combination thereof. The thickness of the blocking dielectric layer 52 can be in a range from 3 nm to 20 nm, although lesser and greater thicknesses can also be used. Alternatively, the blocking dielectric layer 52 can be omitted, and a backside blocking dielectric layer can be formed after formation of backside recesses on surfaces of memory films to be subsequently formed.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the charge storage layer 54 includes a silicon nitride layer. The charge storage layer 54 can be formed as a single charge storage layer of homogeneous composition, or can include a stack of multiple charge storage layers. The thickness of the charge storage layer 54 can be in a range from 2 nm to 20 nm, although lesser and greater thicknesses can also be used.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. The thickness of the tunneling dielectric layer 56 can be in a range from 2 nm to 20 nm, although lesser and greater thicknesses can also be used.

The optional semiconductor channel layer 60L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel layer 60L includes amorphous silicon or polysilicon. The semiconductor channel layer 60L can be formed by a conformal deposition method such as low pressure chemical vapor deposition (LPCVD). The thickness of the semiconductor channel layer 60L can be in a range from 2 nm to 10 nm, although lesser and greater thicknesses can also be used. A memory cavity 49' is formed in the volume of each memory opening 49 that is not filled with the deposited material layers (52, 54, 56, 60L).

Figures 4C, 4D:
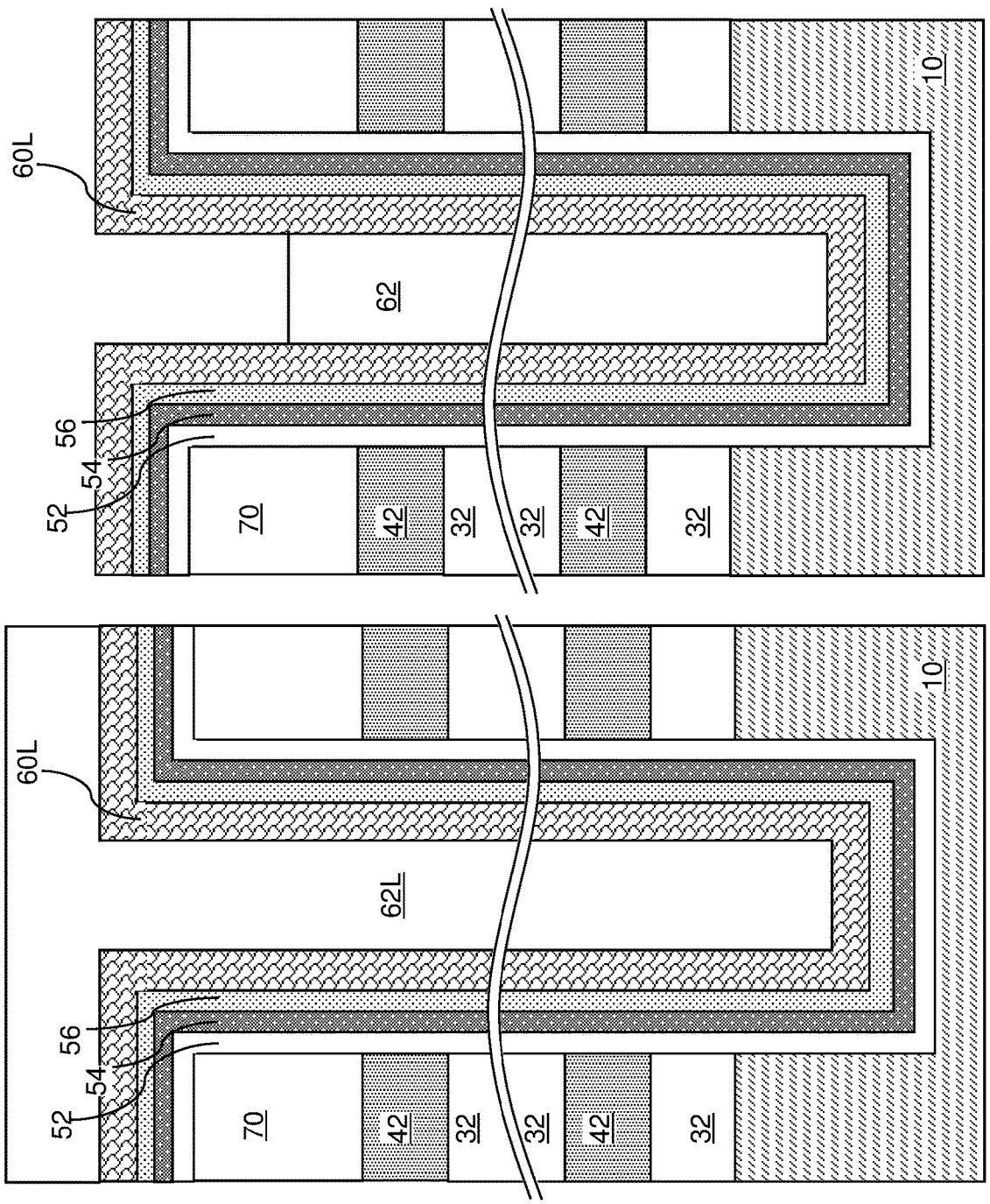

Referring to FIG. 4C, in case the memory cavity 49' in each memory opening is not completely filled by the semiconductor channel layer 60L, a dielectric core layer 62L can be deposited in the memory cavity 49' to fill any remaining portion of the memory cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Referring to FIG. 4D, the dielectric core layer 62L can be recessed selective to the material of the semiconductor channel layer 60L, for example, by a recess etch. The material of the dielectric core layer 62L is vertically recessed below the horizontal plane including the top surface of the insulating cap layer 70. Each remaining portion of the dielectric core layer 62L constitutes a dielectric core 62.

Referring to FIG. 4E, the horizontal portions of the semiconductor channel layer 60L, the tunneling dielectric layer 56, the charge storage layer 54, and the blocking dielectric layer 52 can be removed from above the top surface of the insulating cap layer 70 by a planarization process. A series of recess etch processes can be used, which may include at least one anisotropic etch step and/or at least one isotropic etch step. Each remaining portion of the semiconductor channel layer 60L can be located entirely within a memory opening 49 or entirely within a support opening 19.

Each remaining portion of the semiconductor channel layer 60L constitutes a vertical semiconductor channel 60. Electrical current can flow through each vertical semiconductor channel 60 when a vertical NAND device including the vertical semiconductor channel 60 is turned on. Within each memory opening 49, a tunneling dielectric layer 56 is surrounded by a charge storage layer 54, and laterally surrounds a vertical semiconductor channel 60. Each adjoining set of a blocking dielectric layer 52, a charge storage layer 54, and a tunneling dielectric layer 56 collectively constitute a memory film 50, which can store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours. Each combination of a memory film 50 and a vertical semiconductor channel 60 constitutes a memory stack structure 55.

Referring to FIG. 4F, drain regions 63 can be formed by depositing a doped semiconductor material within each recessed region above the dielectric cores 62. The drain regions 63 can have a doping of a second conductivity type that is the opposite of the first conductivity type. For example, if the first conductivity type is p-type, the second conductivity type is n-type, and vice versa. The dopant concentration in the drain regions 63 can be in a range from $5.0 \times 10^{19}/cm^3$ to $2.0 \times 10^{21}/cm^3$, although lesser and greater dopant concentrations can also be used. The doped semiconductor material can be, for example, doped polysilicon. Excess portions of the deposited semiconductor material can be removed from above the top surface of the insulating cap layer 70, for example, by chemical mechanical planarization (CMP) or a recess etch to form the drain regions 63.

Each memory stack structure 55 is a combination of a semiconductor channel, a tunneling dielectric layer, a plurality of memory elements comprising portions of the charge storage layer 54, and an optional blocking dielectric layer 52. Each combination of a memory stack structure 55, a dielectric core 62, and a drain region 63 within a memory opening 49 is herein referred to as a memory opening fill structure 58. Each combination of a memory film 50, a vertical semiconductor channel 60, a dielectric core 62, and a drain region 63 within each support opening 19 constitutes a support pillar structure.

Figure 5:
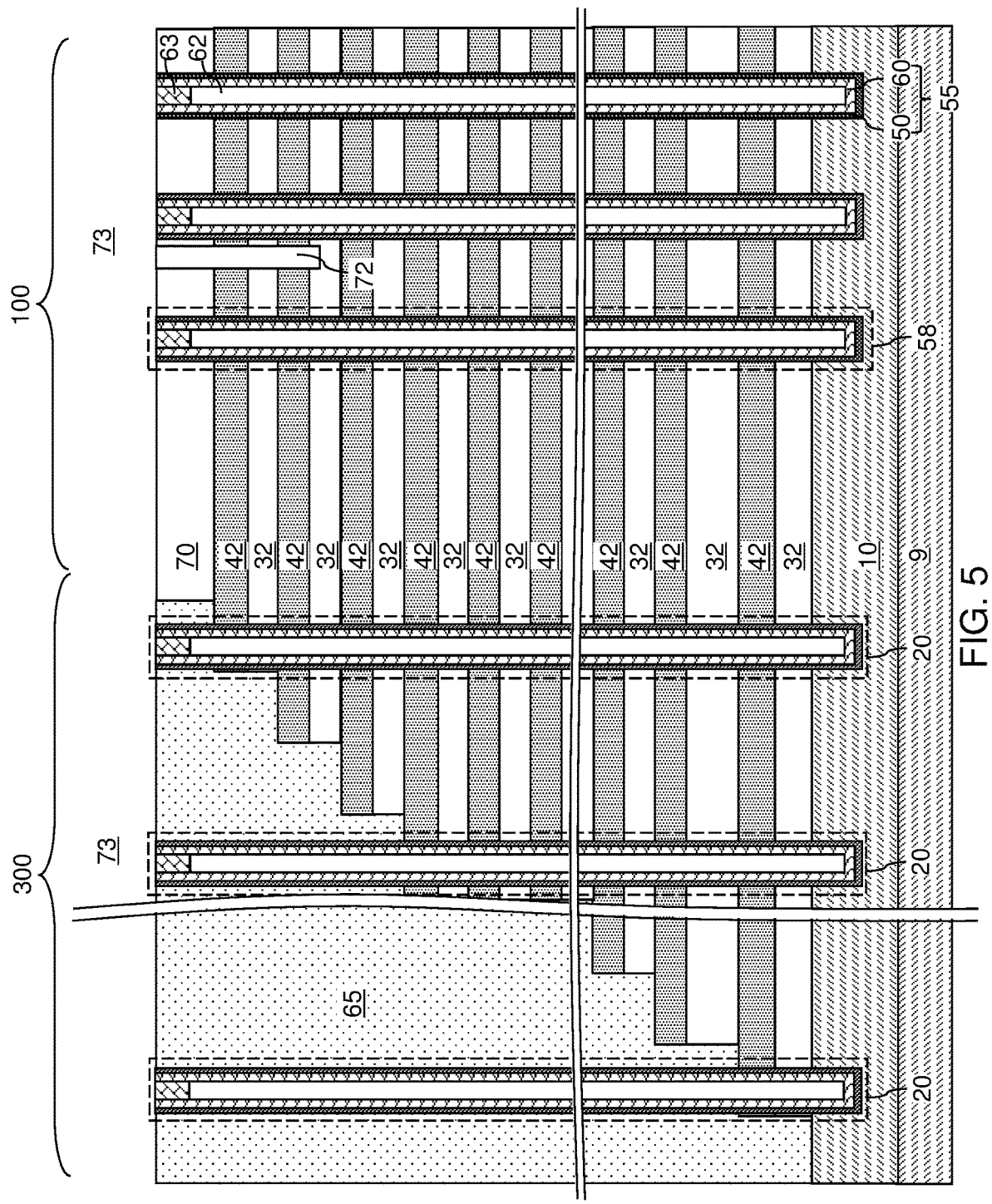
FIG. 5 is a schematic vertical cross-sectional view of the exemplary structure after formation of memory stack structures and support pillar structures according to an embodiment of the present disclosure.

Referring to FIG. 5, the exemplary structure is illustrated after formation of memory opening fill structures 58 and support pillar structure 20 within the memory openings 49 and the support openings 19, respectively. An instance of a memory opening fill structure 58 can be formed within each memory opening 49 of the structure of FIGS. 4A and 4B. An instance of the support pillar structure 20 can be formed within each support opening 19 of the structure of FIGS. 4A and 4B. The support pillar structures 20 are formed through a region of the alternating stack (32, 42) that underlie the stepped surfaces and a region of the stepped dielectric material portion 65 that overlie the stepped surfaces. Each of the support pillar structures 20 comprises a semiconductor material portion (i.e., a vertical semiconductor channel 60 of the support pillar structure 20) having a same composition as the vertical semiconductor channels 60 of the memory opening fill structures 58, and a dielectric layer stack (i.e., a memory film 50 of a support pillar structure 20) containing a same set of dielectric material layers as each of the memory films 50 of the memory opening fill structures 58. While the present disclosure is described using the illustrated configuration for the memory stack structure, the methods of the present disclosure can be applied to alternative memory stack structures including different layer stacks or structures for the memory film 50 and/or for the vertical semiconductor channel 60.

Figure 6A:
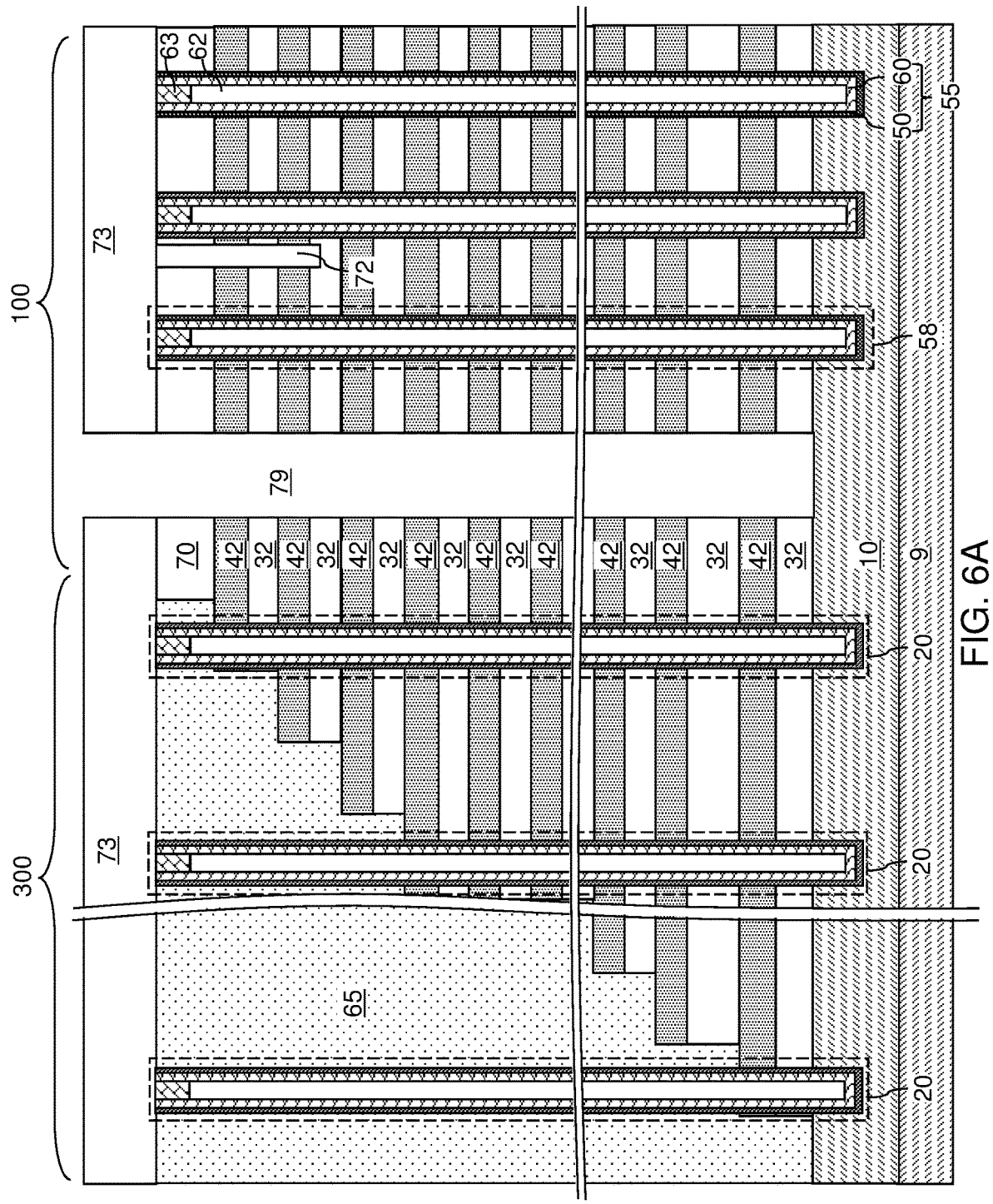
FIG. 6A is a schematic vertical cross-sectional view of the exemplary structure after formation of backside trenches according to an embodiment of the present disclosure.
Figure 6B:
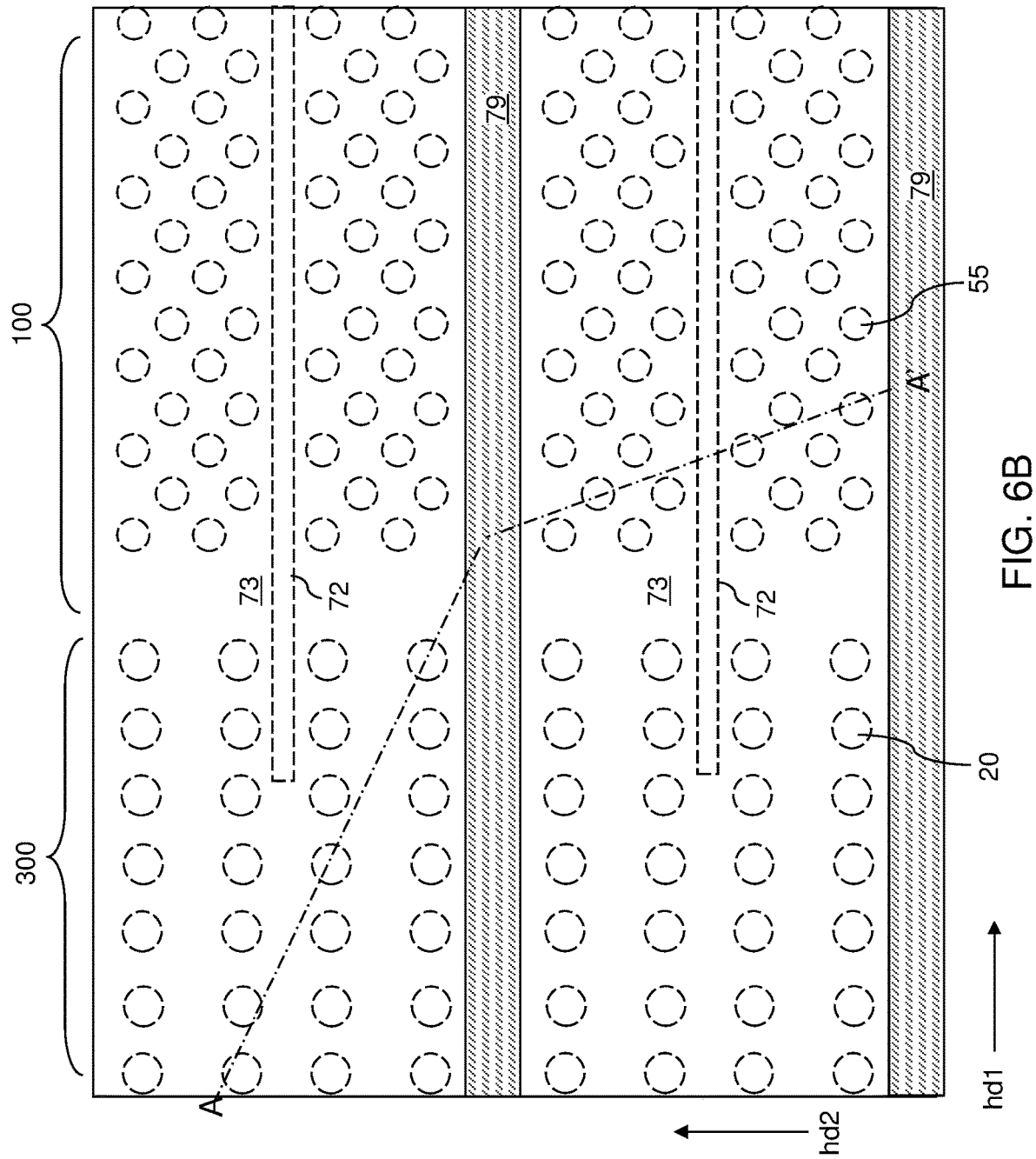
FIG. 6B is a partial see-through top-down view of the exemplary structure of FIG. 6A. The vertical plane A-A' is the plane of the schematic vertical cross-sectional view of FIG. 6A.

Referring to FIGS. 6A and 6B, a first connection-level dielectric layer 73 can be formed over the alternating stack (32, 42) of insulating layer 32 and sacrificial material layers 42, and over the memory stack structures 55 and the support pillar structures 20. The first connection-level dielectric layer 73 includes a dielectric material that is different from the dielectric material of the sacrificial material layers 42. For example, the first connection-level dielectric layer 73 can include silicon oxide. The first connection-level dielectric layer 73 can have a thickness in a range from 50 nm to 500 nm, although lesser and greater thicknesses can also be used.

A photoresist layer (not shown) can be applied over the first connection-level dielectric layer 73, and is lithographically patterned to form openings in areas between clusters of memory stack structures 55. The pattern in the photoresist layer can be transferred through the first connection-level dielectric layer 73, the alternating stack (32, 42) and/or the stepped dielectric material portion 65 using an anisotropic etch to form backside trenches 79, which vertically extend from the top surface of the first connection-level dielectric layer 73 at least to the top surface of the semiconductor material layer 10, and laterally extend through the memory array region 100 and the staircase region 300.

In one embodiment, the backside trenches 79 can laterally extend along a first horizontal direction hd1 and can be laterally spaced apart one from another along a second horizontal direction hd2 that is perpendicular to the first horizontal direction hd1. The memory stack structures 55 can be arranged in rows that extend along the first horizontal direction hd1. The drain select level isolation structures 72 can laterally extend along the first horizontal direction hd1. Each backside trench 79 can have a uniform width that is invariant along the lengthwise direction (i.e., along the first horizontal direction hd1). Each drain select level isolation structure 72 can have a uniform vertical cross-sectional profile along vertical planes that are perpendicular to the first horizontal direction hd1 that is invariant with translation along the first horizontal direction hd1. Multiple rows of memory stack structures 55 can be located between a neighboring pair of a backside trench 79 and a drain select level isolation structure 72, or between a neighboring pair of drain select level isolation structures 72. In one embodiment, the backside trenches 79 can include a source contact opening in which a source contact via structure can be subsequently formed. The photoresist layer can be removed, for example, by ashing.

Figure 7:
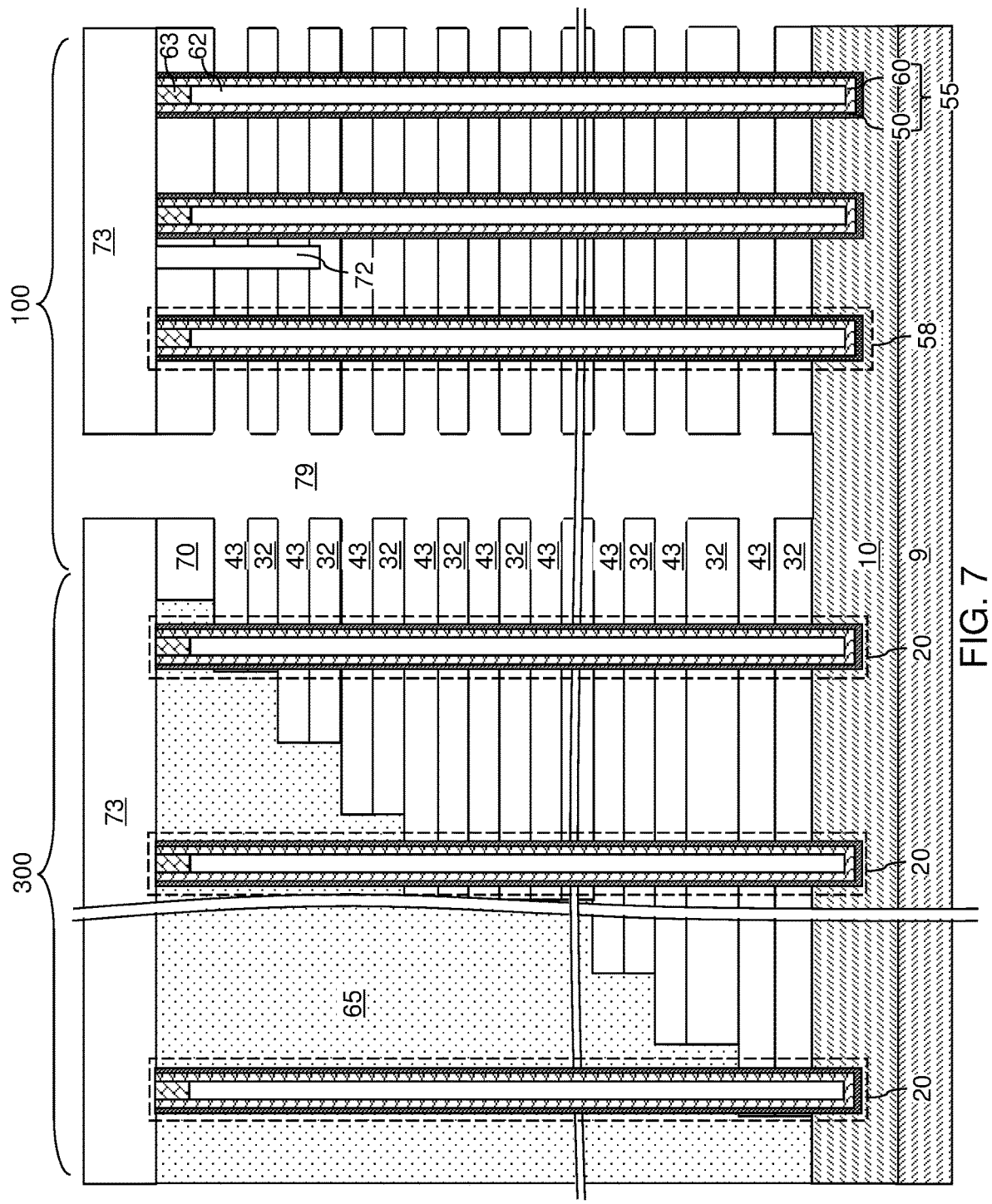
FIG. 7 is a schematic vertical cross-sectional view of the exemplary structure after formation of backside recesses according to an embodiment of the present disclosure.

Referring to FIG. 7, an etchant that selectively etches the second material of the sacrificial material layers 42 with respect to the first material of the insulating layers 32 can be introduced into the backside trenches 79, for example, using an etch process. Backside recesses 43 are formed in volumes from which the sacrificial material layers 42 are removed. The removal of the second material of the sacrificial material layers 42 can be selective to the first material of the insulating layers 32, the material of the stepped dielectric material portion 65, the semiconductor material of the semiconductor material layer 10, and the material of the outermost layer of the memory films 50. In one embodiment, the sacrificial material layers 42 can include silicon nitride, and the materials of the insulating layers 32 and the stepped dielectric material portion 65 can be selected from silicon oxide and dielectric metal oxides.

The etch process that removes the second material selective to the first material and the outermost layer of the memory films 50 can be a wet etch process using a wet etch solution, or can be a gas phase (dry) etch process in which the etchant is introduced in a vapor phase into the backside trenches 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials used in the art. The support pillar structure 20, the stepped dielectric material portion 65, and the memory stack structures 55 provide structural support while the backside recesses 43 are present within volumes previously occupied by the sacrificial material layers 42. In one embodiment, the memory array region 100 comprises an array of monolithic three-dimensional NAND strings having a plurality of device levels disposed above the semiconductor material layer 10. In this case, each backside recess 43 can define a space for receiving a respective word line of the array of monolithic three-dimensional NAND strings.

Figure 8:
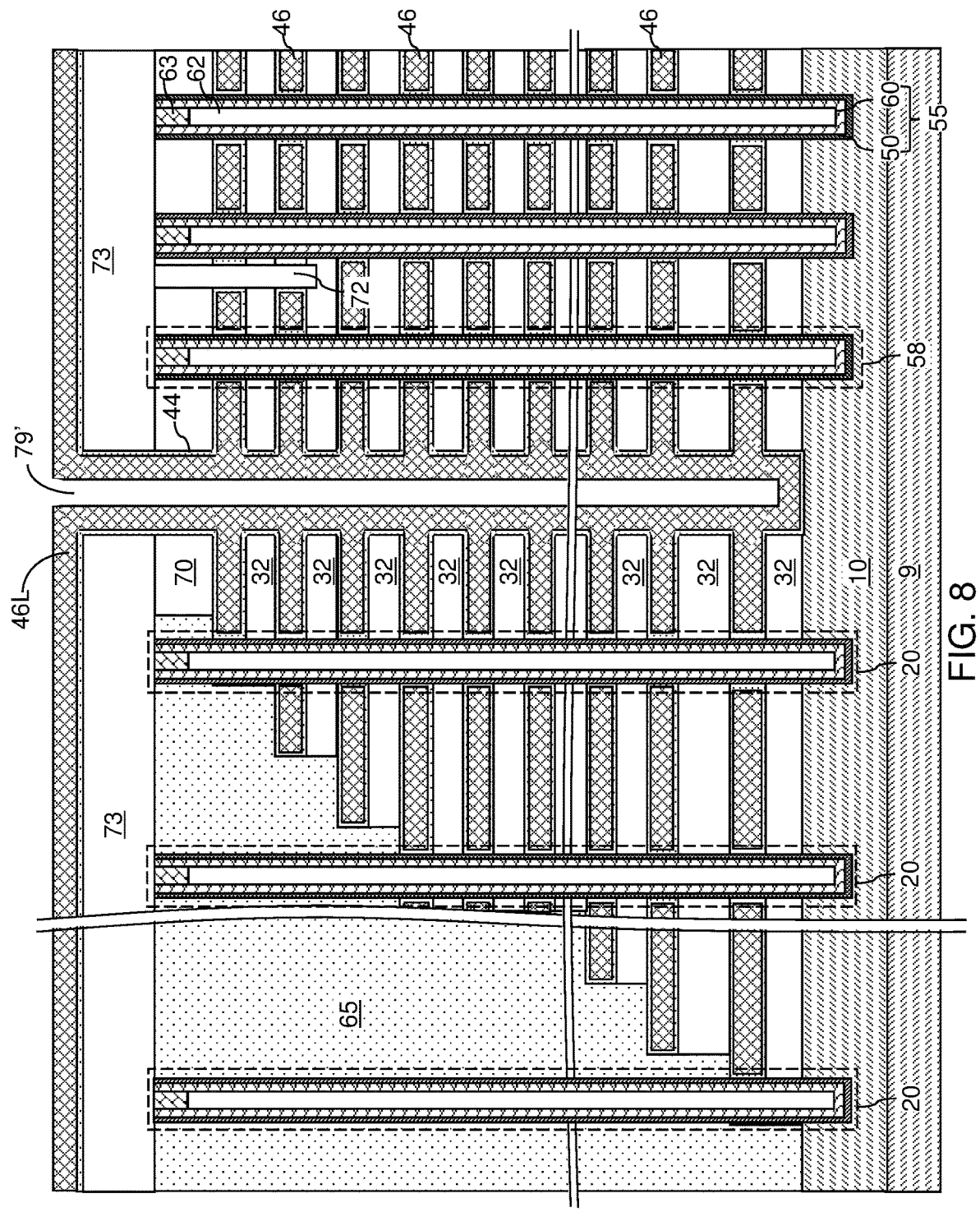
FIG. 8 is a schematic vertical cross-sectional view of the exemplary structure after formation of electrically conductive layers according to an embodiment of the present disclosure.

Referring to FIG. 8, a backside blocking dielectric layer 44 can be optionally formed. The backside blocking dielectric layer 44, if present, comprises a dielectric material that functions as a control gate dielectric for the control gates to be subsequently formed in the backside recesses 43. In case the blocking dielectric layer 52 is present within each memory opening, the backside blocking dielectric layer 44 is optional. In case the blocking dielectric layer 52 is omitted, the backside blocking dielectric layer 44 is present. In one embodiment, the backside blocking dielectric layer 44 can be formed by a conformal deposition process such as atomic layer deposition (ALD). The backside blocking dielectric layer 44 can consist essentially of aluminum oxide. The thickness of the backside blocking dielectric layer 44 can be in a range from 1 nm to 15 nm, such as 2 to 6 nm, although lesser and greater thicknesses can also be used.

At least one metallic material is deposited in the plurality of backside recesses 43, on the sidewalls of the at least one the backside trench 79, and over the top surface of the first connection-level dielectric layer 73. The at least one metallic material can include a conductive metal nitride material (such as TiN, TaN, or WN) and a metallic fill material (such as W, Co, Ru, Ti, and/or Ta). Each metallic material can be deposited by a conformal deposition method, which can be, for example, chemical vapor deposition (CVD), atomic layer deposition (ALD), electroless plating, electroplating, or a combination thereof.

A plurality of electrically conductive layers 46 can be formed in the plurality of backside recesses 43, and a continuous metallic material layer 46L can be formed on the sidewalls of each backside trench 79 and over the first connection-level dielectric layer 73. Each electrically conductive layer 46 includes a portion of the metallic barrier layer and a portion of the metallic fill material layer that are located between a vertically neighboring pair of dielectric material layers such as a pair of insulating layers 32. The continuous metallic material layer 46L includes a continuous portion of the metallic barrier layer and a continuous portion of the metallic fill material layer that are located in the backside trenches 79 or above the first connection-level dielectric layer 73. Each sacrificial material layer 42 can be replaced with an electrically conductive layer 46. A backside cavity 79' is present in the portion of each backside trench 79 that is not filled with the backside blocking dielectric layer 44 and the continuous metallic material layer 46L.

Figure 9A:
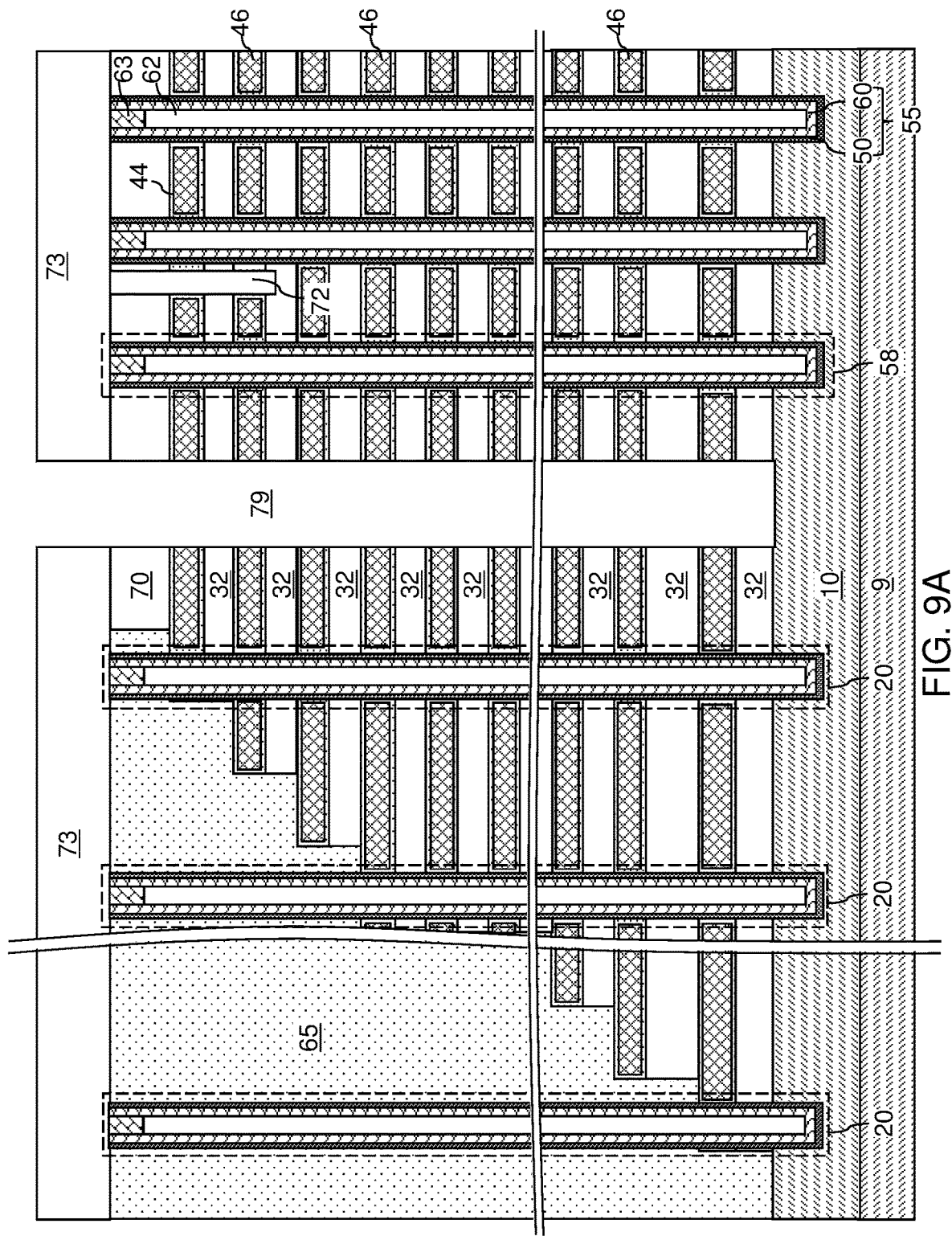
FIG. 9A is a schematic vertical cross-sectional view of the exemplary structure after removal of a deposited conductive material from within the backside trench according to an embodiment of the present disclosure.

Referring to FIGS. 9A and 9B, the deposited metallic material of the continuous electrically conductive material layer 46L is etched back from the sidewalls of each backside trench 79 and from above the first connection-level dielectric layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically connecting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices.

In one embodiment, the removal of the continuous electrically conductive material layer 46L can be selective to the material of the backside blocking dielectric layer 44. In this case, a horizontal portion of the backside blocking dielectric layer 44 can be present at the bottom of each backside trench 79. In another embodiment, the removal of the continuous electrically conductive material layer 46L may not be selective to the material of the backside blocking dielectric layer 44 or, the backside blocking dielectric layer 44 may not be used. A backside cavity 79' is present within each backside trench 79.

Figure 10:
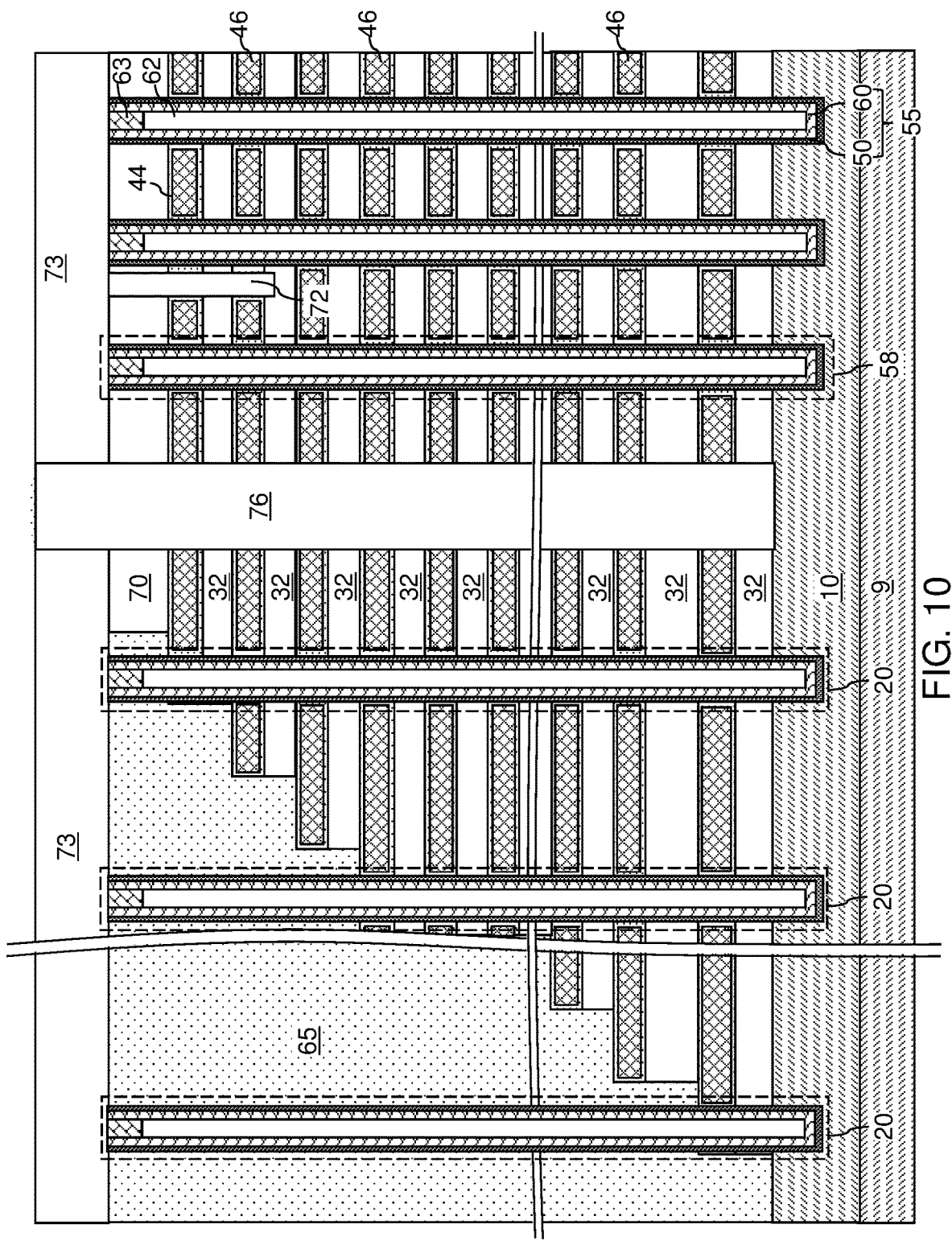
FIG. 10 is a schematic vertical cross-sectional view of the exemplary structure after formation of insulating wall structures according to an embodiment of the present disclosure.

Referring to FIG. 10, a dielectric wall structure 76 can be formed within each backside cavity 79' by depositing at least one dielectric material in the remaining unfilled volume (i.e., the backside cavity 79') of the backside trench 79. The at least one dielectric material can include silicon oxide, silicon nitride, a dielectric metal oxide, an organosilicate glass, or a combination thereof. In one embodiment, the insulating material layer can include silicon oxide. The at least one dielectric material can be deposited, for example, by low pressure chemical vapor deposition (LPCVD) or atomic layer deposition (ALD). Optionally, the at least one dielectric material can be planarized using the first connection-level dielectric layer 73 as a stopping layer. If chemical mechanical planarization (CMP) process is used, the first connection-level dielectric layer 73 can be used as a CMP stopping layer. Each remaining continuous portion of the at least one conductive material in the backside trenches 79 constitutes a dielectric wall structure 76. The dielectric wall structures 76 can be formed between each neighboring pair of alternating stacks (32, 46) of insulating layers 32 and electrically conductive layers.

Figure 11A:
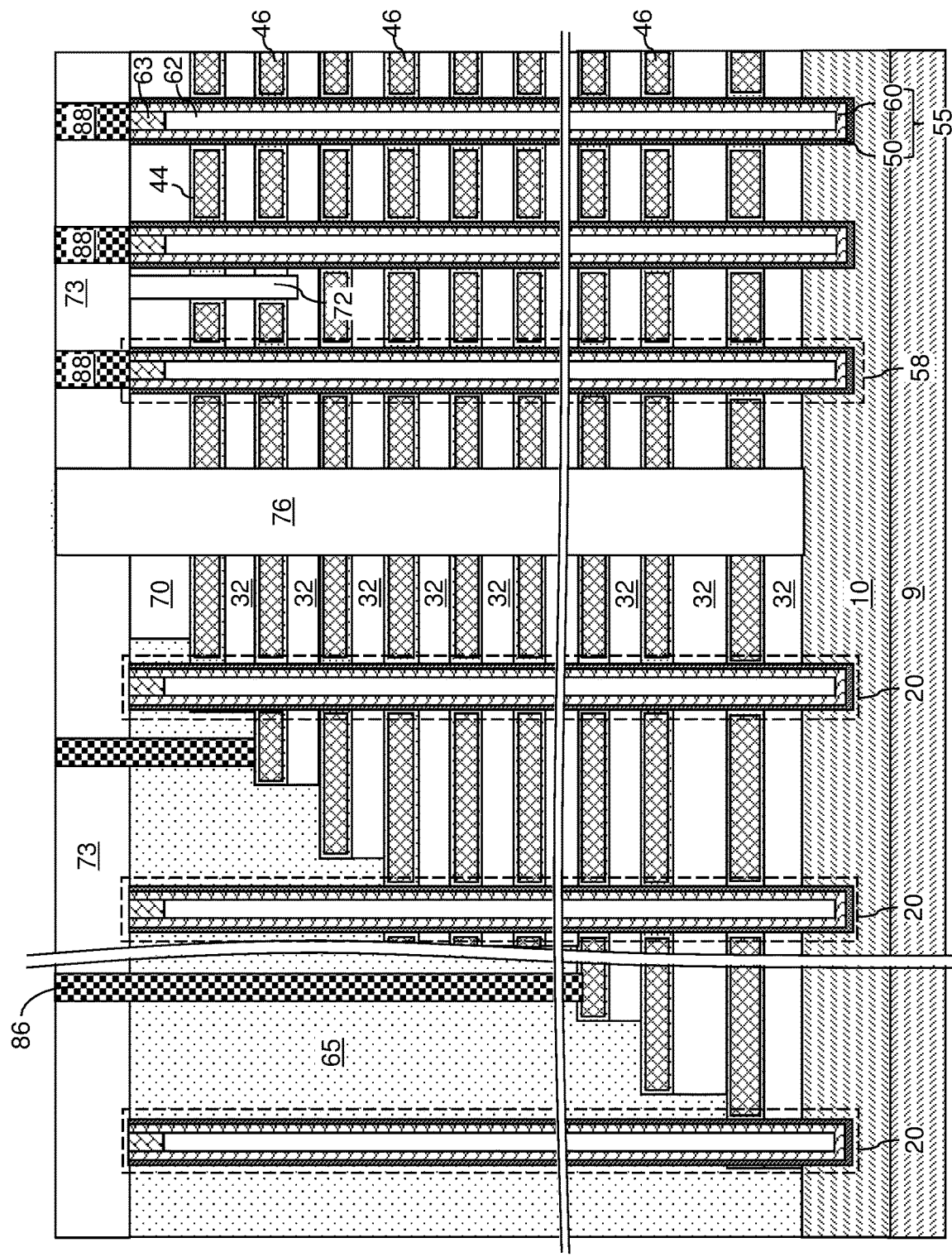
FIG. 11A is a schematic vertical cross-sectional view of the exemplary structure after formation of contact via structures according to an embodiment of the present disclosure.
Figure 11B:
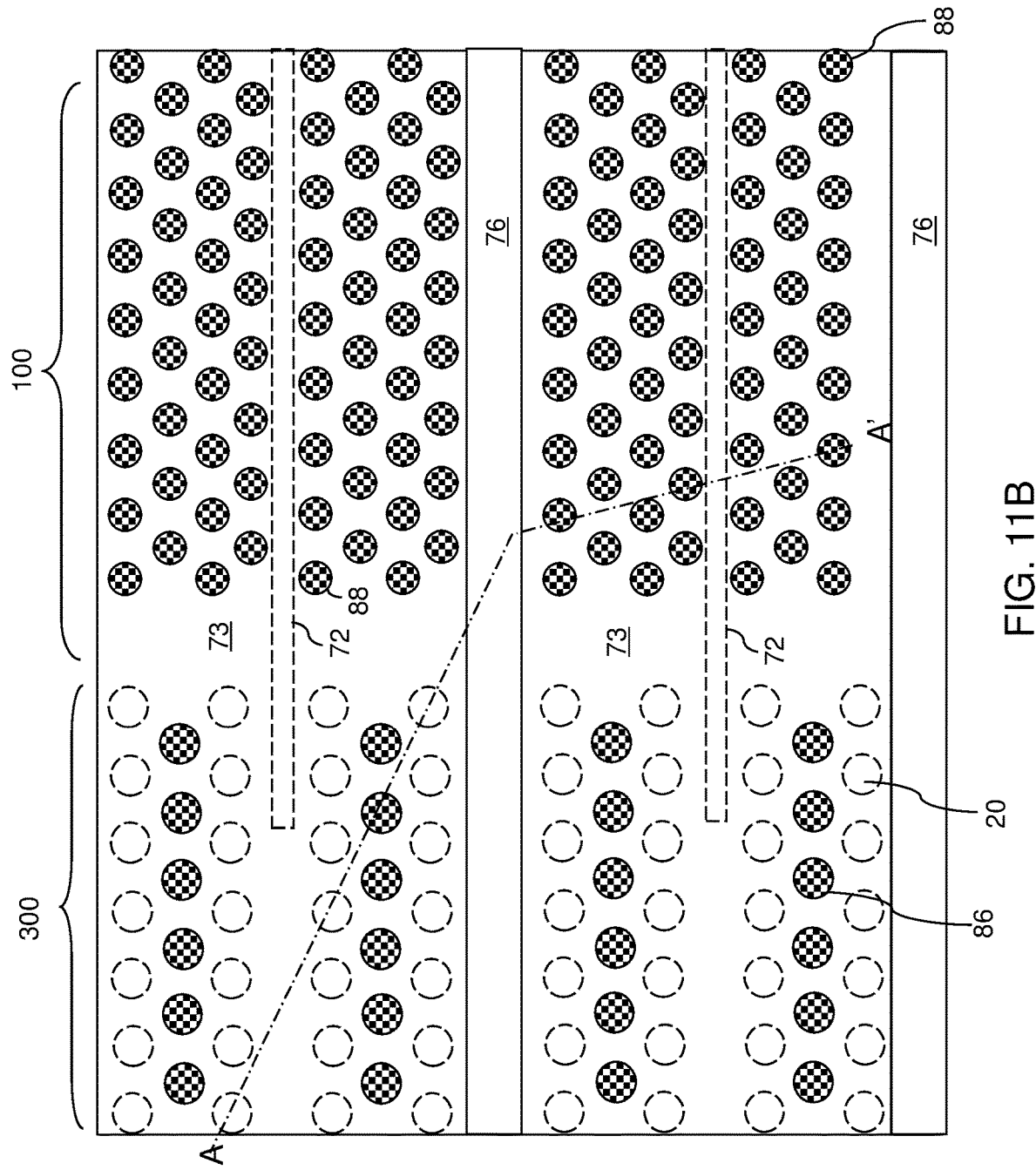
FIG. 11B is a top-down view of the exemplary structure of FIG. 12A. The vertical plane A-A' is the plane of the schematic vertical cross-sectional view of FIG. 12A.

Referring to FIGS. 11A and 11B, additional contact via structures (88, 86) can be formed through the first connection-level dielectric layer 73, and optionally through the stepped dielectric material portion 65. For example, drain contact via structures 88 can be formed through the first connection-level dielectric layer 73 on each drain region 63. Word line contact via structures 86 can be formed on the electrically conductive layers 46 through the first connection-level dielectric layer 73, and through the stepped dielectric material portion 65.

Generally, the exemplary structure can include a three-dimensional memory array including memory stack structures 55 vertically extending through an alternating stack of insulating layers 32 and electrically conductive layers 46 located over a first substrate (9, 10). Each of the memory stack structures 55 may comprise a respective vertical semiconductor channel 60 and a respective memory film 50, and a drain region 63 cam be disposed on a top end of each of the vertical semiconductor channels 60.

Figure 12B:
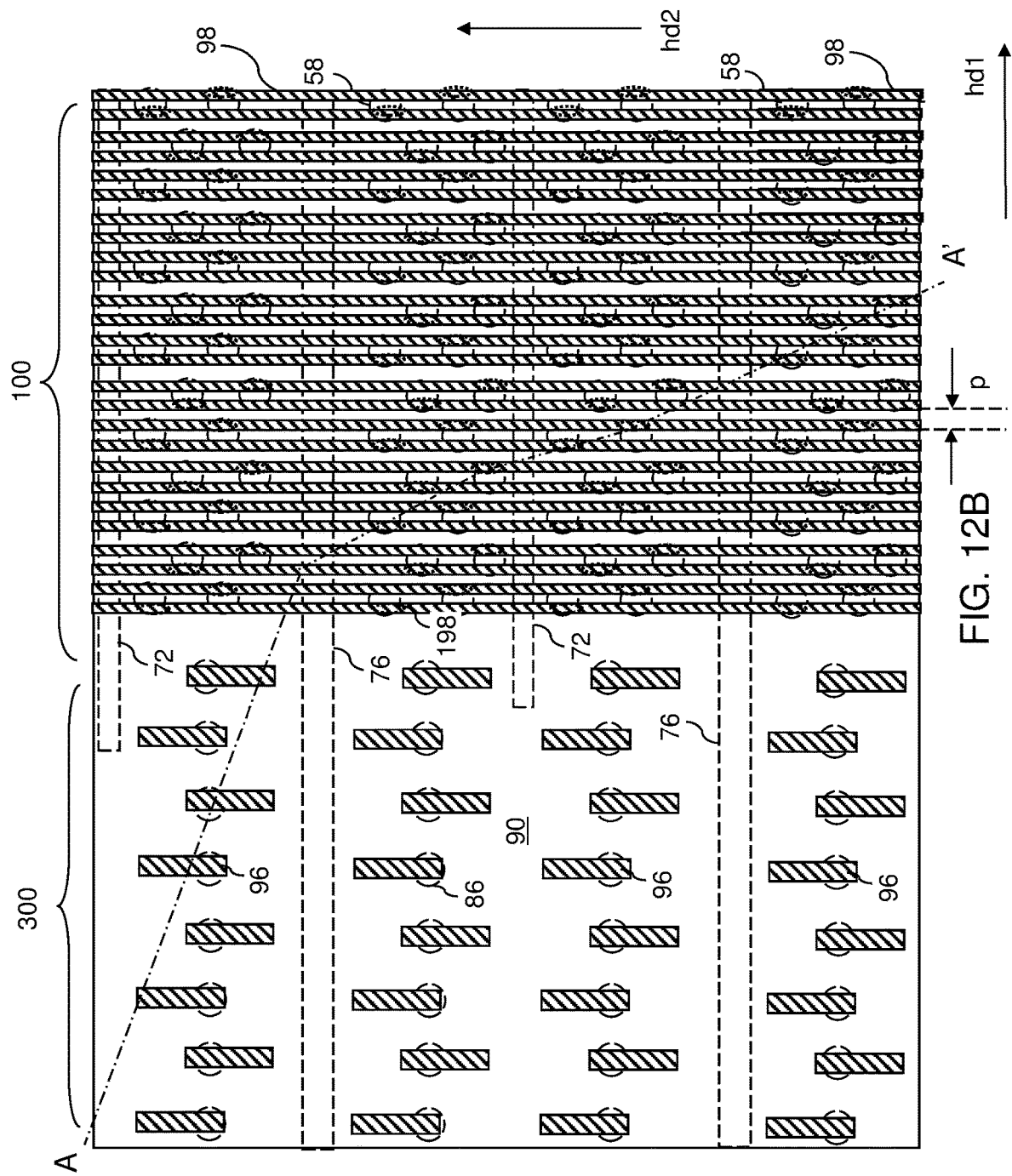
FIG. 12B is a partial see-through top-down view of the exemplary structure of FIG. 12A. The vertical plane A-A' is the plane of the schematic vertical cross-sectional view of FIG. 12A.

Referring to FIGS. 12A and 12B, a second connection-level dielectric layer 80 can be formed over the first connection-level dielectric layer 73. The second connection-level dielectric layer 80 includes a dielectric material such as silicon oxide, and can have a thickness in a range from 100 nm to 400 nm, although lesser and greater thicknesses may also be employed. Connection metal via structures (198, 196) can be formed through the connection-level dielectric layer 80. The connection metal via structures (198, 196) can include drain-connection via structures 198 that are formed on a top surface of a respective one of the drain contact via structures 88, and word-line-connection via structures 196 that are formed on a respective one of the word line contact via structures 86. In one embodiment, the drain-connection via structures 198 can be elongated along the second horizontal direction hd2, and can have a width that is less than a periodic pitch p along the first horizontal direction hd1 of the bit lines to be subsequently formed to avoid electrically shorting adjacent pairs of bit lines.

Generally, at least one connection-level dielectric layer (73, 80) can be formed over the alternating stack (32, 46) of the insulating layers 32 and the electrically conductive layers 46. The metal via structures that extend through the first connection-level dielectric layer 73 and the second connection-level dielectric layer 80 are herein referred to as conductive via structures (88, 86, 198, 196). A subset of the metal via structures, such as a combination of a drain contact via structure 88 and a drain-connection via structure 198, provides a vertical electrically conductive path for each drain region 63. The conductive via structures (88, 86, 198, 196) are embedded within at least one connection-level dielectric layer (70, 80).

A bit-line-level dielectric layer 90 over the at least one connection-level dielectric layer (73, 80). The bit-line-level dielectric layer 90 includes a dielectric material such as silicon oxide, and can have a thickness in a range from 100 nm to 200 nm, although lesser and greater thicknesses may also be employed. A photoresist layer (not shown) can be applied over the bit-line-level dielectric layer 90, and can be lithographically patterned to form various opening that overlie the connection metal via structures (198, 196). The pattern of the openings in the photoresist layer in the memory array region 100 can include a line and space pattern having a periodic pitch p along the first horizontal direction hd1 and laterally extending along the second horizontal direction hd2. The pattern of openings in the photoresist layer in each staircase region 300 may be suitably selected to overlie a respective one of the word-line-connection via structures 196 and to enable electrical connection paths for the word lines, which are embodied as the electrically conductive layers 46.

An anisotropic etch process can be performed to transfer the pattern in the photoresist layer through the bit-line-level dielectric layer 90. Unmasked portions of the bit-line-level dielectric layer 90 are etched by the anisotropic etch process to form various cavities. The cavities formed in the memory array region 100 include line trenches laterally extending along the second horizontal direction (e.g., bit line direction) hd2 through the bit-line-level dielectric layer 90. Top surfaces of a respective subset of the conductive via structures (such as top surfaces of a respective subset of the drain-connection via structures 198) are physically exposed underneath each of the line trenches. The bit lines can be formed with the periodic pitch p along the first horizontal direction (e.g., word line direction) hd1. Various line trenches can be formed in each staircase region 300. The photoresist layer can be removed, for example, by ashing.

At least one conductive material can be deposited in the line trenches and other trenches within the bit-line-level dielectric layer 90. The at least one conductive material can include, for example, a conductive metallic barrier material (such as TiN, TaN, and/or WN) and a conductive metallic fill material (such as W, Cu, Co, Ru, Mo, another elemental metal, and/or an alloy thereof). The at least one conductive material can be deposited by physical vapor deposition, chemical vapor deposition, electroplating, and/or electroless plating. Excess portions of the at least one conductive material can be removed from above the horizontal plane including the top surface of the bit-line-level dielectric layer 90 by a planarization process such as a chemical mechanical planarization process. Remaining portions of the at least one conductive material filling the line trenches in the memory array region 100 comprise bit lines 98. Remaining portions of the at least one conductive material filling additional trenches in the bit-line-level dielectric layer 90 comprise word-line-connection metal lines 96 and additional metal lines. The word-line-connection metal lines 96 may contact a respective one of the word-line-connection via structures 196. Generally, the bit lines 98 can be formed by depositing at least one conductive material in the line trenches and planarizing the at least one conductive material. Top surfaces of the bit lines 98 can be formed within the horizontal plane including the top surface of the bit-line-level dielectric layer 90.

In an alternative embodiment, instead of forming the bit lines 98 and the word-line-connection metal lines 96 by the above damascene process, the bit lines 98 and the word-line-connection metal lines 96 may be deposited and patterned over the at least one connection-level dielectric layer (73, 80). The bit-line-level dielectric layer 90 can then be formed over and in the spaces between the bit lines 98 and the word-line-connection metal lines 96. The bit-line-level dielectric layer 90 can then be planarized by CMP or etch back such that the top surface of the bit-line-level dielectric layer 90 co-planar with the top surfaces of the bit lines 98 and the word-line-connection metal lines 96.

The bit lines 98 are located on physically exposed top surfaces of a respective subset of the conductive via structures (such as top surfaces of a respective subset of the drain-connection via structures 198). The bit lines 98 have a periodic pitch p along the first horizontal direction hd1, and laterally extend along the second horizontal direction hd2. Each drain region 63 can be electrically connected to a respective one of the bit lines 98 through a respective electrically conductive path including a set of at least one conductive via structure (which may be, for example, a drain connect via structure 88 and a drain-connection via structure 198). The memory opening fill structures 58 containing the memory stack structures 55 can be arranged in rows that extend along the first horizontal direction hd1, and the bit lines 98 laterally extend along the second horizontal direction hd2 and can be electrically connected to drain regions 63 located in different rows of the memory stack structures 55.

Referring to FIGS. 13A-13C and according to an aspect of the present disclosure, patterned mask material portions 97 can be formed over discrete portions of the bit lines 98. The patterned mask material portions 97 may be patterned portions of a photoresist layer that is patterned directly, or may be patterned portions of a dielectric hard mask layer that is deposited and subsequently patterned by applying and patterning a photoresist layer thereabove and transferring the pattern in the photoresist layer through the dielectric hard mask layer by a anisotropic etch process. While the present disclosure is described employing an embodiment in which the patterned mask material portions 97 are patterned photoresist material portions, embodiments are expressly contemplated herein in which the patterned mask material portions 97 are formed as dielectric hard mask material portions that may be subsequently removed, or may be incorporated into a final device structure.

In case the patterned mask material portions 97 comprise patterned portions of a photoresist layer, the photoresist layer can be is applied over the bit lines 98 and can be patterned by lithographic exposure and development. Each patterned mask material portion 97 can optionally cover a respective portion of the bit-line-level dielectric layer 90 that is adjacent to a masked portion of a respective bit line 98. In one embodiment, each patterned portion of the photoresist layer (which is a patterned mask material portion 97) can have a width along the first horizontal direction hd1 that is not greater than the periodic pitch p of the bit lines 98 along the first horizontal direction hd1.

In one embodiment, a first area of each of the bit lines 98 can be masked with a respective patterned mask material portion 97 without covering a second area of each of the bit lines 98. In one embodiment, a first area of each bit line 98 is covered with a patterned mask material portion 97, and a second area of each bit line 98 is that is the complement of the first area is not covered with any patterned mask material portion 97. In this case, only a single area of each bit line 98 may be covered with a patterned mask material portion 97. In one embodiment, each patterned mask material portion 97 may have a rectangular horizontal cross-sectional shape or a substantially rectangular horizontal cross-sectional shape that may have rounded corners. In one embodiment, each patterned mask material portion 97 can have a width along the first horizontal direction hd1 that is not greater than the periodic pitch p of the bit lines 98, and can have a length along the second horizontal direction hd2 that is at least three times the width of the patterned mask material portion 97.

The patterned mask material portions 97 can be arranged such that a sufficient lateral distance is provided between each neighboring pair of patterned mask material portions 97 to enable subsequent formation of first bonding pads without electrical shorts between the first bonding pads. In one embodiment, patterned mask material portions 97 may be arranged such that each pair of patterned mask material portions 97 is laterally spaced apart along the first horizontal direction hd1 at least by a maximum lateral dimension of each first bonding pad to be subsequently formed along the first horizontal direction hd1, and each pair of patterned mask material portions 97 is laterally spaced apart along the second horizontal direction hd2 at least by a maximum lateral dimension of each first bonding pad along the second horizontal direction hd2. For example, the patterned mask material portions 97 may be laterally spaced apart among one another along the first horizontal direction hd1 at least by 500 nm, and/or at least by 1 micron, and/or at least by 2 microns, and along the second horizontal direction hd2 at least by 50 nm, and/or at least by 1 micron, and/or at least by 2 microns.

Referring to FIGS. 14A-14C, portions of the bit lines 98 that are not masked by the patterned mask material portions 97 can be vertically recessed by performing an anisotropic etch process. The anisotropic etch process etches the at least one conductive material of the unmasked portions of the bit lines 98 outside the areas of the patterned mask material portions 97. The vertical recess distance may be in a range from 5% to 75%, such as from 10% to 50%, and/or from 15% to 30%, of the height of each bit line 98 as formed at the processing steps of FIGS. 12A and 12B. Unrecessed portions of each bit line 98 protrude above the recessed portions of the bit lines 98, and are herein referred to as bump portions 98P of the bit lines 98. The recessed portions of the bit lines 98 can have recessed horizontal top surfaces located within a same horizontal plane. Each portion of the bit lines 98 located between the horizontal plane including the recessed horizontal top surfaces of the bit lines 98 and a horizontal plane including the bottom surfaces of the bit lines 98 is herein referred to as a line portion 98L of a respective bit line 98.

Each bit line 98 that includes a recessed portion includes a combination of a line portion 98L and a bump portion 98P, and is hereafter referred to as a bump-containing bit line 98. At least a subset of, and/or each of, the bit lines 98 as formed at the processing steps of FIGS. 12A and 12B can be converted into bump-containing bit lines 98. A subset of or all of the bit lines 98 can be converted into bump-containing bit lines 98. Each of the bump-containing bit lines 98 comprises a line portion 98L having a substantially uniform height between a planar bottom surface and a planar top surface and a bump portion 98P that protrudes upward from a horizontal plane including the planar top surface of the line portion by a bump height.

Portions of the bit-line-level dielectric layer 90 that are covered by the patterned mask material portions 97 have a respective top surface that is coplanar with top surfaces of the bump portions 98P of the bit lines 98. In one embodiment, unmasked portions of the bit-line-level dielectric layer 90 can be collaterally vertically recessed at an etch rate that is not greater than the etch rate of the at least one conductive material of the bit lines 98. In this case, portions of the bit-line-level dielectric layer 90 that are not covered by the patterned mask material portions 97 can be vertically recessed from the horizontal plane including the top surfaces of the bump portions 98P of the bit lines 98. In one embodiment, the bit-line-level dielectric layer 90 can have top surface segments that are adjoined to a top surface of a respective bump portion 98P of a bump-containing bit line 98, and can have recessed horizontal surface segments located within a horizontal plane located between the horizontal plane including the top surfaces of the line portions 98L of the bump-containing bit lines 98 and a horizontal plane including the top surfaces of the bump portions 98P of the bump-containing bit lines 98.

In one embodiment, each of the bump portions 98P comprises a pair of lengthwise sidewall segments that are parallel to the second horizontal direction hd2 and have a same width as a width of the line portion 98L of each of the bump-containing bit lines 98. In one embodiment, each of the bump portions 98P comprises a pair of widthwise sidewall segments that are not parallel to the second horizontal direction hd2 and adjoined to vertical edges of the pair of lengthwise sidewall segments and adjoined to horizontal edges of a planar top surface of a line portion 98L of a respective one of the bump-containing bit lines 98. In one embodiment, the pair of widthwise sidewall segments is parallel to the first horizontal direction hd1 and has a same width along the first horizontal direction hd1 as each of the line portions 98L of the bump-containing bit lines 98.

All bit lines 98 as formed at the processing steps of FIGS. 12A and 12B may be converted into bump-containing bit lines 98, or a subset of the bit lines 98 as formed at the processing steps of FIGS. 12A and 12B may be converted into bump-containing bit lines 98. Generally, a bit line 98 can extend over the drain regions 63, and can be electrically connected to a respective subset of the drain regions 63 by a respective set of at least one conductive via structure (such as a combination of a drain contact via structure 88 and a drain-connection via structure 198), and can have a periodic pitch p along a first horizontal direction hd1, and can laterally extend along a second horizontal direction hd2 that is perpendicular to the first horizontal direction hd1. At least of a subset of, and/or all of, the bit lines 98 comprise bump-containing bit lines 98. Each of the bump-containing bit lines 98 comprises a line portion 98L having a substantially uniform height between a planar bottom surface and a planar top surface and a bump portion 98P that protrudes upward from a horizontal plane including the planar top surface of the line portion by a bump height.

In one embodiment, a horizontal cross-sectional shape of each bump portion 98P of the bump-containing bit lines 98 can have a length-to-width ratio that is greater than 3, such as 3.5 to 10. In one embodiment, the length-to-width ratio may be greater than 4, and/or greater than 5, and/or greater than 6. The length-to-width ratio is the ratio of a lateral extent of a bump portion 98P along the second horizontal direction hd2 to a lateral extent of the bump portion 98P along the first horizontal direction hd1.

In one embodiment, the bump portions 98P of the bump-containing bit lines 98 can be arranged such that each pair of bump portions 98P is laterally spaced apart along the first horizontal direction hd1 at least by a maximum lateral dimension of each first bonding pad to be subsequently formed along the first horizontal direction hd1, and each pair of bump portions 98P can be laterally spaced apart along the second horizontal direction hd2 at least by a maximum lateral dimension of each first bonding pad to be subsequently formed along the second horizontal direction hd2. The patterned mask material portions 97 may be subsequently removed, for example, by ashing or by dissolution in a selective etchant that etches the material of the patterned mask material portions 97 selective to the materials of the bump-containing bit lines 98 and the bit-line-level dielectric layer 90. Alternatively, the patterned mask material portions 97 may remain if the patterned mask material portions 97 include a dielectric hard mask material.

Referring to FIGS. 15A-15C, a dielectric material layer can be deposited over the bit-line-level dielectric layer 90 and the bump-containing bit lines 98. Outlines of the bump-containing bit lines 98 and the bump portions 98P are illustrated in dotted lines in the partial see-through top-down view of FIG. 15A. The dielectric material layer deposited at this processing step is herein referred to as a via-level dielectric layer 110. The via-level dielectric layer 110 includes a dielectric material such as silicon carbonitride undoped silicate glass, a doped silicate glass, or organosilicate glass. Optionally, the via-level dielectric layer 110 may include a diffusion barrier dielectric liner (such as a silicon nitride liner) and/or an etch stop liner (such as a silicon carbonitride (i.e., silicon carbide nitride) liner, a dielectric metal oxide liner, and/or a silicon oxynitride liner). The via-level dielectric layer 110 may be formed by chemical vapor deposition or by spin-coating. The via-level dielectric layer 110 may fill each recess region overlying the line portions 98L of the bump-containing bit lines 98 or overlying recessed portions of the bit-line-level dielectric layer 90. The via-level dielectric layer 110 may have a planar top surface. The thickness of the via-level dielectric layer 110, as measured between the topmost surface segments of the bit-line-level dielectric layer 90 located within the same horizontal plane as the top surfaces of the bump portions 98P of the bit lines 98, can be in a range from 100 nm to 600 nm, such as from 150 nm to 300 nm, although lesser and greater thicknesses may also be employed.

Figure 16B:
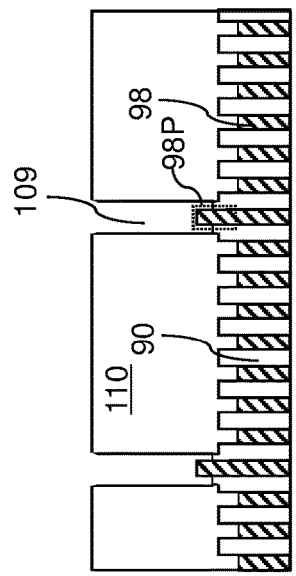
FIG. 16B is a vertical cross-sectional view of the exemplary structure along the vertical plane B-B' of FIG. 16A.
Figure 16C:
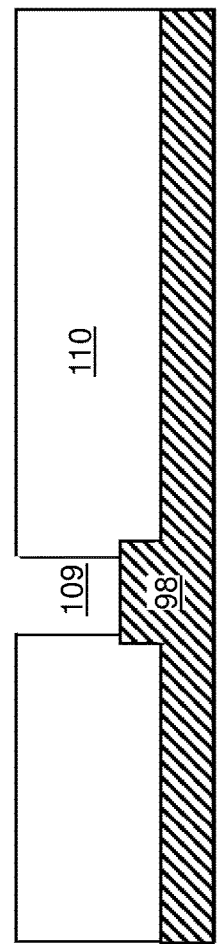
FIG. 16C is a vertical cross-sectional view of the exemplary structure along the vertical plane C-C' of FIG. 16A.
Figure 16A:
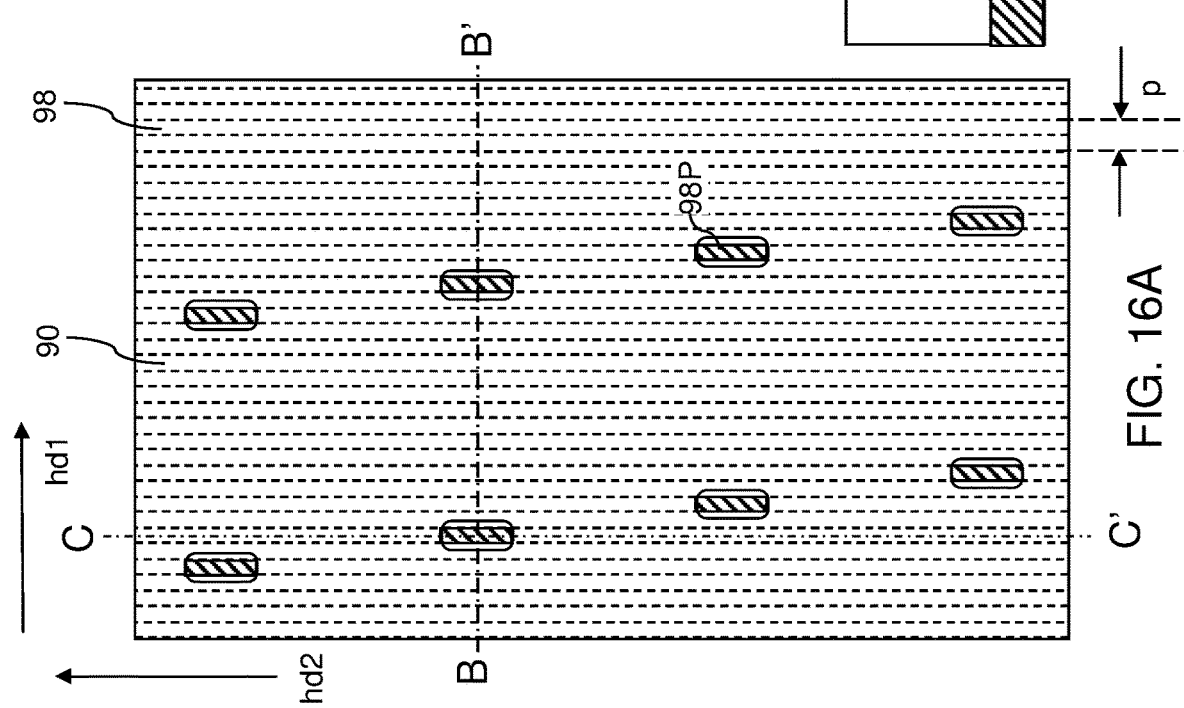
FIG. 16A is a top-down view of an array region of the exemplary structure after formation of via cavities through the via-level dielectric layer according to an embodiment of the present disclosure.

Referring to FIGS. 16A-16C, a photoresist layer (not shown) can be applied over the via-level dielectric layer 110, and can be lithographically patterned to form discrete openings therethrough. Each opening in the photoresist layer has an areal overlap with a respective one of the bump portion 98P of a respective bump-containing bit line 98. In one embodiment, the area of an opening in the photoresist layer may have a width along the first horizontal direction hd1 that is not greater than the periodic pitch p of the bump-containing bit lines 98 along the first horizontal direction to avoid electrically shorting a pair of bump-containing bit lines 98 through a metal via structure to be subsequently formed. The lateral extent of each opening in the photoresist layer along the second horizontal direction hd2 may be the same as, may be less than, or may be greater than, the lateral extent of an underlying bump portion 98P. In one embodiment, the lateral extent of an opening in the photoresist layer along the second horizontal direction hd2 may be less than the lateral extent of an underlying bump portion 98P, and edges of a horizontal cross-sectional shape of the opening in the photoresist layer that extend along the first horizontal direction hd1 may intersect lengthwise sidewall segments of an underlying bump portion 98P in a plan view, i.e., a top-down view. Alternatively, the lateral extent of an opening in the photoresist layer along the second horizontal direction hd2 may be greater than the lateral extent of an underlying bump portion 98P, and the entire periphery of a horizontal cross-sectional shape of the opening in the photoresist layer may be located outside a periphery of an underlying bump portion 98P in a plan view.

An anisotropic etch process can be performed to transfer that pattern of the openings in the photoresist layer through the via-level dielectric layer 110. The anisotropic etch process etches the dielectric materials of the via-level dielectric layer 110 and the bit-line-level dielectric layer 90 selective to the at least one conductive material of the bump-containing bit lines 98. Via cavities 109 extending through the via-level dielectric layer 110 can be formed by the anisotropic etch process. According to an aspect of the present disclosure, the depth of the via cavities 109 can be selected such that the bottom surfaces of the via cavities 109 are formed above the horizontal plane including the top surfaces of the line portions 98L of the bump-containing bit lines 98, and are formed below the horizontal plane including the top surfaces of the bump portions 98P of the bump-containing bit lines 98.

A top surface and optionally upper portions of a pair of lengthwise sidewall segments of a respective bump portion 98P can be physically exposed underneath each of the via cavities 109. In one embodiment, upper portions of a pair of widthwise sidewall segments of the respective bump portion 98P may be physically exposed underneath each of the via cavities 109. Alternatively, the lateral dimension of a via cavity 109 along the second horizontal direction hd2 may be less than the length of the underlying bump portion 98P, and the widthwise sidewall segments of the respective bump portion 98P that extend along the first horizontal direction hd1 may be covered with the via-level dielectric layer 110 after formation of the via cavity 109. Yet alternatively, the lateral dimension of a via cavity 109 along the second horizontal direction hd2 may be about the same as the length of the underlying bump portion 98P, and an overlay variation in the lithographic patterning process employed to pattern the openings in the photoresist layer may have a non-zero overlay shift along the second horizontal direction hd2 such that one of the widthwise sidewall segments of the respective bump portion 98P that extend along the first horizontal direction hd1 is covered with the via-level dielectric layer 110 after formation of the via cavity 109, while another of the widthwise sidewall segments of the respective bump portion 98P is physically exposed to the via cavity 109. The photoresist layer may be subsequently removed, for example, by ashing.

Referring to FIGS. 17A-17C, at least one conductive material can be deposited in the via cavities 109 within the via-level dielectric layer 110. The at least one conductive material can include, for example, a conductive metallic barrier material (such as TiN, TaN, and/or WN) and a conductive metallic fill material (such as W, Cu, Co, Ru, Mo, another elemental metal, and/or an alloy thereof). The at least one conductive material can be deposited by physical vapor deposition, chemical vapor deposition, electroplating, and/or electroless plating. Excess portions of the at least one conductive material can be removed from above the horizontal plane including the top surface of the via-level dielectric layer 110 by a planarization process such as a chemical mechanical planarization process. Remaining portions of the at least one conductive material filling the via cavities 109 in the memory array region 100 comprise bit line contact via structures 108. Generally, the bit line contact via structures 108 can be formed by depositing at least one conductive material in the via cavities 109 and planarizing the at least one conductive material. Top surfaces of the bit line contact via structures 108 can be formed within the horizontal plane including the top surface of the via-level dielectric layer 110.

Each bit line contact via structure 108 can be formed on a top surface and upper portions of a pair of lengthwise sidewall segments of a bump portion 98P of a respective bump-containing bit line 98. In one embodiment, a bit line contact via structure 108 may contact upper portions of a pair of widthwise sidewall segments of the respective bump portion 98P. Alternatively, the lateral dimension of a via cavity 109 along the second horizontal direction hd2 may be less than the length of the underlying bump portion 98P, and the widthwise sidewall segments of the respective bump portion 98P that extend along the first horizontal direction hd1 may be covered with the via-level dielectric layer 110. In this case, a bit line contact via structure 108 contacts a top surface and upper portions of a pair of widthwise sidewall segments of the respective bump portion 98P, and does not contact a pair of widthwise sidewall segments of the respective bump portion 98P. Yet alternatively, the lateral dimension of a via cavity 109 along the second horizontal direction hd2 may be about the same as the length of the underlying bump portion 98P, and an overlay variation in the lithographic patterning process employed to pattern the openings in the photoresist layer may have a non-zero overlay shift along the second horizontal direction hd2 such that one of the widthwise sidewall segments of the respective bump portion 98P that extend along the first horizontal direction hd1 is covered with the via-level dielectric layer 110, while another of the widthwise sidewall segments of the respective bump portion 98P contacts a respective bit line contact via structure 108. The lengthwise sidewall segments of the bump portions 98P are parallel to the second horizontal direction hd2, and the widthwise sidewall segments of the bump portions 98P are not parallel to the second horizontal direction hd2.

Generally, the bit line contact via structures 108 can be formed on a respective one of the bump portions 98P by depositing at least one conductive material in the via cavities 109. The bit line contact via structures 108 overlie the bit lines 98, and contact a bump portion of a respective one of the bump-containing bit lines 98. In one embodiment, each of the bit line contact via structures 108 can be laterally elongated along the second horizontal direction hd2, and can have a width along the first horizontal direction hd1 that is not greater than the periodic pitch p of the bit lines 98, and has a length along the second horizontal direction hd2 that is at least twice the width, which may be at least three times, and/or at least four times, and/or at least six times, the width. The bottom surfaces of the bit line contact via structures 108 are formed above the horizontal plane including the top surfaces of the line portions 98L of the bump-containing bit lines 98. Thus, the bit line contact via structures 108 may contact a top surface and upper portions of lengthwise sidewall segments of the respective one of the bump-containing bit lines 98, and does not contact a line portion 98L of the respective one of the bump-containing bit lines 98.

Referring to FIGS. 18A-18C, a dielectric material layer can be deposited over the via-level dielectric layer 110 and the bit line contact via structures 108. The dielectric material layer deposited at this processing step is herein referred to as a first pad-level dielectric layer 120. The first pad-level dielectric layer 120 includes a dielectric material such as undoped silicate glass, a doped silicate glass, or organosilicate glass. Optionally, the first pad-level dielectric layer 120 may include a diffusion barrier dielectric liner (such as a silicon nitride liner) and/or an etch stop liner (such as a silicon carbide nitride liner, a dielectric metal oxide liner, and/or a silicon oxynitride liner). The first pad-level dielectric layer 120 may be formed by chemical vapor deposition or by spin-coating. The first pad-level dielectric layer 120 may have a planar top surface. The thickness of the first pad-level dielectric layer 120 can be in a range from 300 nm to 3 microns, such as from 600 nm to 2 microns, although lesser and greater thicknesses may also be employed.

A photoresist layer (not shown) can be applied over the first pad-level dielectric layer 120, and can be lithographically patterned to form discrete openings therethrough. Each opening in the photoresist layer has a pattern of a bonding pad, and can have an areal overlap with an underlying metal via structure embedded within the via-level dielectric layer 110 such as the bit line contact via structure 108. In one embodiment, each opening in the photoresist layer may have a rectangular horizontal cross-sectional shape or a shape of a rounded rectangle, and may have a lateral dimension along the first horizontal direction hd1 in a range from 300 nm to 10 microns, and a lateral dimension along the second horizontal direction hd2 in a range from 300 nm to 10 microns.

An anisotropic etch process can be performed to transfer that pattern of the openings in the photoresist layer through the first pad-level dielectric layer 120. The anisotropic etch process etches the dielectric materials of the first pad-level dielectric layer 120 selective to the at least one conductive material of the bit line contact via structures 108. Pad cavities extending through the first pad-level dielectric layer 120 can be formed by the anisotropic etch process. The photoresist layer can be subsequently removed, for example, by ashing.

At least one conductive material can be deposited in the pad cavities within the first pad-level dielectric layer 120. The at least one conductive material can include, for example, a conductive metallic barrier material (such as TiN, TaN, and/or WN) and a conductive metallic fill material (such as Cu, Co, Ru, Mo, W, another elemental metal, and/or an alloy thereof). The at least one conductive material can be deposited by physical vapor deposition, chemical vapor deposition, electroplating, and/or electroless plating. Excess portions of the at least one conductive material can be removed from above the horizontal plane including the top surface of the first pad-level dielectric layer by a planarization process such as a chemical mechanical planarization process. Remaining portions of the at least one conductive material filling the pad cavities comprise first bonding pads 118. Generally, the first bonding pads 118 can be formed in the first pad-level dielectric layer 120 directly on a top surface of a respective one of the bit line contact via structures 108.

In one embodiment, the first bonding pads 118 may have the same shape. In this case, the maximum lateral dimension of each first bonding pad 118 along the first horizontal direction hd1 can be the same. Further, the maximum direction of each first bonding pad 118 along the second horizontal direction hd2 can be the same. In one embodiment, the bump portions 98P of the bump-containing bit lines 98 can be arranged such that each pair of bump portions 98P is laterally spaced apart along the first horizontal direction hd1 at least by a maximum lateral dimension of each first bonding pad along the first horizontal direction hd1, and each pair of bump portions 98P is laterally spaced apart along the second horizontal direction hd2 at least by a maximum lateral dimension of each first bonding pad along the second horizontal direction hd2.

The exemplary structure can be diced along the dicing channels, and first semiconductor dies can be provided. Each first semiconductor die can include at least one memory array region 100 and at least one staircase region 300. In one embodiment, the first semiconductor die comprises first bonding pads 118 embedded in a first pad-level dielectric layer 120, contacting a top surface of a respective one of the bit line contact via structures 108, and having a same horizontal cross-sectional shape. Each first semiconductor die can include a memory die including a three-dimensional memory device and including each of the structural components in the exemplary structure described above.

Referring to FIGS. 19A-19C, a first alternative configuration of the exemplary structure is illustrated after formation of a via-level dielectric layer 110 according to an embodiment of the present disclosure. In this configuration, unmasked portions of the bit-line-level dielectric layer 90 may be collaterally etched at the same rate as the at least one conductive material in the bit lines 98 during vertical recessing of the unmasked portions of the bit lines. The recessed planar surfaces of the bit-line-level dielectric layer 90 may be planar with the top surfaces of the line portions 98L of the bump-containing bit lines 98.

Figure 20B:
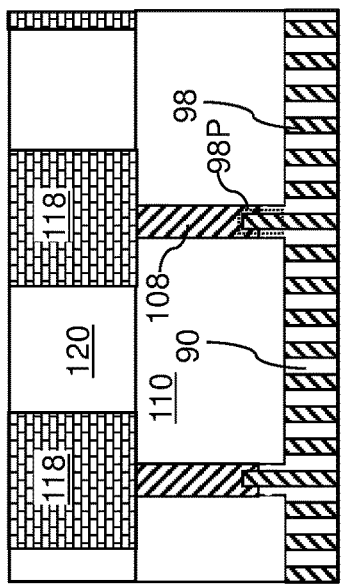
FIG. 20B is a vertical cross-sectional view of the exemplary structure along the vertical plane B-B' of FIG. 20A.
Figure 20C:
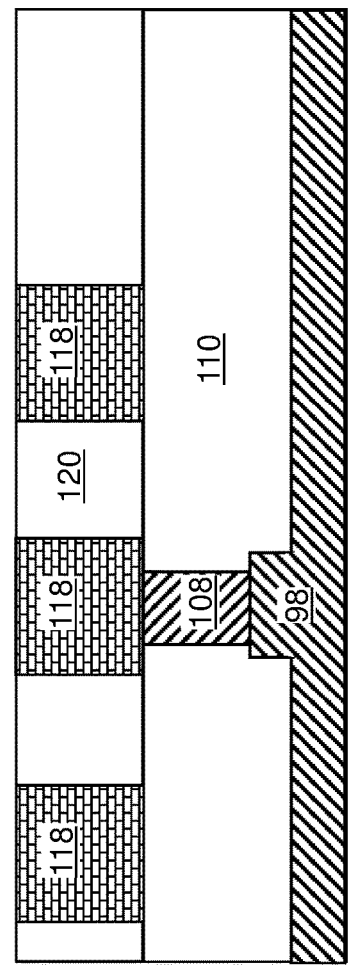
FIG. 20C is a vertical cross-sectional view of the exemplary structure along the vertical plane C-C' of FIG. 20A.
Figure 20A:
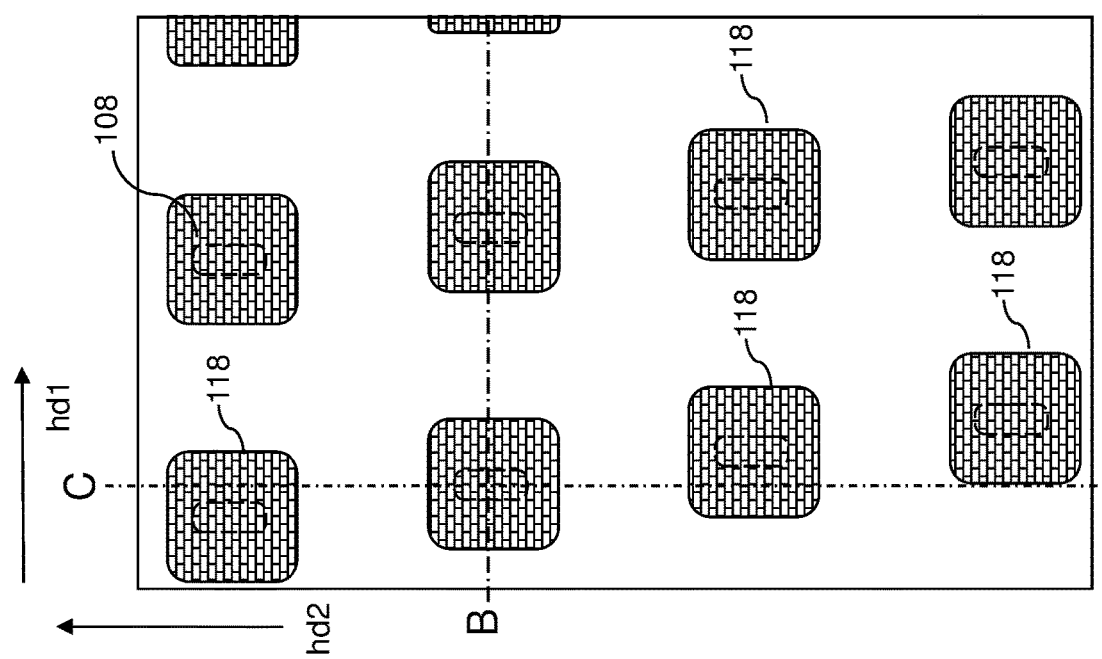
FIG. 20A is a top-down view of an array region of the exemplary structure in the first alternative configuration after formation of a first pad-level dielectric layer and first bonding pads according to an embodiment of the present disclosure.

Referring to FIGS. 20A-20C, the first alternative configuration of the exemplary structure is illustrated after formation of a first pad-level dielectric layer 120 and first bonding pads 118 according to an embodiment of the present disclosure.

Referring to FIGS. 21A-21C, a second alternative configuration of the exemplary structure is illustrated after formation of a via-level dielectric layer 110 according to an embodiment of the present disclosure. In this configuration, the anisotropic etch that vertically recesses unmasked portions of the bit lines 98 may have an etch chemistry that is selective to the at least one conductive material in the bit lines 98. In this case, unmasked portions of the bit-line-level dielectric layer 90 are not etched during vertical recessing of the unmasked portions of the bit lines 98. All top surfaces of the bit-line-level dielectric layer 90 may be located within the same horizontal plane as the top surfaces of the bump portions 98P of the bump-containing bit lines 98.

Figure 22B:
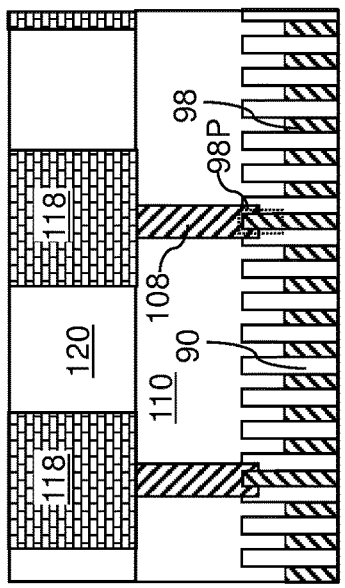
FIG. 22B is a vertical cross-sectional view of the exemplary structure along the vertical plane B-B' of FIG. 22A.
Figure 22C:
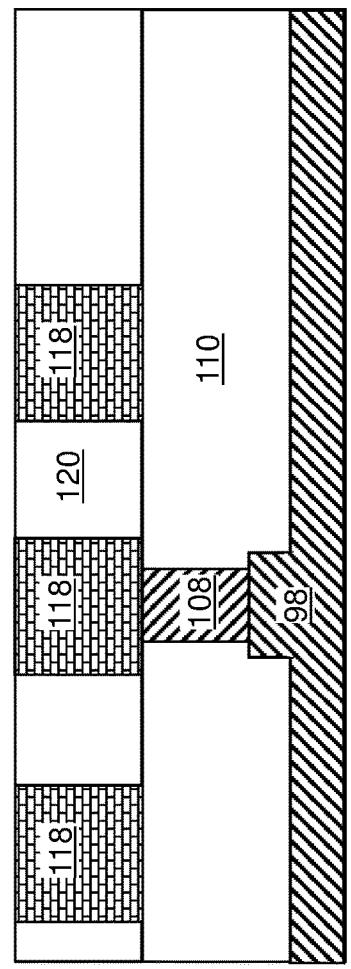
FIG. 22C is a vertical cross-sectional view of the exemplary structure along the vertical plane C-C' of FIG. 22A.
Figure 22A:
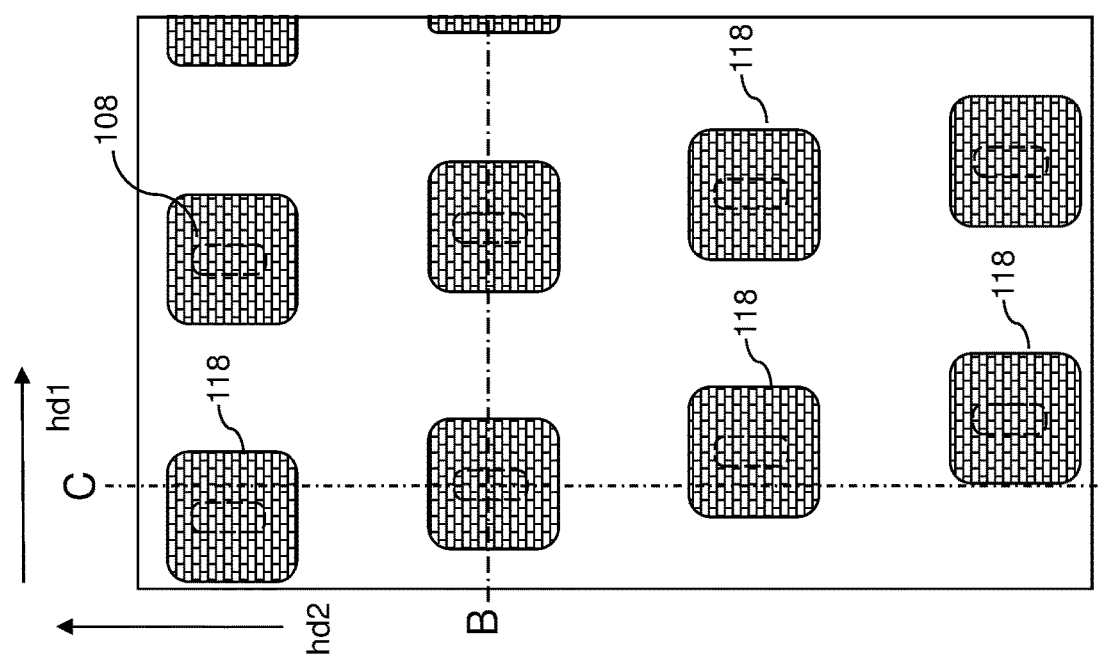
FIG. 22A is a top-down view of an array region of the exemplary structure in the second alternative configuration after formation of a first pad-level dielectric layer and first bonding pads according to an embodiment of the present disclosure.

Referring to FIGS. 22A-22C, the second alternative configuration of the exemplary structure is illustrated after formation of a first pad-level dielectric layer 120 and first bonding pads 118 according to an embodiment of the present disclosure.

Referring to FIGS. 23A-23C, a third alternative configuration of the exemplary structure is illustrated after formation of patterned mask material portions according to an embodiment of the present disclosure. The third configuration illustrated in FIGS. 23A-23C can be derived from the structure illustrated in FIGS. 14A-14C by changing the pattern of the patterned mask material portions 97. In one embodiment, the patterned mask material portions 97 can comprise patterned portions of a photoresist layer that is applied over the bit lines 98 and is subsequently patterned by lithographic exposure and development. Each patterned portion of the photoresist layer may laterally extend along a horizontal direction that is at a tilt angle $\alpha$ with respect to the second horizontal direction (e.g., bit line direction) hd2 over a respective plurality of bit lines 98. The tilt angle $\alpha$ is greater than 0 degrees and is less than 45 degrees. For example, the tilt angle $\alpha$ may be in a range from 2 degree to 25 degrees, and may be from 4 degrees to 15 degrees, although lesser and greater tilt angles may also be employed. The width of each patterned mask material portion 97 may be uniform along the lengthwise direction of the patterned mask material portion 97. Each sidewall of the patterned mask material portions 97 can be vertical, and can be contained within a respective Euclidian vertical planes that is tilted from a vertical plane parallel to the second horizontal direction hd2 by the tilt angle $\alpha$.

In one embodiment, the tilt angle $\alpha$ may be selected such that each portion of the bit lines 98 that are masked by a same patterned mask material portion 97 have non-overlapping lateral extents along the second horizontal direction hd2. The areas of the masked portions of the bit lines 98 that are covered by a same patterned mask material portion 97 are laterally spaced along the second horizontal direction hd2 with spatial gaps such that a line laterally extending along the first horizontal direction hd1 can be placed between each laterally neighboring pair of areas covered by the same patterned mask material portion 97 without intersecting any portion of the laterally neighboring pair of areas.

Referring to FIGS. 24A-24D, the processing steps of FIGS. 15A-15D can be performed. Unmasked portions of the bit lines 98 can be vertically recessed to form bump-containing bit lines 98. Depending on the etch selectivity of the anisotropic etch process between the at least one conductive material of the bit lines 98 and the bit-line-level dielectric layer 90, unmasked portions of the bit-line-level dielectric layer 90 may be vertically recessed less than, or by the same vertical distance as, the top surfaces of the line portions 98L of the bit lines 98, or may remain within the same horizontal plane as the top surfaces of the bump portions 99P of the bump-containing bit lines 98.

Generally, the bit lines 98 can extend over the drain regions 63, and can be electrically connected to a respective subset of the drain regions 63 by a respective set of at least one conductive via structure (such as a combination of a drain contact via structure 88 and a drain-connection via structure 198). The bit lines 98 can have a periodic pitch p along the first horizontal direction hd1, and can laterally extend along the second horizontal direction hd2 that is perpendicular to the first horizontal direction hd1. At least of a subset of, and/or all of, the bit lines 98 can comprise bump-containing bit lines 98. Each of the bump-containing bit lines 98 comprises a line portion 98L having a uniform height between a planar bottom surface and a planar top surface and a bump portion 98P that protrudes upward from a horizontal plane including the planar top surface of the line portion 98L by a bump height.

In one embodiment, each of the bump portions 98P comprises a pair of lengthwise sidewall segments that are parallel to the second horizontal direction hd2 and have a same width as a width of the line portion 98L of each of the bump-containing bit lines 98 along the first horizontal direction hd1. In one embodiment, each of the bump portions 98P comprises a pair of widthwise sidewall segments that are not parallel to the second horizontal direction hd2 and adjoined to vertical edges of the pair of lengthwise sidewall segments and adjoined to horizontal edges of a planar top surface of a line portion 98L of a respective one of the bump-containing bit lines 98. In one embodiment, the pair of widthwise sidewall segments is at a tile angle α with respect to the second horizontal direction hd2, the tilt angle α being greater than 0 degree and less than 45 degrees. In one embodiment, widthwise sidewall segments of multiple bump portions of the bump-containing bit lines 98 can be located within a same Euclidean vertical plane that is at the angle α with respect to a vertical plane that is perpendicular to the first horizontal direction hd1. Each Euclidian vertical plane can be the one of the Euclidian vertical planes containing sidewalls of the patterned mask material portions 97 at the processing steps of FIGS. 23A-23D.

Figure 25B:
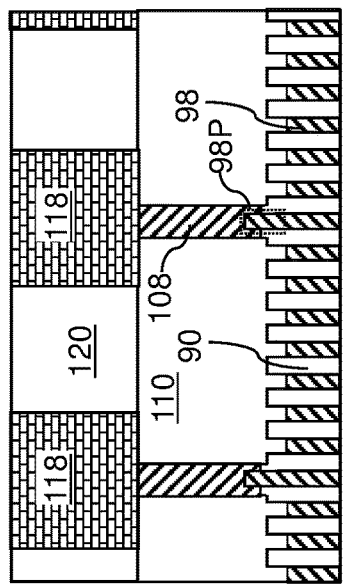
FIG. 25B is a vertical cross-sectional view of the exemplary structure along the vertical plane B-B' of FIG. 25A.
Figure 25C:
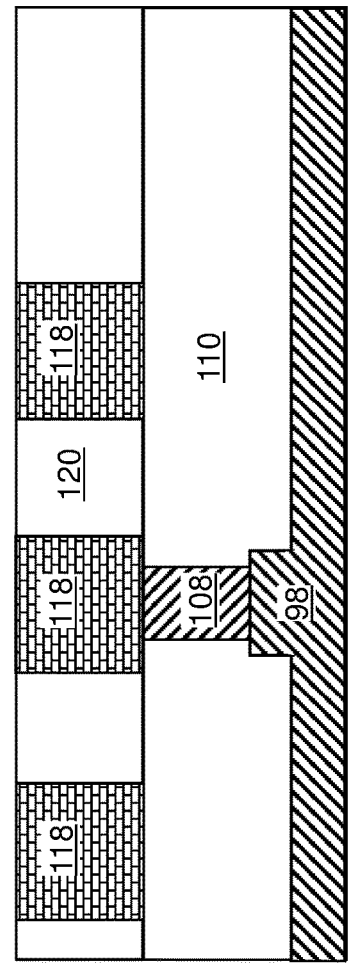
FIG. 25C is a vertical cross-sectional view of the exemplary structure along the vertical plane C-C' of FIG. 25A.
Figure 25A:
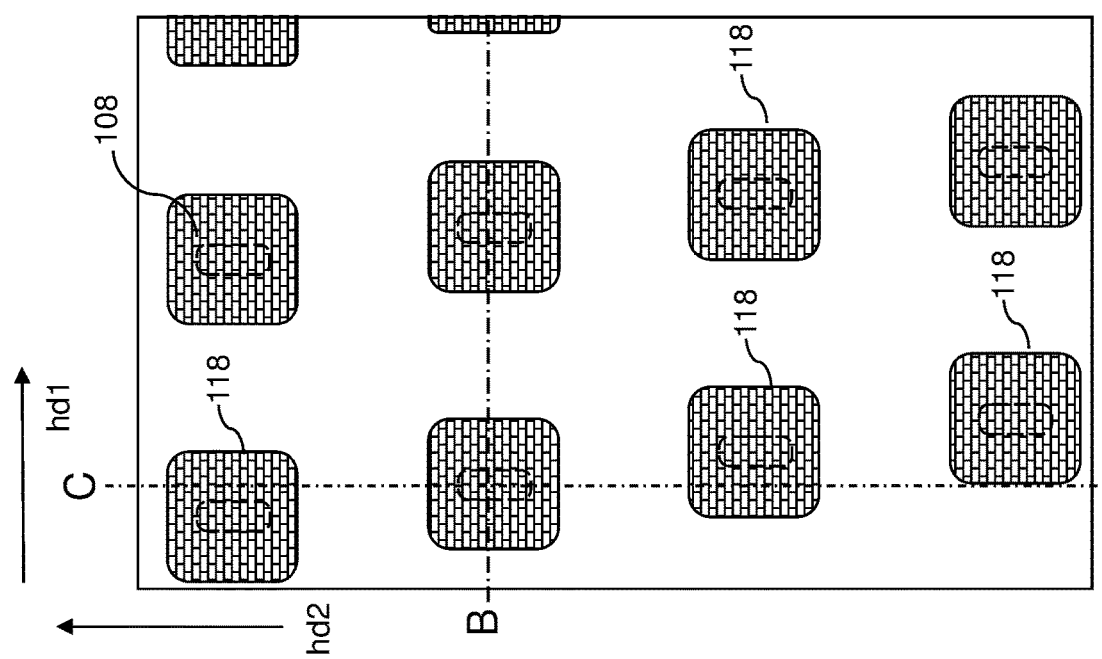
FIG. 25A is a top-down view of an array region of the exemplary structure in the third alternative configuration after formation of a first pad-level dielectric layer and first bonding pads according to an embodiment of the present disclosure.

Referring to FIGS. 25A-25C, the processing steps of FIGS. 16A-18C can be performed to form a via-level dielectric layer 110, bit line contact via structures 108, a first pad-level dielectric layer 120, and first bonding pads 118. The bit line contact via structures 108 overlie the bump-containing bit lines and contact a bump portion 98P of a respective one of the bump-containing bit lines 98. The bit line contact via structures 108 contact a top surface and upper portions of lengthwise sidewall segments of a respective one of the bump-containing bit lines 98, and do not contact any line portion of the bump-containing bit lines 98.

In one embodiment, a horizontal cross-sectional shape of each bump portion 98P of the bump-containing bit lines 98 can have a length-to-width ratio that is greater than 3, such as 3 to 10. In one embodiment, the length-to-width ratio may be greater than 4, and/or greater than 5, and/or greater than 6. The length-to-width ratio is the ratio of a lateral extent of a bump portion 98P along the second horizontal direction hd2 to a lateral extent of the bump portion 98P along the first horizontal direction hd1.

The angle between the lengthwise sidewall segments and the widthwise sidewall segments of each bump portion 98P can be the tilt angle α. Each bit line contact via structure 108 can be formed on a top surface and upper portions of a pair of lengthwise sidewall segments of a bump portion 98P of a respective bump-containing bit line 98. In one embodiment, a bit line contact via structure 108 may contact upper portions of a pair of widthwise sidewall segments of the respective bump portion 98P. Alternatively, the lateral dimension of a via cavity 109 along the second horizontal direction hd2 may be less than the length of the underlying bump portion 98P, and the widthwise sidewall segments of the respective bump portion 98P may be covered with the via-level dielectric layer 110. In this case, a bit line contact via structure 108 contacts a top surface and upper portions of a pair of widthwise sidewall segments of the respective bump portion 98P, and does not contact a pair of widthwise sidewall segments of the respective bump portion 98P. Yet alternatively, the lateral dimension of a via cavity 109 along the second horizontal direction hd2 may be about the same as the length of the underlying bump portion 98P, and an overlay variation in the lithographic patterning process employed to pattern the openings in the photoresist layer may have a non-zero overlay shift along the second horizontal direction hd2 such that one of the widthwise sidewall segments of the respective bump portion 98P that extend along the first horizontal direction hd1 is covered with the via-level dielectric layer 110, while another of the widthwise sidewall segments of the respective bump portion 98P contacts a respective bit line contact via structure 108.

Each alternative configuration of the exemplary structure can be diced along the dicing channels, and first semiconductor dies can be provided. Each first semiconductor die can include at least one memory array region 100 and at least one staircase region 300. In one embodiment, the first semiconductor die comprises first bonding pads 118 embedded in a first pad-level dielectric layer 120, contacting a top surface of a respective one of the bit line contact via structures 108, and having a same horizontal cross-sectional shape. Each first semiconductor die can include a memory die including a three-dimensional memory device and including each of the structural components in the exemplary structure described above.

Figure 26:
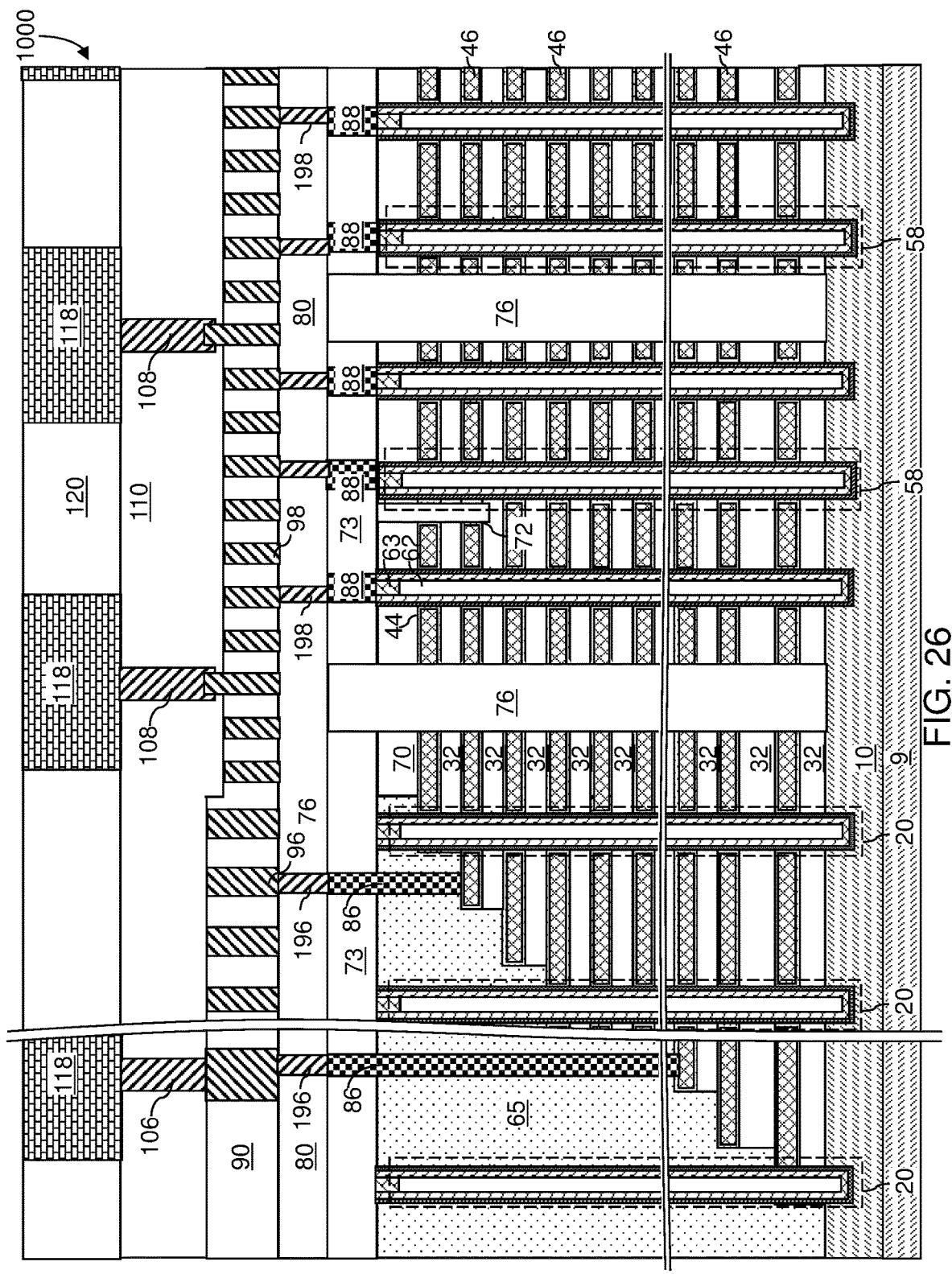
FIG. 26 is a schematic vertical cross-sectional view of a first semiconductor die that can be derived from the exemplary structure at the processing steps of FIG. 18A-18C, 20A-20C, 22A-22C, or 25A-25C according to an embodiment of the present disclosure.

Referring to FIG. 26, a first semiconductor die 1000 is illustrated, which can be derived from any of the exemplary structures illustrated in FIG. 18A-18C, 20A-20C, 22A-22C, or 25A-25C. A subset of the first bonding pads 118 in the first semiconductor die 1000 may be electrically connected to the word lines (which can be embodied as the electrically conductive layers 46) or other electrical nodes of the three-dimensional array of memory elements within the first semiconductor die 1000 through additional via-level contact via structures 106 embedded in the via-level dielectric layer 110.

Figure 27:
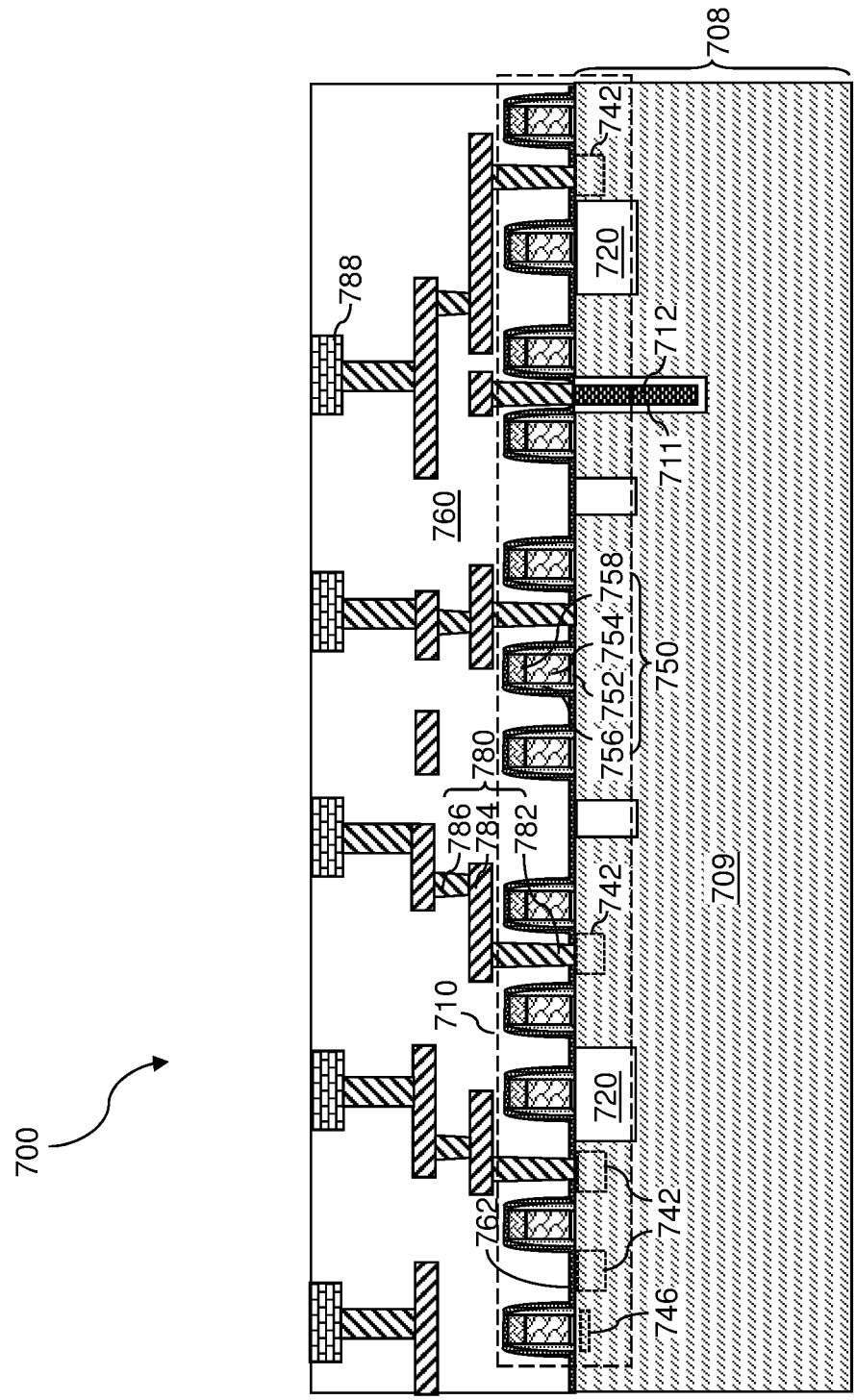
FIG. 27 is a schematic vertical cross-sectional view of a second semiconductor die including a second substrate and semiconductor devices thereupon according to an embodiment of the present disclosure.

Referring to FIG. 27, a second semiconductor die 700 can be provided, which can be a logic die including various semiconductor devices 710. The semiconductor devices 710 can include a peripheral circuit configured to control operation of the memory stack structures 55 in the first semiconductor die 1000 by providing control signals at least to the bit lines 98 in the first semiconductor die 1000. The peripheral circuit may include bit line drivers, sense amplifiers, and a bit line decoder circuitry that decodes the addresses for the bit lines 98 for the three-dimensional array of memory elements in the first semiconductor die 1000. In addition, the peripheral circuit can include word line drivers that drive the electrically conductive layers 46 within the first semiconductor die 1000, a word line decoder circuitry that decodes the addresses for the electrically conductive layers 46, a power supply/distribution circuitry that provides power to the first semiconductor die 1000, a data buffer and/or latch, and/or any other semiconductor circuitry that can be used to operate the array of memory stack structures 55 in the first semiconductor die 1000.

The second semiconductor die 700 can include a second substrate 708, which can be a semiconductor substrate. The second substrate 708 can include a substrate semiconductor layer 709. The substrate semiconductor layer 709 may be a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. Through-substrate-via dielectric liners 711 and through-substrate via structures 712 can be formed in an upper portion of the substrate semiconductor layer 709.

Shallow trench isolation structures 720 can be formed in an upper portion of the substrate semiconductor layer 709 to provide electrical isolation for semiconductor devices of the sense amplifier circuitry. The various semiconductor devices 710 can include field effect transistors, which include respective transistor active regions 742 (i.e., source regions and drain regions), a channel 746, and a gate structure 750. The field effect transistors may be arranged in a CMOS configuration. Each gate structure 750 can include, for example, a gate dielectric 752, a gate electrode 754, a dielectric gate spacer 756 and a gate cap dielectric 758. For example, the semiconductor devices 710 can include word line drivers for electrically biasing word lines of the first semiconductor die 1000 comprising the electrically conductive layers 46.

Dielectric material layers are formed over the semiconductor devices 710, which are herein referred to as logic-side dielectric layers 760. Optionally, a dielectric liner 762 (such as a silicon nitride liner) can be formed to apply mechanical stress to the various field effect transistors and/or to prevent diffusion of hydrogen or impurities from the logic-side dielectric layers 760 into the semiconductor devices 710. Logic-side metal interconnect structures 780 are included within the logic-side dielectric layers 760. The logic-side metal interconnect structures 780 can include various device contact via structures 782 (e.g., source and drain electrodes which contact the respective source and drain nodes of the device or gate electrode contacts), interconnect-level metal line structures 784, interconnect-level metal via structures 786, and second bonding pads 788 (such as metallic pad structures) that may be configured to function as bonding pads.

Generally, the second semiconductor die 700 can include a second substrate 708 and semiconductor devices 710 located on the second substrate 708. The semiconductor devices 710 in the second semiconductor die 700 includes at least a peripheral circuit configured to control operation of the memory stack structures 55 in the first semiconductor die 1000 by providing control signals at least to the bump-containing bit lines 98 in the first semiconductor die 1000. The second semiconductor die 700 can include dielectric material layers (such as the logic-side dielectric layers 760) embedding metal interconnect structures (such as the logic-side metal interconnect structures 780) and electrically connected to the semiconductor devices 710, and second bonding pads 788 embedded in a second pad-level dielectric layer that is located in the dielectric material layers. The pattern of the second bonding pads 788 can be a mirror image pattern of the pattern of the first bonding pads 118.

Figure 28:
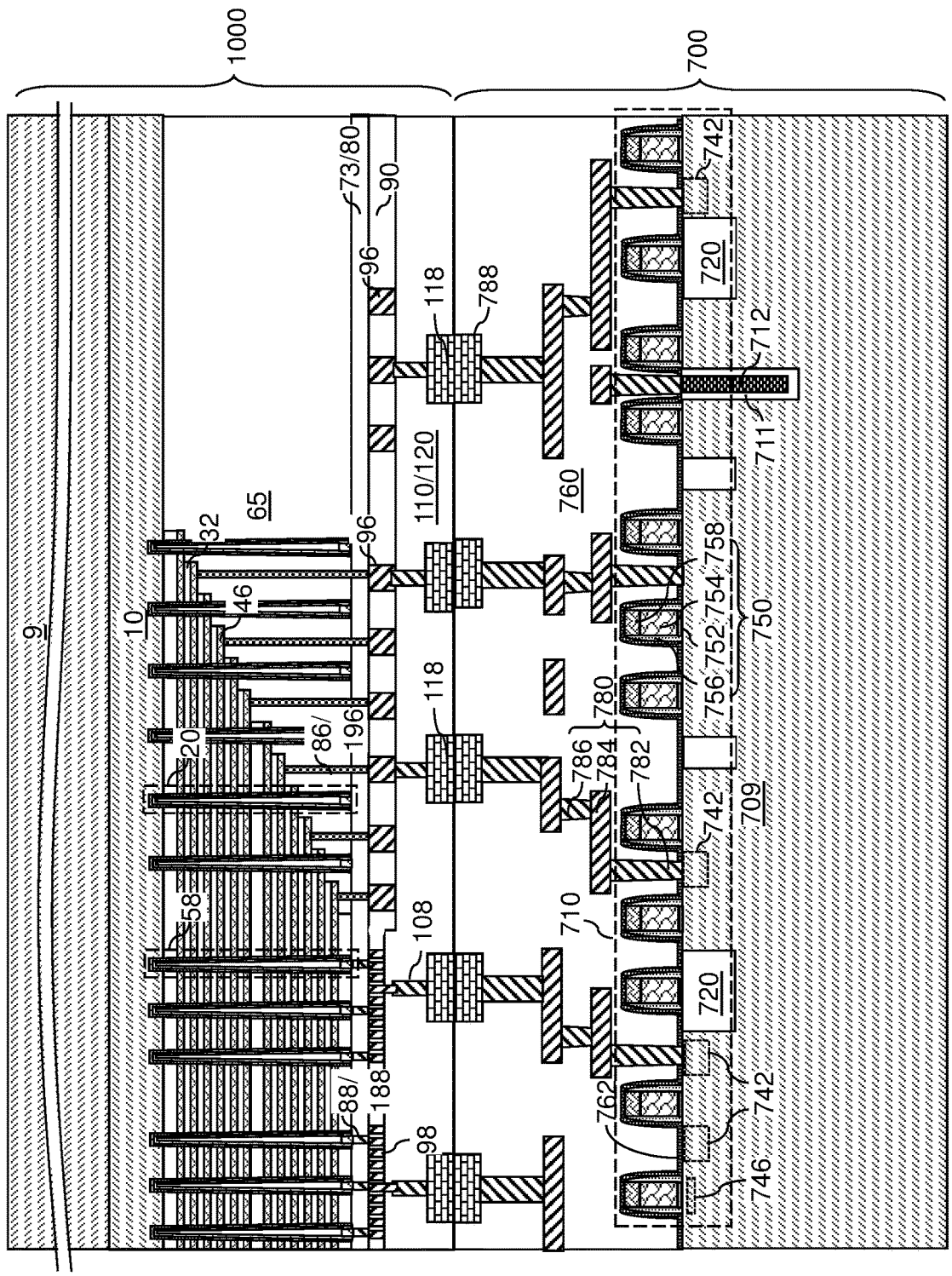
FIG. 28 is a schematic vertical cross-sectional view of a bonded assembly of the first semiconductor die and the second semiconductor die according to an embodiment of the present disclosure.

Referring to FIG. 28, a bonded assembly of the first semiconductor die 1000 and the second semiconductor die 700 can be formed by bonding the second bonding pads 788 to the first bonding pads 118. A metal-to-metal bonding such as copper-to-copper bonding or hybrid metal-to-metal and dielectric-to-dielectric bonding may be employed to form the bonded assembly by annealing the first semiconductor die 1000 and the second semiconductor die 700 when their respective bonding pads are in contact with each other.

Figure 29:
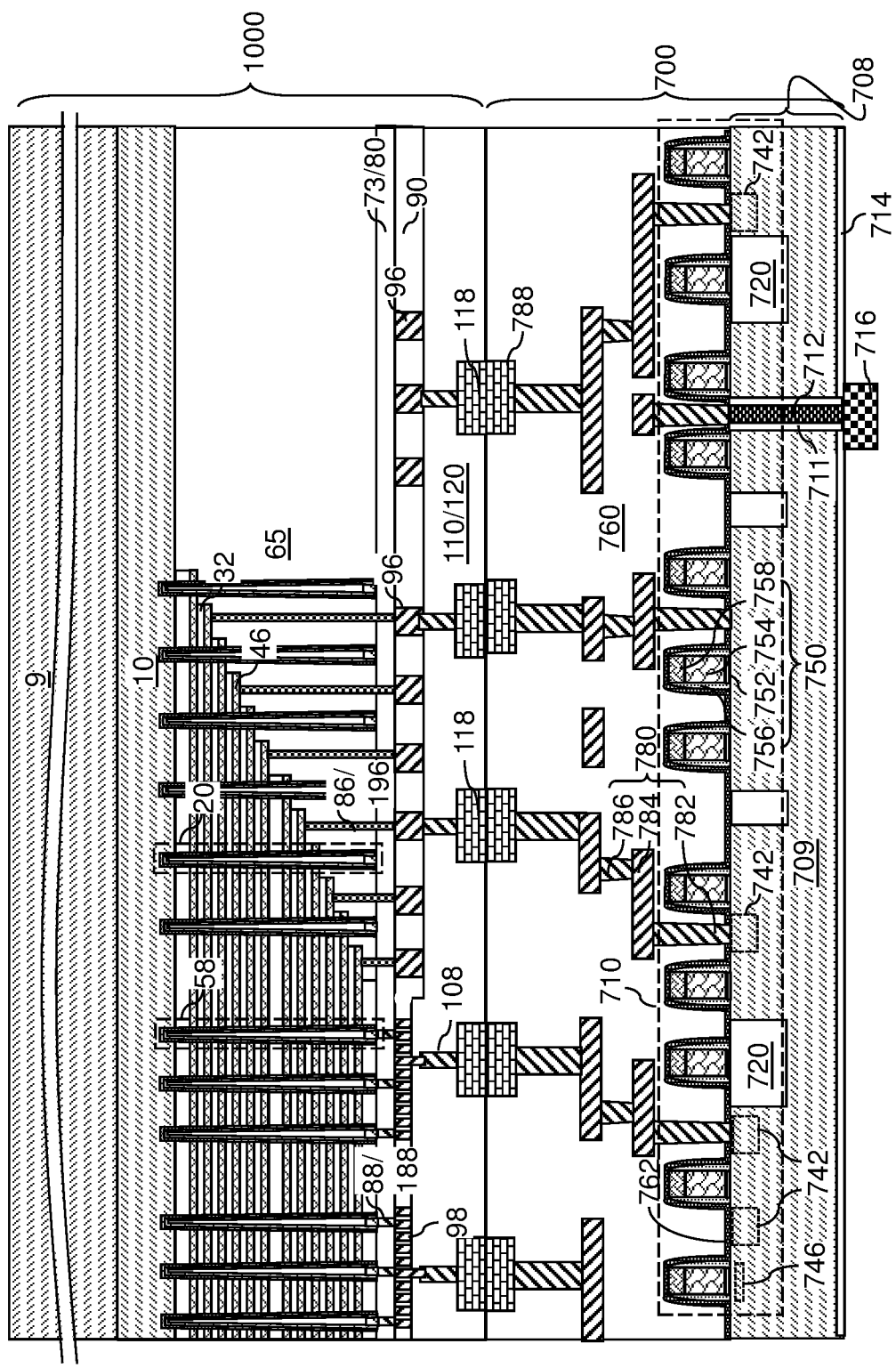
FIG. 29 is a schematic vertical cross-sectional view of the bonded assembly after thinning the second substrate and forming external bonding pads according to an embodiment of the present disclosure.

Referring to FIG. 29, the backside of the substrate semiconductor layer 709 can be thinned so that bottom surfaces of the through-substrate via structures 712 are physically exposed. The thinning of the substrate semiconductor layer 709 may be performed by grinding, polishing, an anisotropic etch (such as a reactive ion etch), and/or an isotropic etch (such as a wet etch). A backside insulating layer 714 can be deposited on the backside surface of the substrate semiconductor layer 709 after the thinning process. External bonding pads 716 can be formed on the backside surfaces of the through-substrate via structures 712.

While the present disclosure is described employing an embodiment in which substrates are diced into individual semiconductor dies prior to bonding, embodiments are expressly contemplated herein in which a substrate-to-substrate bonding (such as wafer-to-wafer bonding) is employed, and a bonded assembly of two or more substrates is subsequently diced into semiconductor chips including multiple semiconductor dies. Further, embodiments are expressly contemplated herein in which the backside of the first semiconductor die 1000 is thinned instead of, or in addition to, thinning of the backside of the second semiconductor die 700. Further, embodiments are expressly contemplated herein in which three or more semiconductor dies are vertically stacked in a manner that incorporates the bonded assembly of the first semiconductor die 1000 and the second semiconductor die 700 described above.

Referring to all drawings and according to various embodiments of the present disclosure, a semiconductor structure comprising a first semiconductor die 1000 is provided. The first semiconductor die 1000 comprises: an alternating stack of insulating layers 32 and electrically conductive layers 46 located on a first substrate (9, 10); memory stack structures 55 extending through the alternating stack (32, 46), wherein each of the memory stack structures 55 comprises a respective vertical semiconductor channel 60 and a respective memory film 50; drain regions 63 located at a first end of a respective one of the vertical semiconductor channels 60; bit lines 98 extending over the drain regions 63 and electrically connected to a respective subset of the drain regions by at least one conductive via structure (88, 198), wherein at least a subset of the bit lines 98 comprises bump-containing bit lines, and each of the bump-containing bit lines comprises a line portion 98L and a bump portion 98B that protrudes upward from a top surface of the line portion 98L by a bump height; and bit line contact via structures 108 overlying the bit lines 98 and contacting a bump portion 98P of a respective one of the bump-containing bit lines 98.

In one embodiment, the bit lines 98 have a periodic pitch along a first horizontal direction hd1 and laterally extend along a second horizontal direction hd2 that is perpendicular to the first horizontal direction. The top surface of the line portion 98L comprises a planar top surface, and the line portion 98L has a uniform height between a planar bottom surface and the planar top surface, and the bump portion 98B protrudes upward from the planar top surface of the line portion by a bump height.

In one embodiment, the semiconductor structure can further comprise a second semiconductor die 700 comprising second bonding pads, wherein the first bonding pads are bonded to the second bonding pads. In one embodiment, the second semiconductor die 700 comprises semiconductor devices 710 located on a second substrate 708; dielectric material layers 760 embedding metal interconnect structures 780 and electrically connected to the semiconductor devices 710; and second bonding pads 788 embedded in a second pad-level dielectric layer that is located in the dielectric material layers 760, wherein the second bonding pads 788 are bonded to a respective one of the first bonding pads 188. In one embodiment, the semiconductor devices 710 in the second semiconductor die 700 form a peripheral circuit configured to control operation of the memory stack structures 55 by providing control signals at least to the bit lines in the first semiconductor die 1000.

The various embodiments of the present disclosure reduce the chance of an electrical short between one bump-containing bit line 98 and a neighboring the bit line contact via structure 108 of an adjacent bit line 98. Each bit line contact via structure 108 can be spaced from line portions 98L of neighboring bump-containing bit lines 98 both laterally and vertically to reduce the likelihood of electrical shorts. Neighboring bump portions 98P of bump-containing bit lines 98 are laterally spaced apart at sufficient distances to reduce electrical shorts through a given bit line contact via structure 108, since the given bit line contact via structure 108 is located over only one bump portion 98B of its corresponding bit line 98, while only the recessed line portions 98L of neighboring bit lines 98 are located near the given bit line contact via structure 108. Thus, even if the given bit line contact via structure 108 is shifted along the first horizontal direction with respect to its underlying bit line 98 due to photolithography overlay or other process errors, the chance of a short circuit between the given bit line contact via structure 108 with an neighboring bit line 98 is reduced because the given bit line contact via structure 108 is also vertically spaced from the line portion 98L of the neighboring bump-containing bit line 98. Therefore, embodiments of the present disclosure can reduce electrical shorts at the level of the bit lines and the bit line contact via structures by vertically spacing the bottom surfaces of the bit line contact via structure 108 from the top surfaces of the line portions 98L of the bump-containing bit lines 98, and by providing sufficient lateral spacing among the bump portions 98P of the bump-containing bit lines 98.

Although the foregoing refers to particular preferred embodiments, it will be understood that the claims are not so limited. It will occur to those of ordinary skill in the art that various modifications may be made to the disclosed embodiments and that such modifications are intended to be within the scope of the claims. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the claims may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

The invention claimed is:

1. A method of forming a semiconductor structure that comprises a first semiconductor die, the method comprising:
    forming a three-dimensional memory array including memory stack structures vertically extending through an alternating stack of insulating layers and electrically conductive layers over a first substrate, wherein each of the memory stack structures comprises a respective vertical semiconductor channel and a respective memory film, and a drain region is disposed on a top end of each of the vertical semiconductor channels;
    forming conductive via structures embedded within at least one connection-level dielectric layer over the drain regions;
    forming bit lines on physically exposed top surfaces of the conductive via structures,
    masking a first area of each of the bit lines with a respective patterned mask material portion without covering a second area of each of the bit lines;
    vertically recessing portions of the bit lines that are not masked by the patterned mask material portions by performing an anisotropic etch process, wherein the bit lines are converted into bump-containing bit lines, and each of the bump-containing bit lines comprises a line portion having a uniform height between a planar bottom surface and a planar top surface and a bump portion that protrudes upward from a horizontal plane including the planar top surface of the line portion by a bump height; and
    forming bit line contact via structures on a bump portion of a respective one of the bump-containing bit lines.

2. The method of claim 1, wherein:
    the bit lines have a periodic pitch along a first horizontal direction, and laterally extend along a second horizontal direction that is perpendicular to the first horizontal direction;
    the patterned mask material portions comprise patterned portions of a photoresist layer that is applied over the bit lines and is patterned by lithographic exposure and development; and
    each patterned portion of the photoresist layer has a width along the first horizontal direction that is not greater than the periodic pitch along the first horizontal direction.

3. The method of claim 2, wherein:
the patterned mask material portions comprise patterned portions of a photoresist layer that is applied over the bit lines and is patterned by lithographic exposure and development; and
each patterned portion of the photoresist layer laterally extends along a horizontal direction that is at a tilt angle with respect to the second horizontal direction over a respective plurality of bit lines, wherein the tilt angle is greater than 0 degrees and is less than 45 degrees.

4. The method of claim 1, further comprising:
forming a bit-line-level dielectric layer over the at least one connection-level dielectric layer;
forming line trenches laterally extending along the second horizontal direction through the bit-line-level dielectric layer, wherein top surfaces of a respective subset of the conductive via structures are physically exposed underneath each of the line trenches;
forming the bit lines by depositing at least one conductive material in the line trenches,
wherein:
each patterned mask material portion covers a respective portion of the bit-line-level dielectric layer;
portions of the bit-line-level dielectric layer that are covered by the patterned mask material portions have a respective top surface that is coplanar with top surfaces of the bump portions of the bit lines; and
portions of the bit-line-level dielectric layer that are not covered by the patterned mask material portions are vertically recessed from a horizontal plane including the top surfaces of the bump portions of the bit lines.

5. The method of claim 1, further comprising:
forming a via-level dielectric layer over the bump-containing bit lines;
forming via cavities extending through the via-level dielectric layer, wherein a top surface and upper portions of a pair of lengthwise sidewall segments of a respective bump portion are physically exposed underneath each of the via cavities; and
forming the bit line contact via structures on a respective one of the bump portions by depositing at least one conductive material in the via cavities.

6. The method of claim 1, further comprising:
forming a first pad-level dielectric layer over the bit line contact via structures; and
forming first bonding pads in the first pad-level dielectric layer directly on a top surface of a respective one of the bit line contact via structures.

7. The method of claim 6, further comprising:
providing a second semiconductor die that comprises:
semiconductor devices located on a second substrate,
dielectric material layers embedding metal interconnect structures and electrically connected to the semiconductor devices, and
second bonding pads embedded in a second pad-level dielectric layer that is located in the dielectric material layers; and
bonding the second bonding pads to a respective one of the first bonding pads to form a bonded assembly including the first semiconductor die and the second semiconductor die.

* * * * *